(12) United States Patent
Sakamoto et al.

(10) Patent No.: US 10,763,272 B2
(45) Date of Patent: Sep. 1, 2020

(54) SEMICONDUCTOR MEMORY DEVICE

(71) Applicant: TOSHIBA MEMORY CORPORATION, Minato-ku (JP)

(72) Inventors: Wataru Sakamoto, Yokkaichi (JP); Ryota Suzuki, Yokkaichi (JP); Tatsuya Okamoto, Inabe (JP); Tatsuya Kato, Yokkaichi (JP); Fumitaka Arai, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/929,102

(22) Filed: Feb. 5, 2019

(65) Prior Publication Data

US 2019/0181150 A1 Jun. 13, 2019

Related U.S. Application Data

(63) Continuation of application No. 15/205,954, filed on Jul. 8, 2016, now Pat. No. 10,242,992, which is a
(Continued)

(30) Foreign Application Priority Data

Jan. 10, 2014 (JP) .................................. 2014-003793
Jun. 6, 2014 (CN) ........................... 2014 1 0250359

(51) Int. Cl.
*H01L 27/11556* (2017.01)
*H01L 27/11582* (2017.01)
(Continued)

(52) U.S. Cl.
CPC .... *H01L 27/11556* (2013.01); *G11C 16/0408* (2013.01); *G11C 16/0483* (2013.01);
(Continued)

(58) Field of Classification Search
CPC ......... H01L 27/11556; H01L 27/11582; H01L 27/115–11597; G11C 16/04–0491
See application file for complete search history.

(56) References Cited

U.S. PATENT DOCUMENTS 7,696,559 B2 * 4/2010 Arai ..................... H01L 27/105
257/315
8,659,947 B2 2/2014 Iwai et al.
(Continued)

FOREIGN PATENT DOCUMENTS

CN       102544016 A     7/2012
JP       2011-199131 A   10/2011
KR    10-2012-0077040 A    7/2012

OTHER PUBLICATIONS

International Search Report dated Aug. 25, 2015 in PCT/JP2015/000044, filed on Jan. 7, 2015.
(Continued)

*Primary Examiner* — Eric A. Ward
(74) *Attorney, Agent, or Firm* — Oblon, McClelland, Maier & Neustadt, L.L.P.

(57) ABSTRACT

A semiconductor memory device includes two first electrode films, a first column and a second insulating film. The two first electrode films extend in a first direction and are separated from each other in a second direction. The first column is provided between the two first electrode films and has a plurality of first members and a plurality of insulating members. Each of the first members and each of the insulating members are arranged alternately in the first direction. One of the plurality of first members has a semiconductor pillar, a second electrode film and a first insulating film provided between the semiconductor pillar and the second electrode film. The semiconductor pillar, the first insulating film and the second electrode film are arranged in the second
(Continued)

direction. The second insulating film is provided between the first column and one of the two first electrode films.

21 Claims, 69 Drawing Sheets

Related U.S. Application Data continuation of application No. PCT/JP2015/000044, filed on Jan. 7, 2015, which is a continuation of application No. 14/204,623, filed on Mar. 11, 2014, now abandoned.

(51) Int. Cl.
    *G11C 16/04*     (2006.01)
    *H01L 29/66*     (2006.01)
    *H01L 29/792*     (2006.01)
    *H01L 23/528*     (2006.01)
    *H01L 27/11519*     (2017.01)
    *H01L 29/06*     (2006.01)

(52) U.S. Cl.
    CPC ...... *H01L 23/528* (2013.01); *H01L 27/11519* (2013.01); *H01L 27/11582* (2013.01); *H01L 29/0649* (2013.01); *H01L 29/66825* (2013.01); *H01L 29/7926* (2013.01)

(56) References Cited

U.S. PATENT DOCUMENTS

| | | | |
|---|---|---|---|
| 8,872,256 B2 | 10/2014 | Lee | |
| 2009/0267128 A1* | 10/2009 | Maejima | H01L 27/11565 257/314 |
| 2010/0133606 A1 | 6/2010 | Jang | |
| 2010/0155810 A1* | 6/2010 | Kim | H01L 27/11548 257/316 |
| 2010/0181610 A1 | 7/2010 | Kim et al. | |
| 2010/0202206 A1 | 8/2010 | Seol | |
| 2011/0199804 A1 | 8/2011 | Son | |
| 2011/0298013 A1* | 12/2011 | Hwang | H01L 27/11551 257/208 |
| 2012/0001247 A1 | 1/2012 | Alsmeier | |
| 2012/0001249 A1 | 1/2012 | Alsmeier et al. | |
| 2012/0001250 A1 | 1/2012 | Alsmeier | |
| 2012/0001252 A1 | 1/2012 | Alsmeier et al. | |
| 2012/0001345 A1 | 1/2012 | Park | |
| 2012/0012921 A1 | 1/2012 | Liu | |
| 2012/0068253 A1 | 3/2012 | Oota et al. | |
| 2012/0092926 A1* | 4/2012 | Whang | H01L 27/11556 365/185.01 |
| 2012/0098050 A1 | 4/2012 | Shim et al. | |
| 2012/0120728 A1 | 5/2012 | Kim et al. | |
| 2012/0168848 A1 | 7/2012 | Ahn | |
| 2012/0199898 A1 | 8/2012 | Alsmeier et al. | |
| 2012/0220088 A1 | 8/2012 | Alsmeier | |
| 2012/0211819 A1 | 9/2012 | Alsmeier | |
| 2012/0231593 A1 | 9/2012 | Jog | |
| 2012/0326221 A1 | 12/2012 | Sinha | |
| 2013/0069138 A1 | 3/2013 | Alsmeier et al. | |
| 2013/0095646 A1 | 4/2013 | Alsmeier et al. | |
| 2013/0155778 A1 | 6/2013 | Sakaguchi et al. | |
| 2013/0237024 A1 | 9/2013 | Alsmeier et al. | |
| 2013/0248975 A1 | 9/2013 | Hishida | |
| 2014/0014889 A1* | 1/2014 | Shim | H01L 29/7827 257/1 |
| 2014/0045307 A1 | 2/2014 | Alsmeier et al. | |
| 2014/0131787 A1 | 5/2014 | Alsmeier | |
| 2014/0146612 A1 | 5/2014 | Helm | |
| 2014/0175530 A1 | 6/2014 | Chen et al. | |
| 2014/0225181 A1 | 8/2014 | Makala et al. | |
| 2014/0246716 A1 | 9/2014 | Sinha | |
| 2014/0252452 A1 | 9/2014 | Alsmeier | |
| 2014/0273373 A1* | 9/2014 | Makala | H01L 27/11582 438/270 |
| 2014/0353738 A1 | 12/2014 | Makala et al. | |
| 2015/0072488 A1 | 3/2015 | Chien et al. | |
| 2015/0145015 A1* | 5/2015 | Shin | H01L 27/11556 257/314 |
| 2015/0171099 A1 | 6/2015 | Alsmeier | |
| 2015/0179662 A1 | 6/2015 | Makala et al. | |
| 2016/0104720 A1 | 4/2016 | Alsmeier | |

OTHER PUBLICATIONS

Written Opinion dated Aug. 25, 2015 in PCT/JP2015/000044, filed on Jan. 7, 2015.

Office Action dated May 12, 2016 in Taiwanese 104100803 ( with English Translation).

* cited by examiner

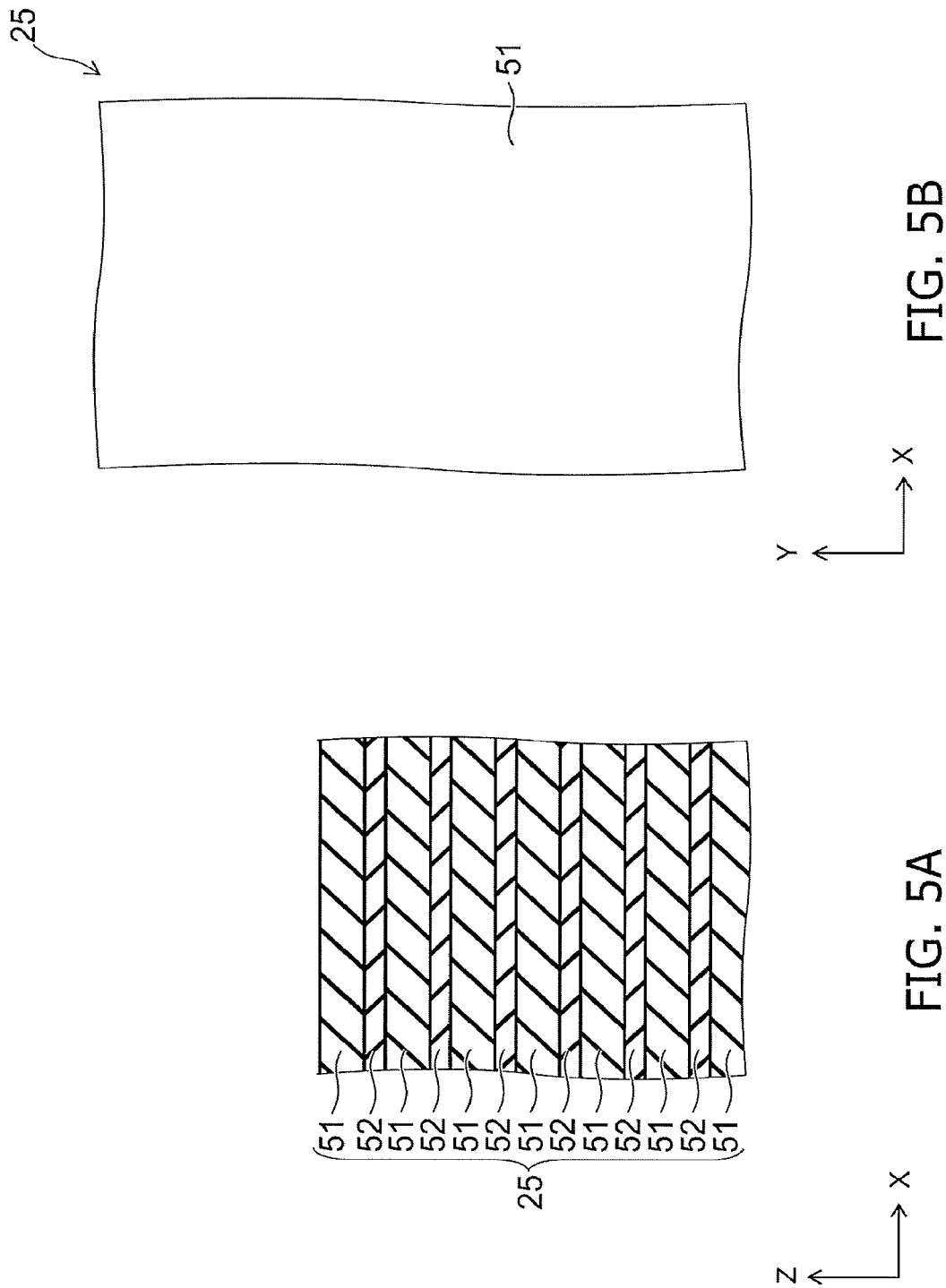

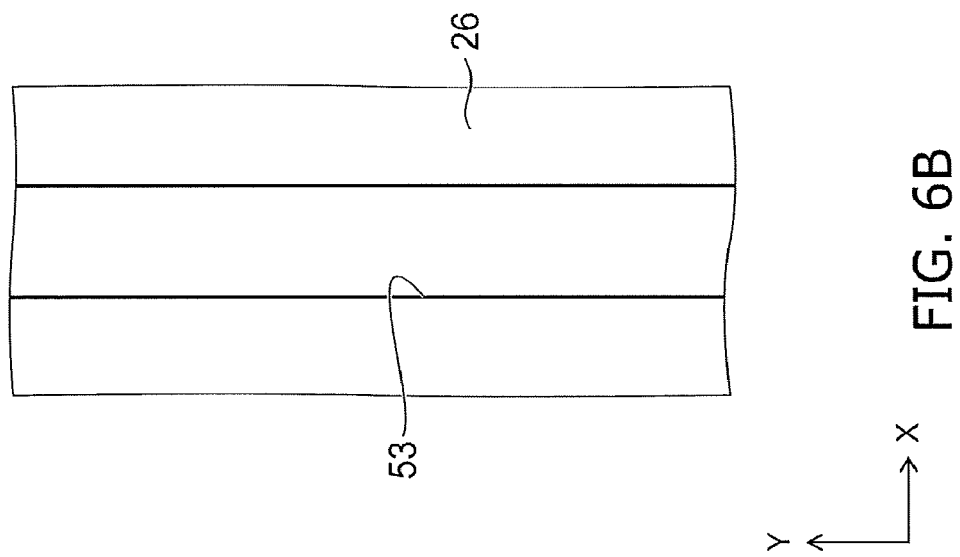
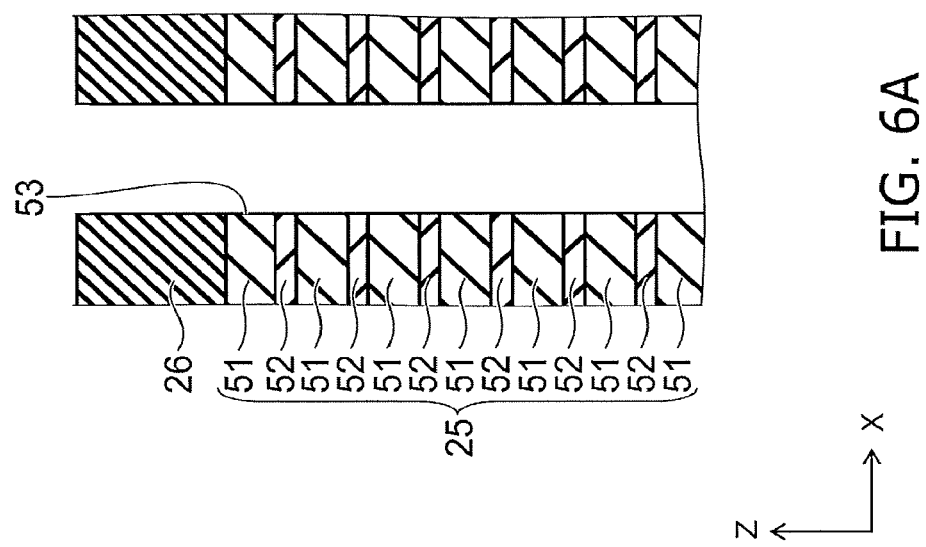

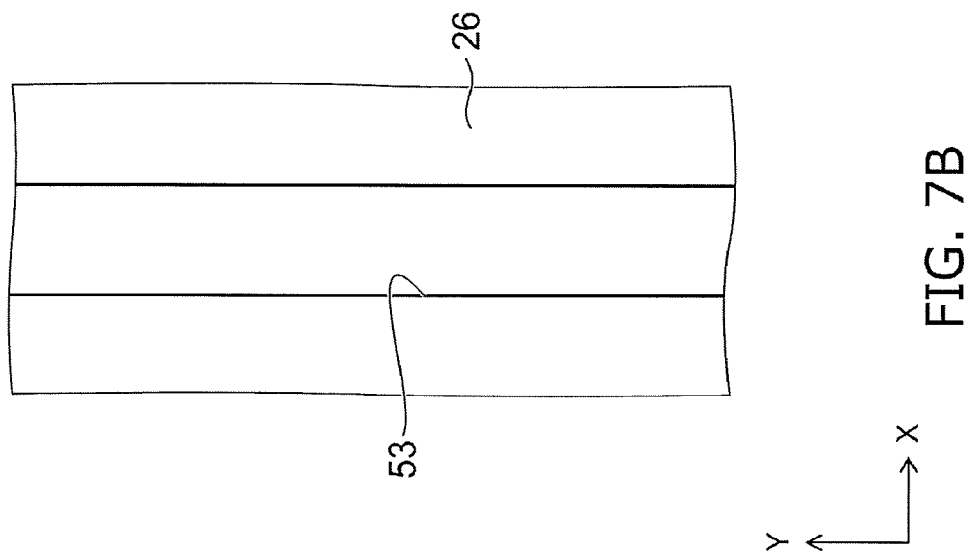
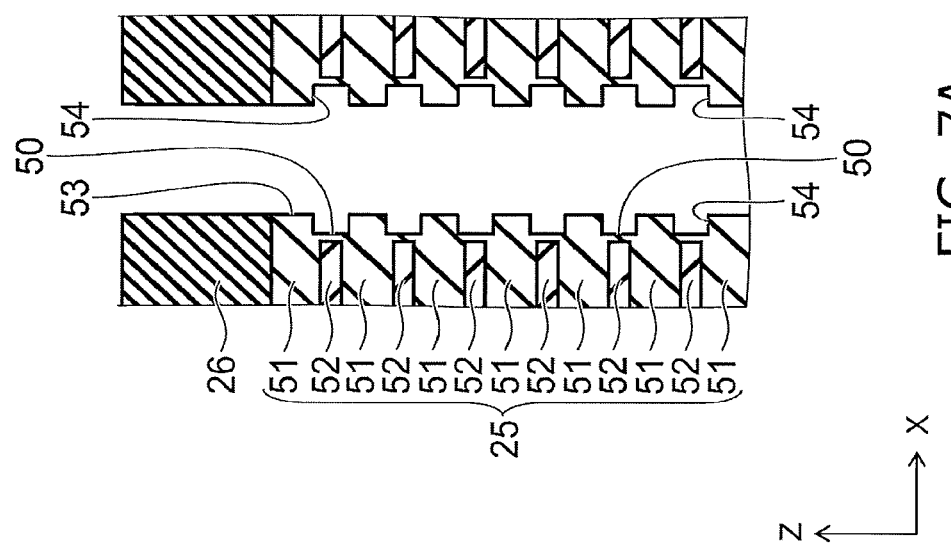

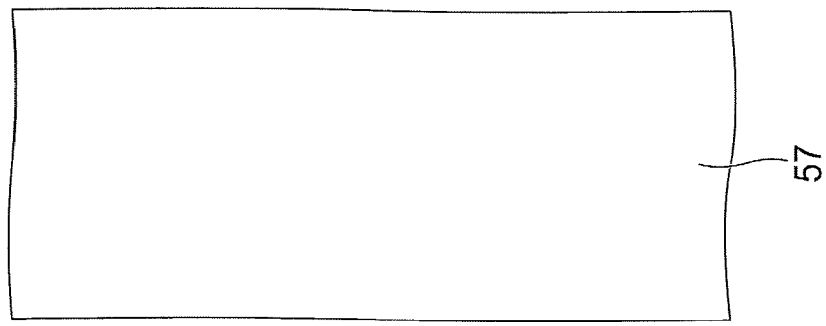
FIG. 10B
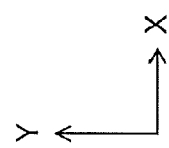
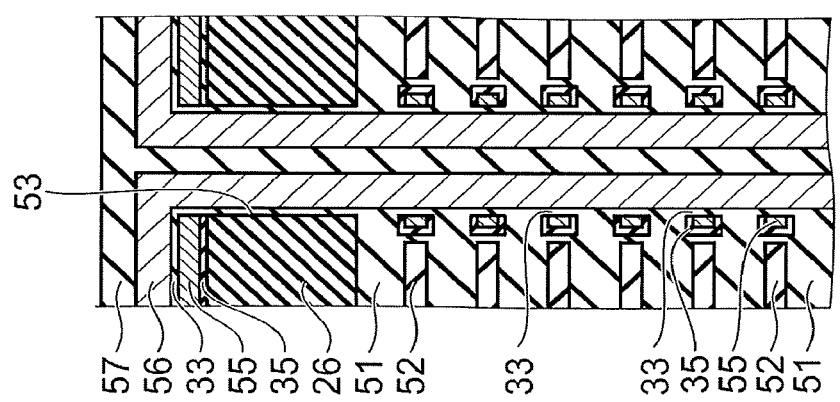
FIG. 10A
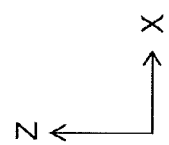

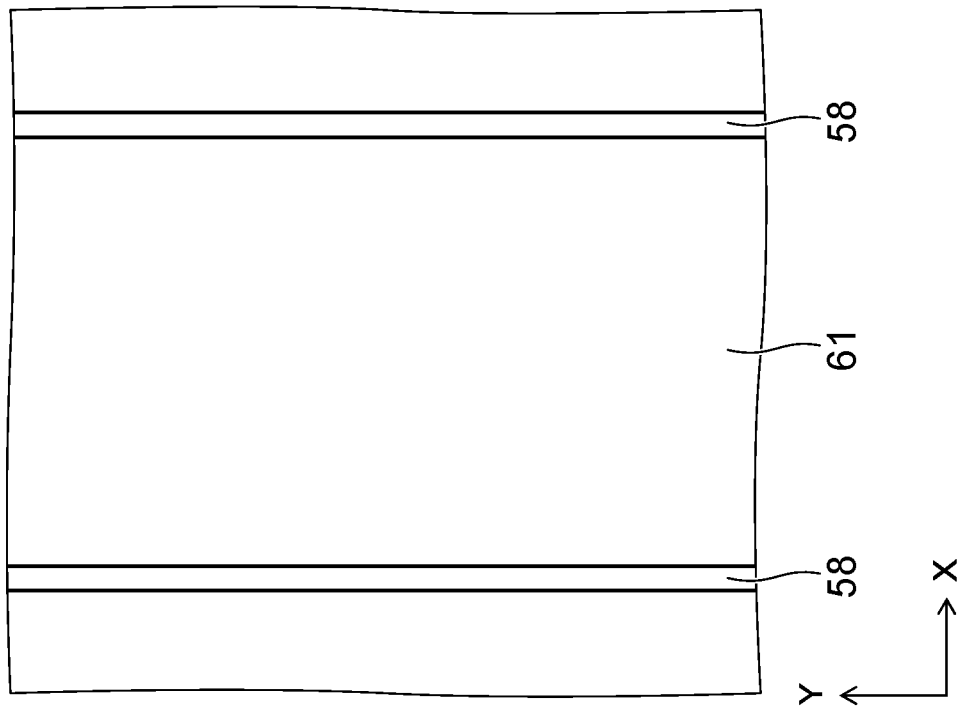
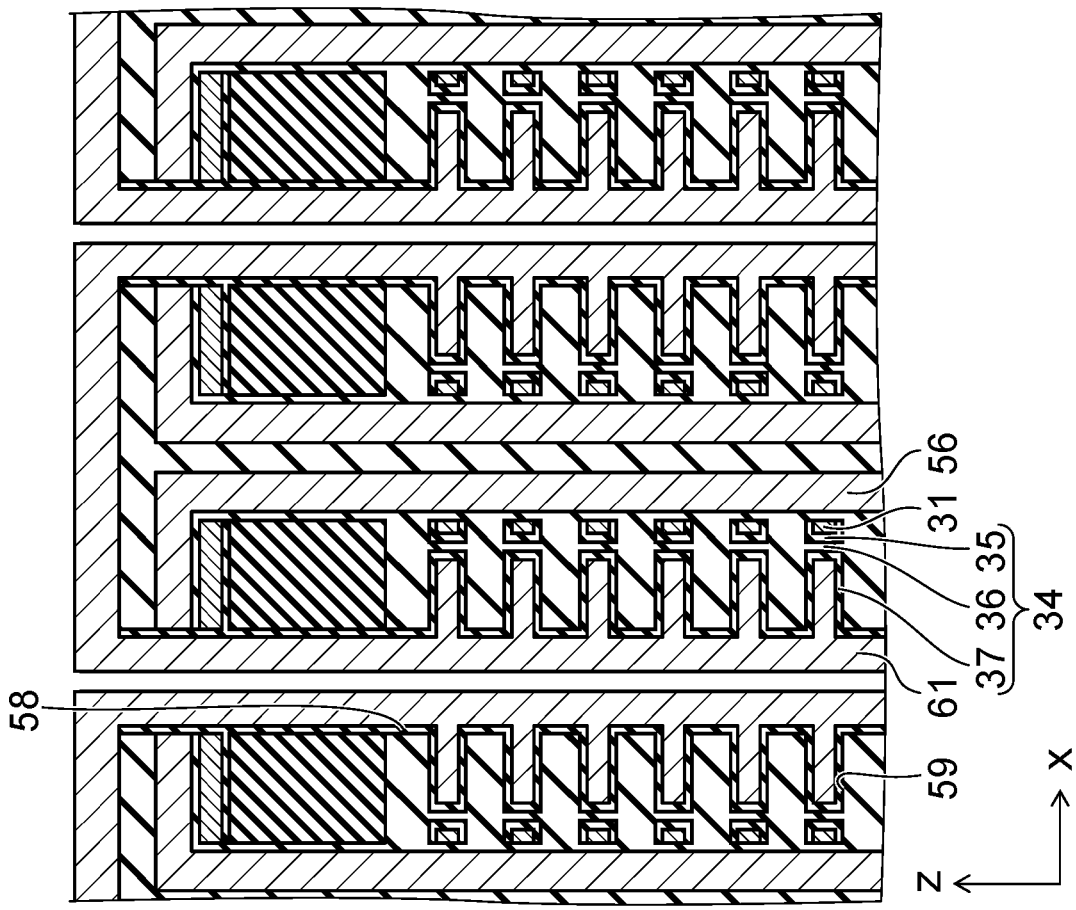
FIG. 13A
FIG. 13B

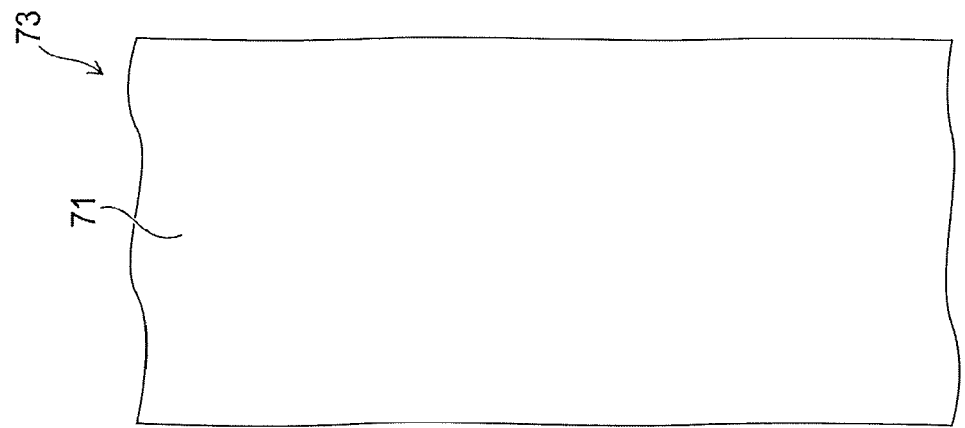
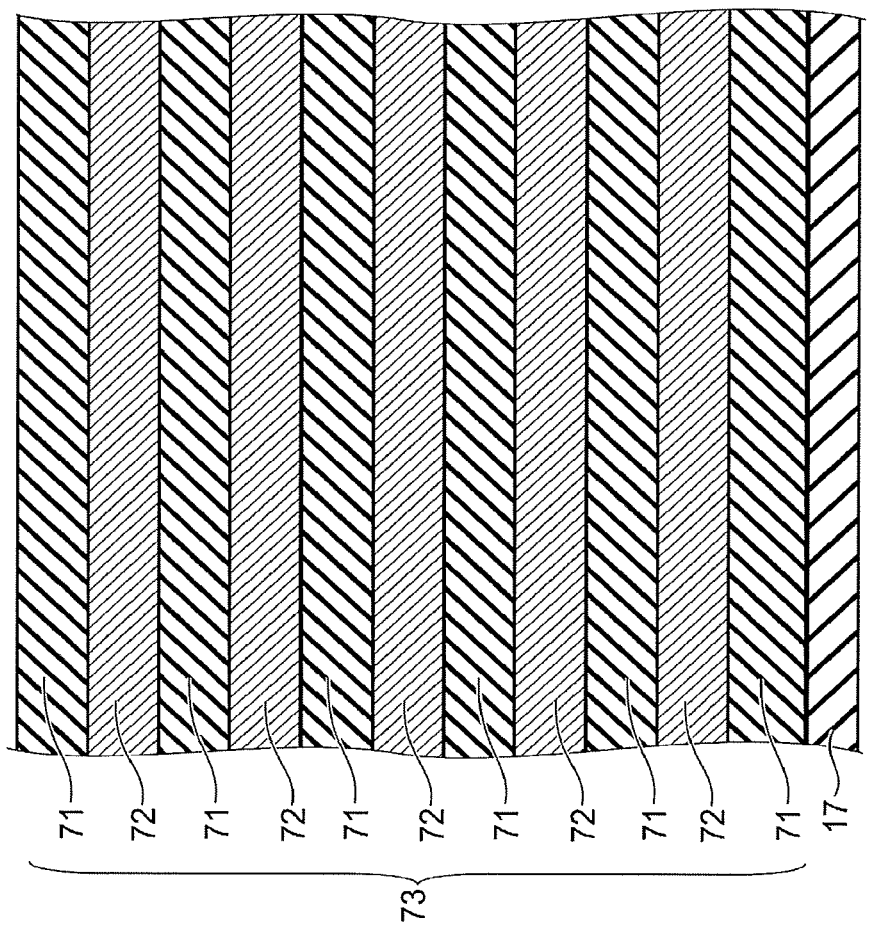

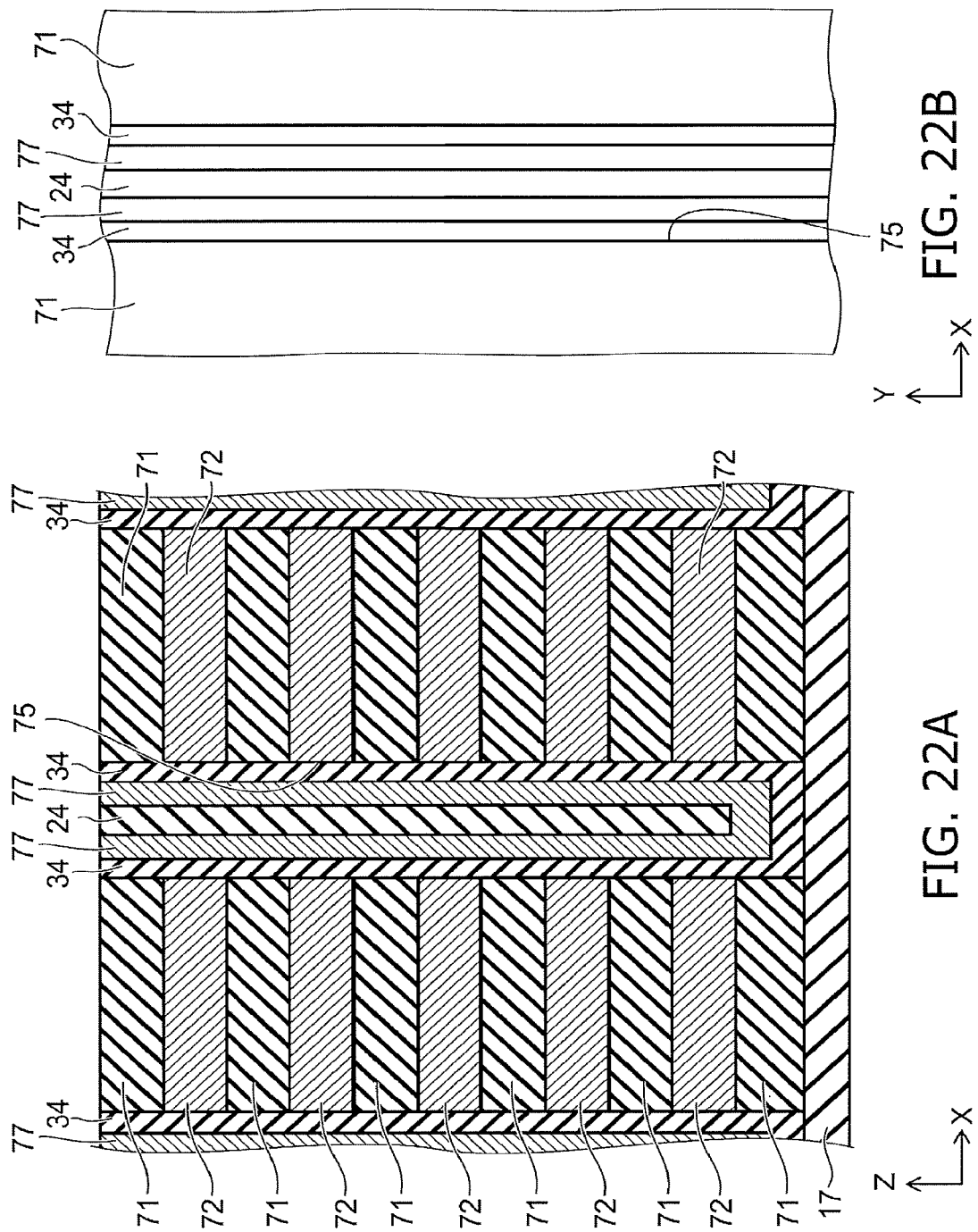

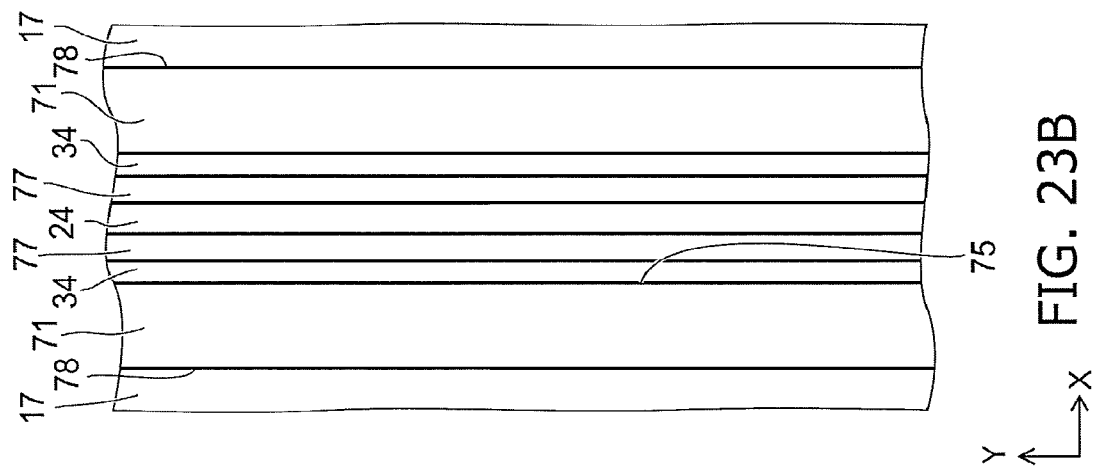
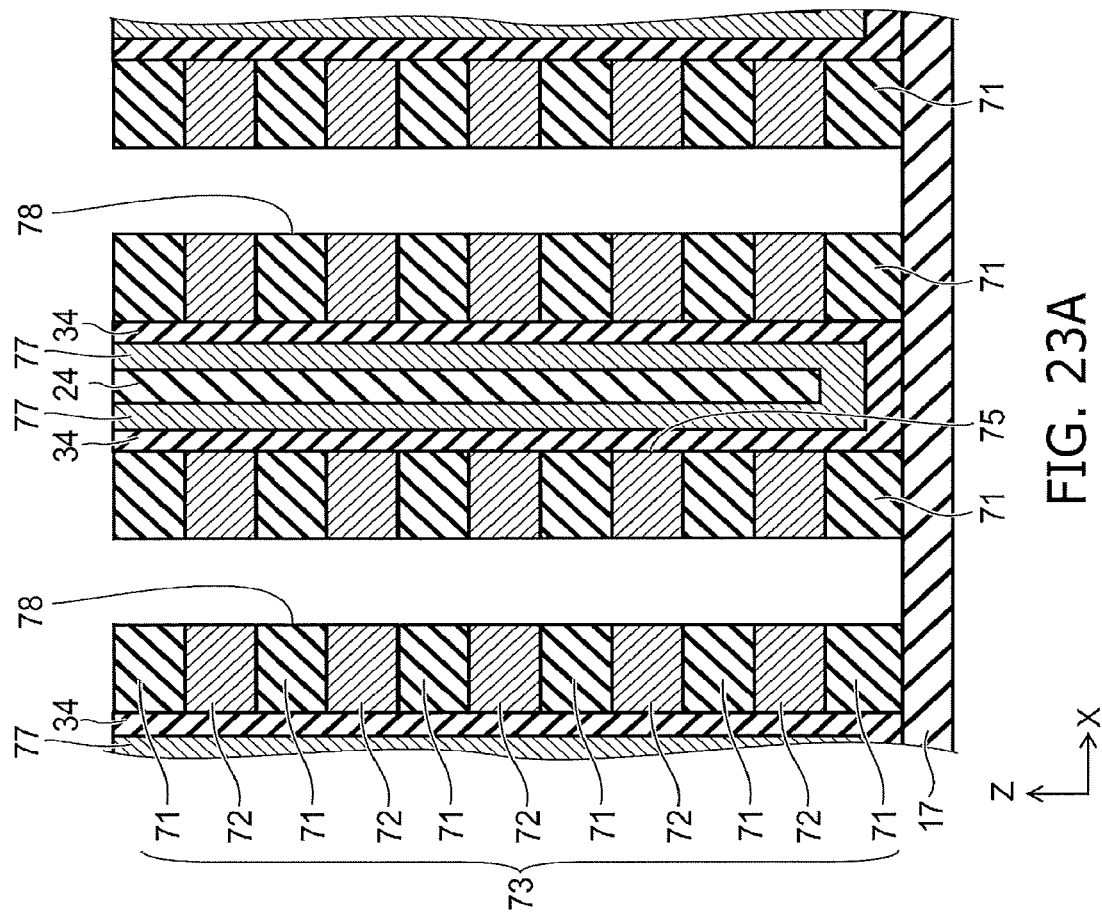

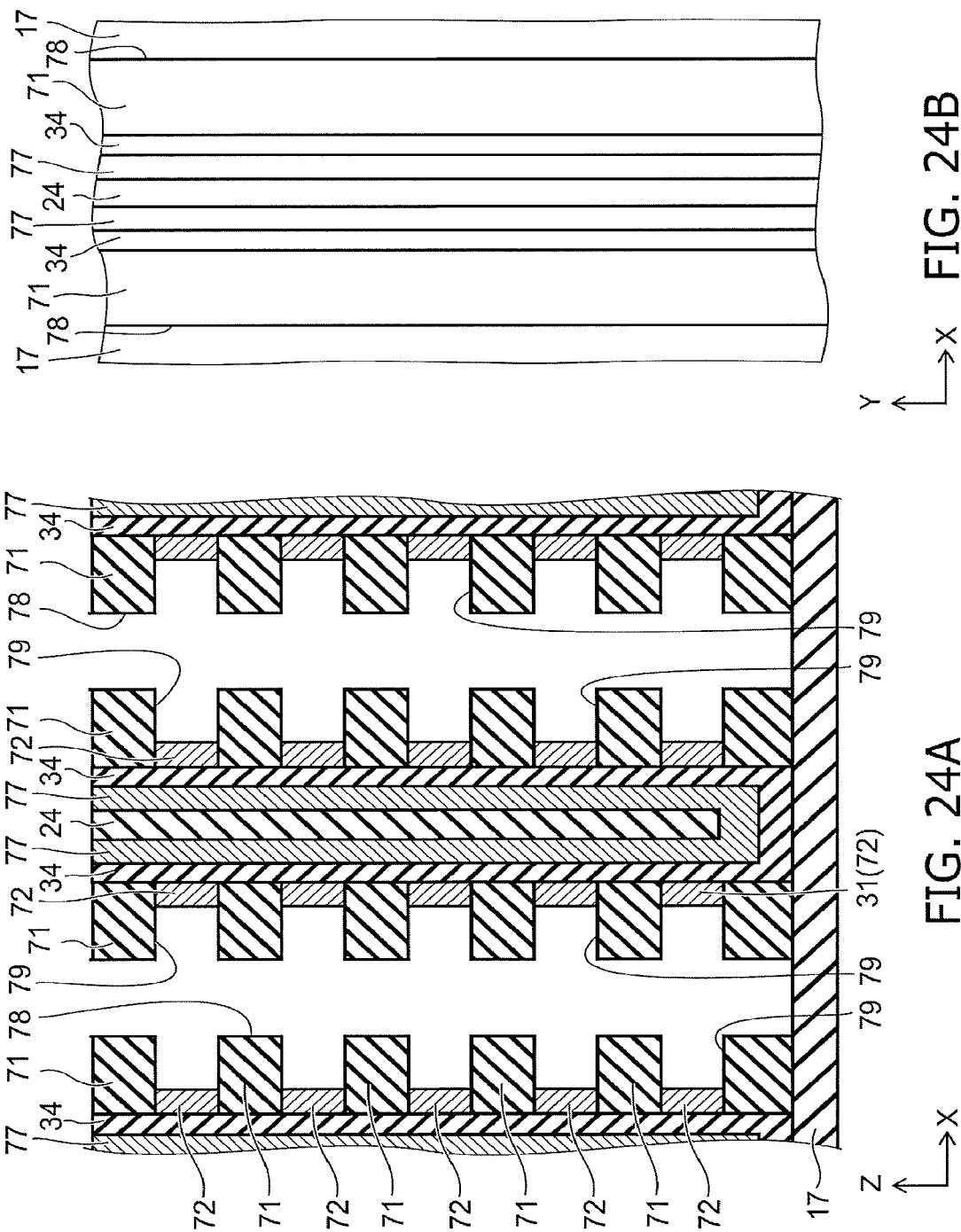

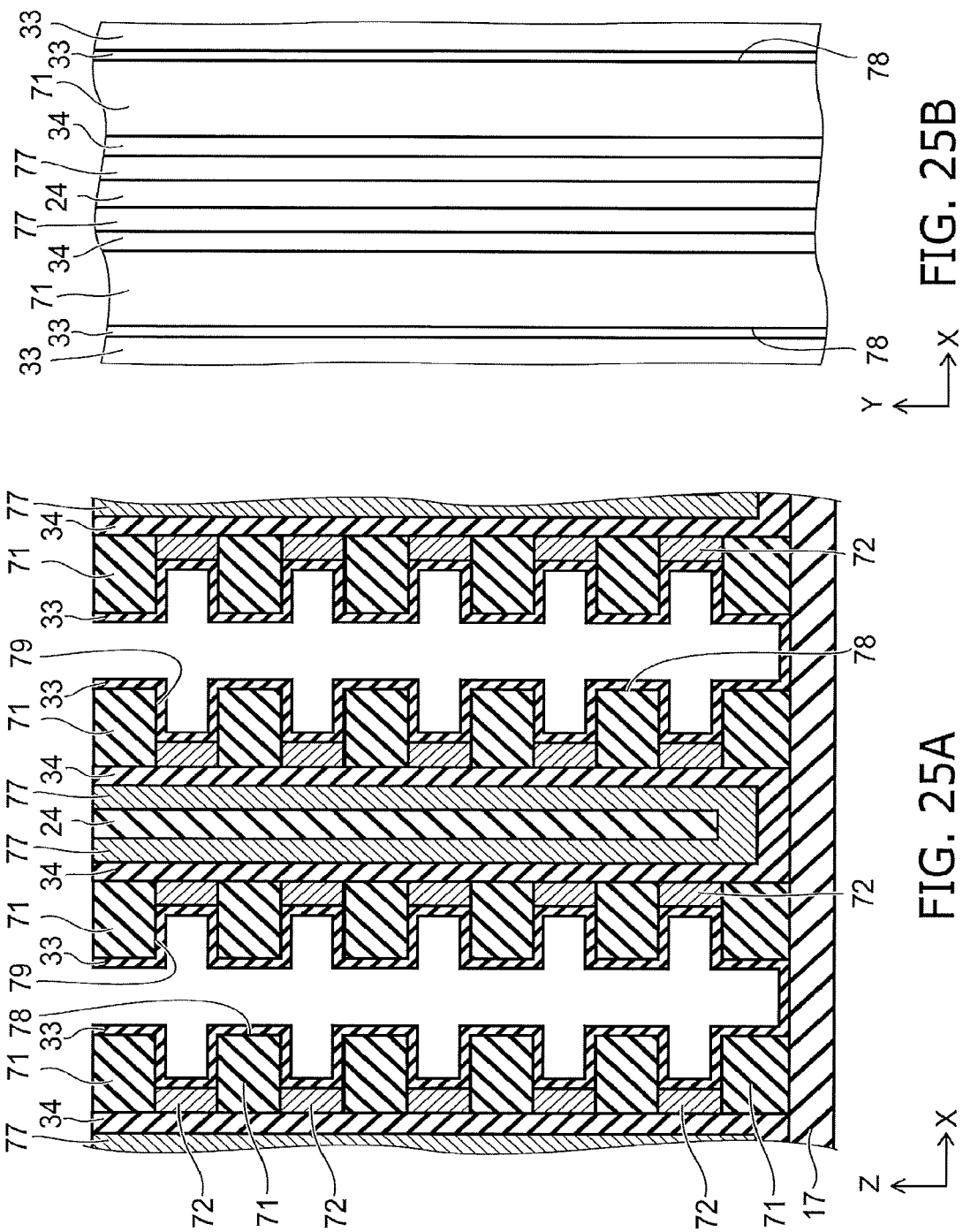

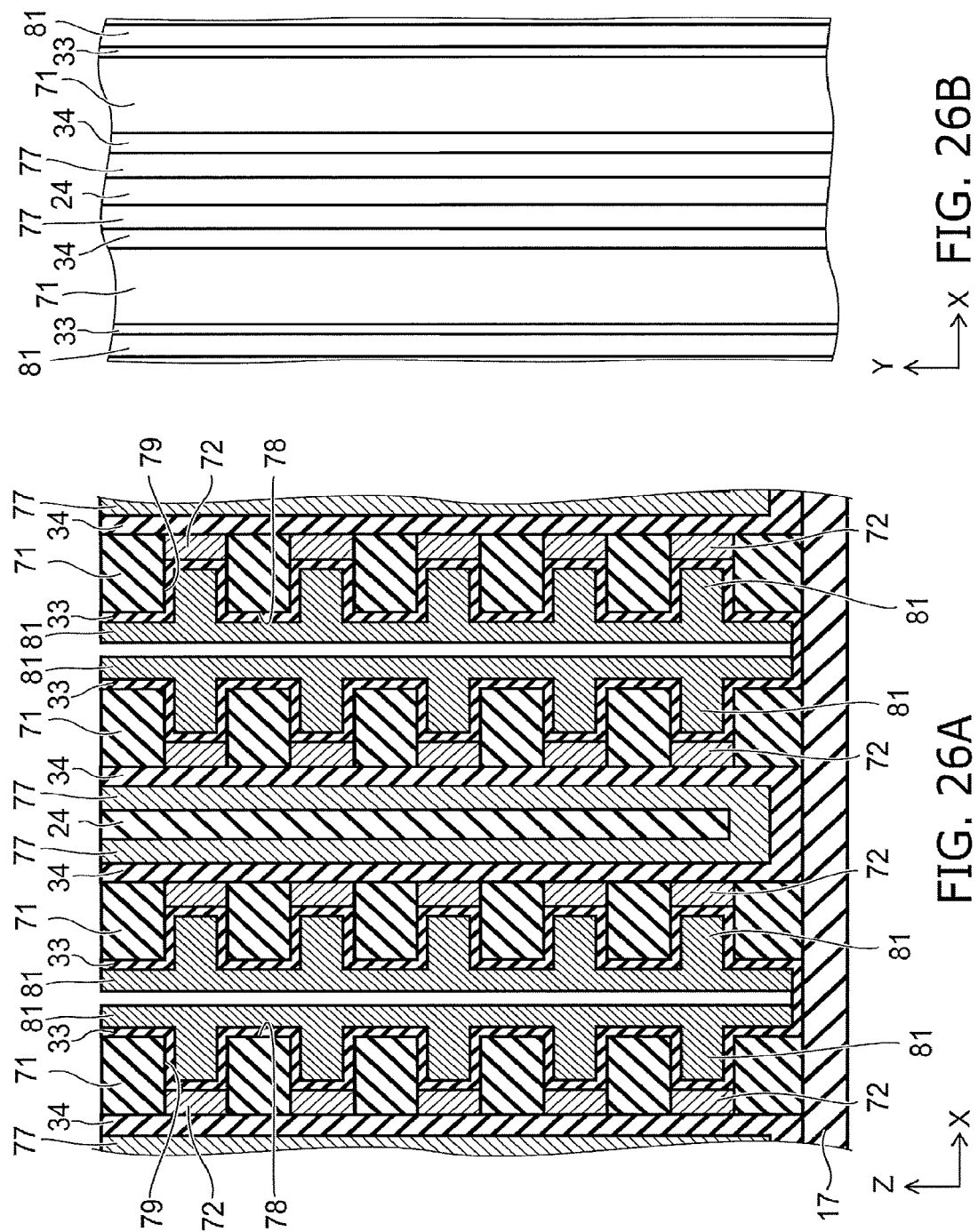

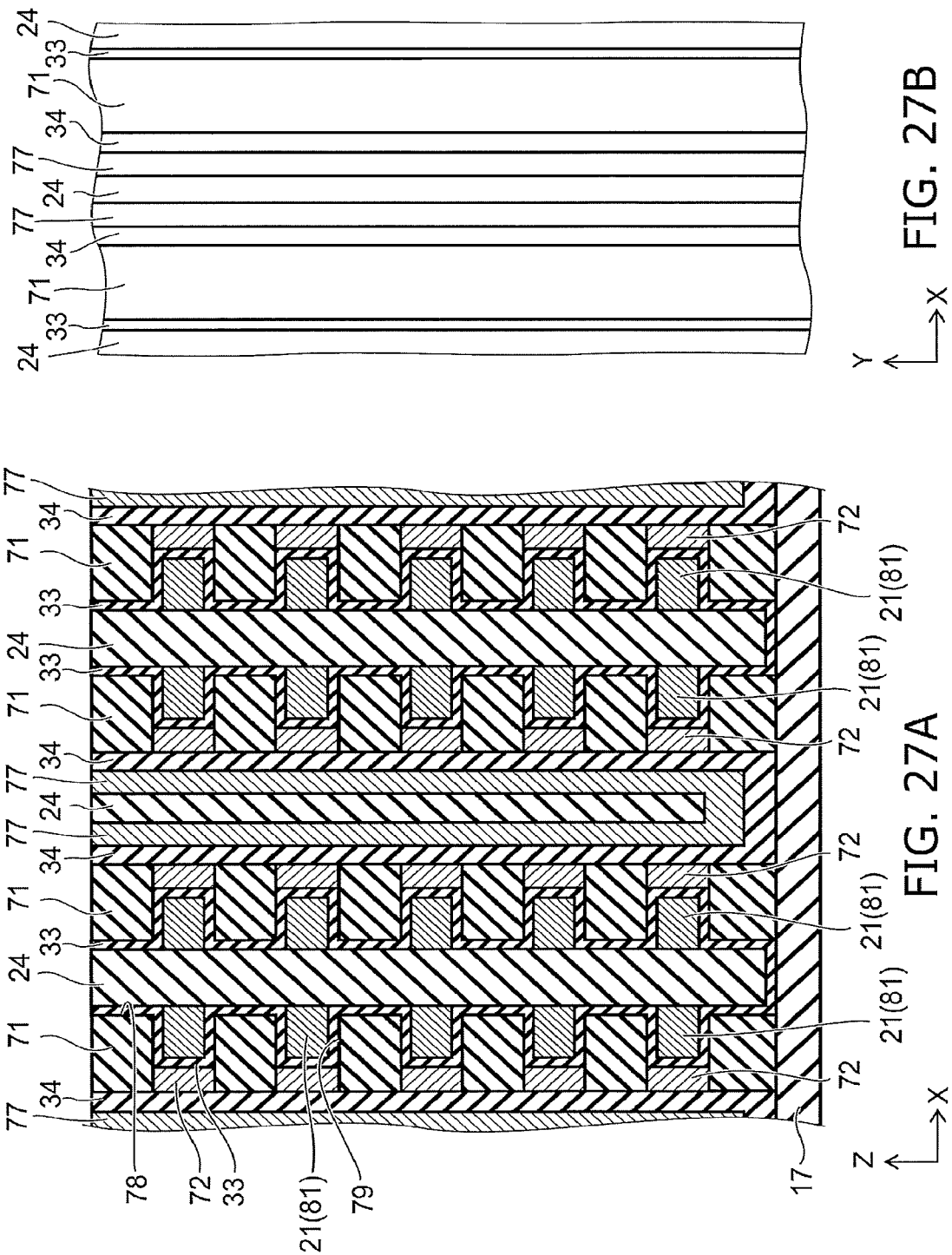

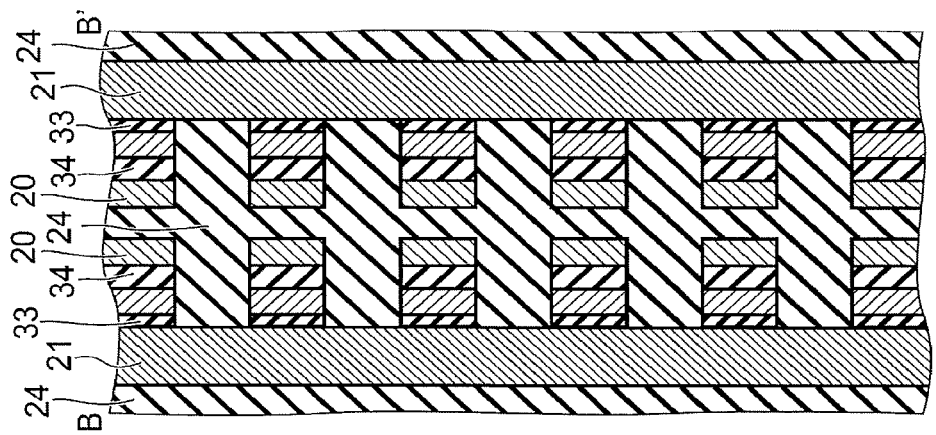
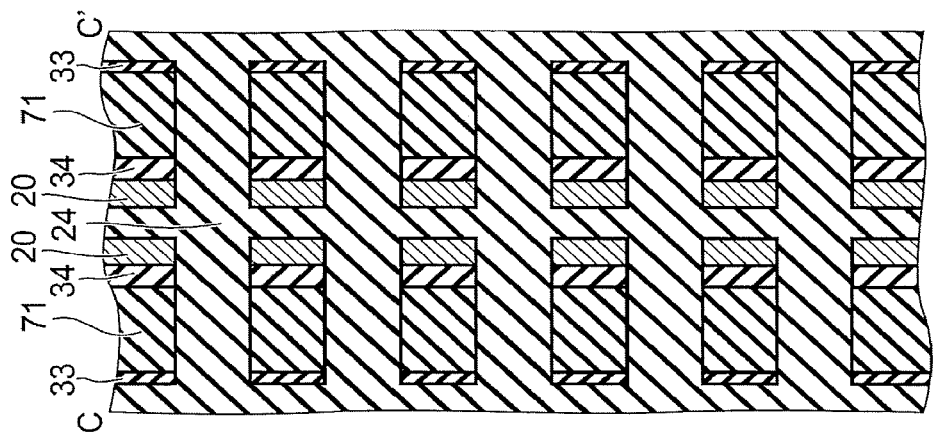
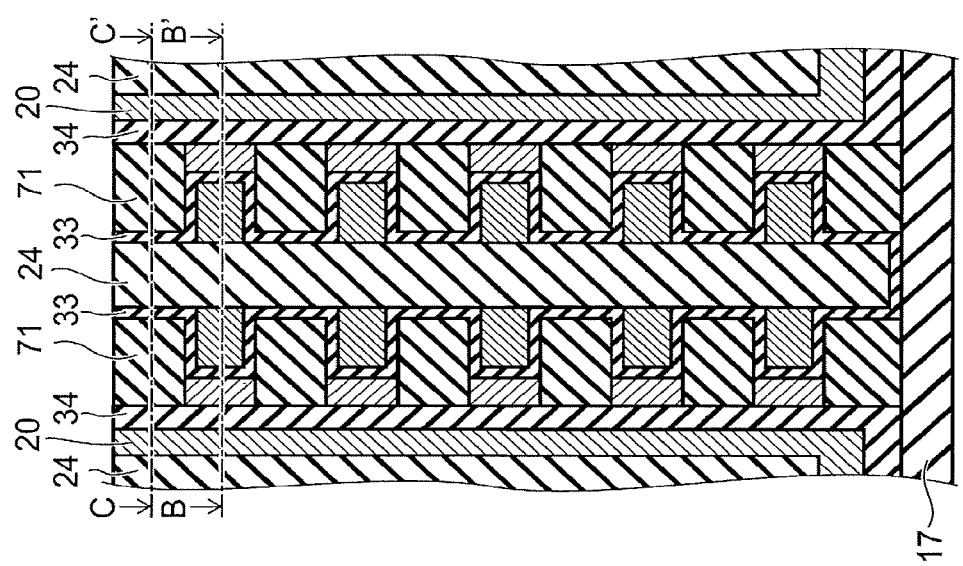
FIG. 30C
FIG. 30B
FIG. 30A

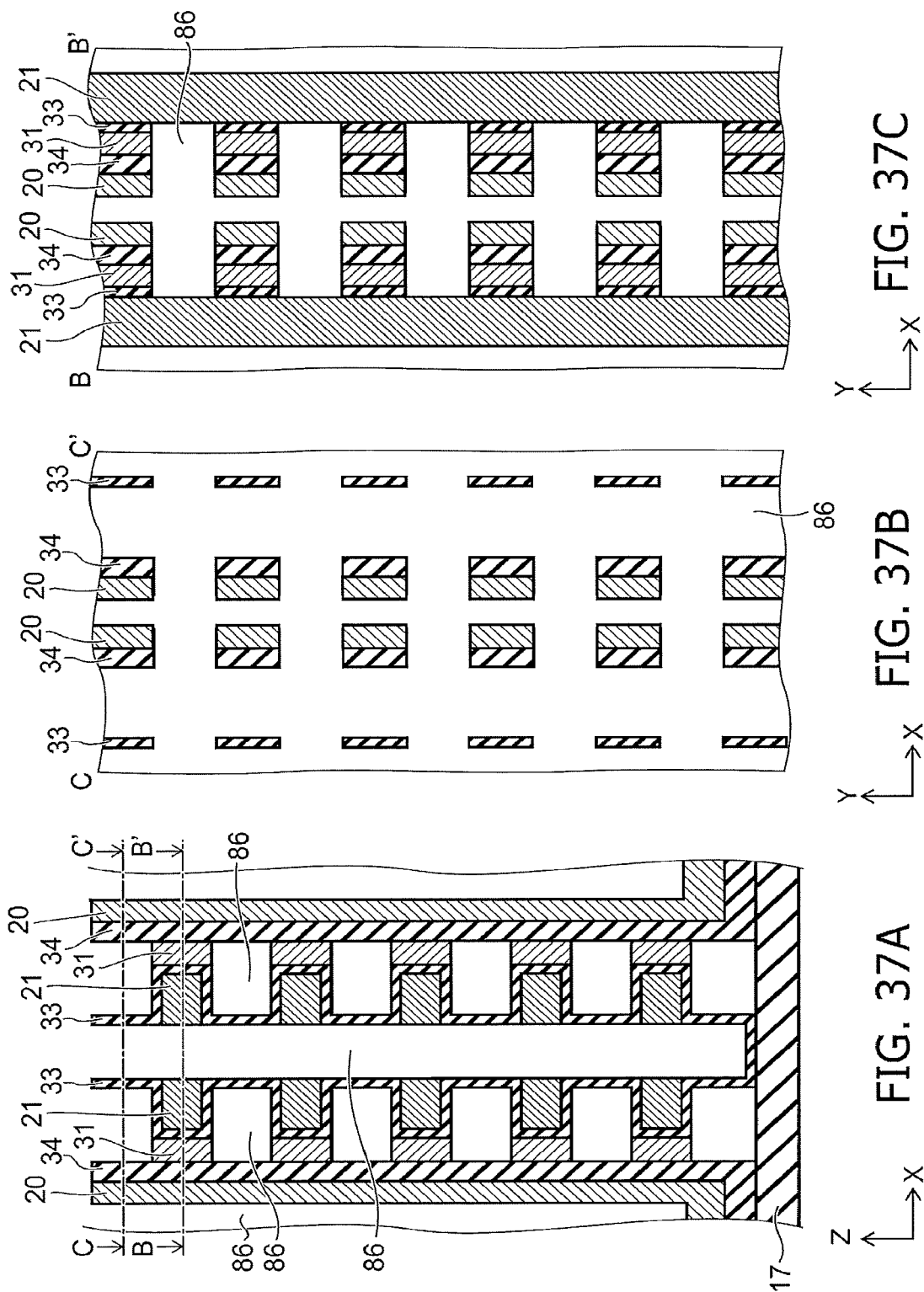

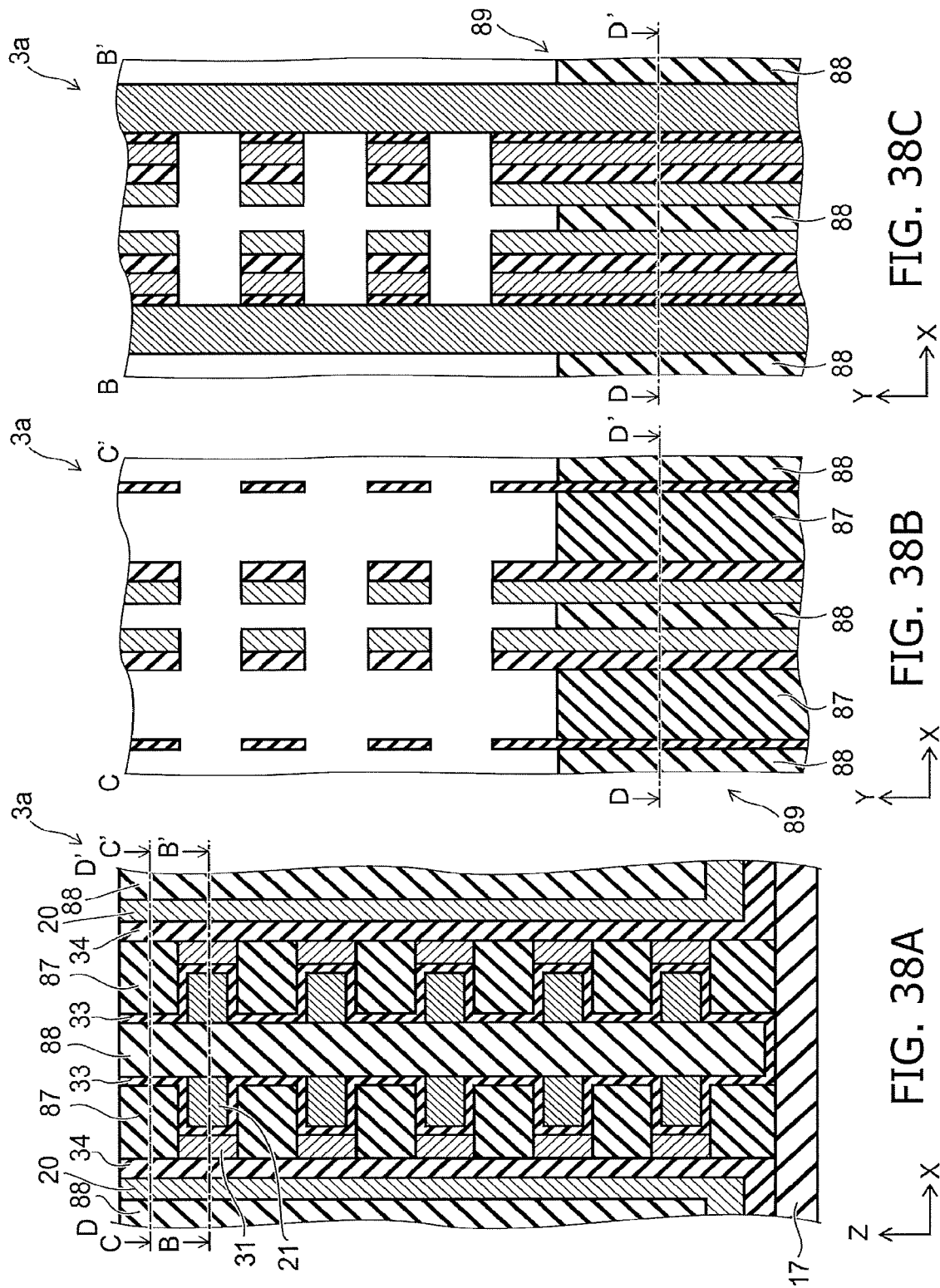

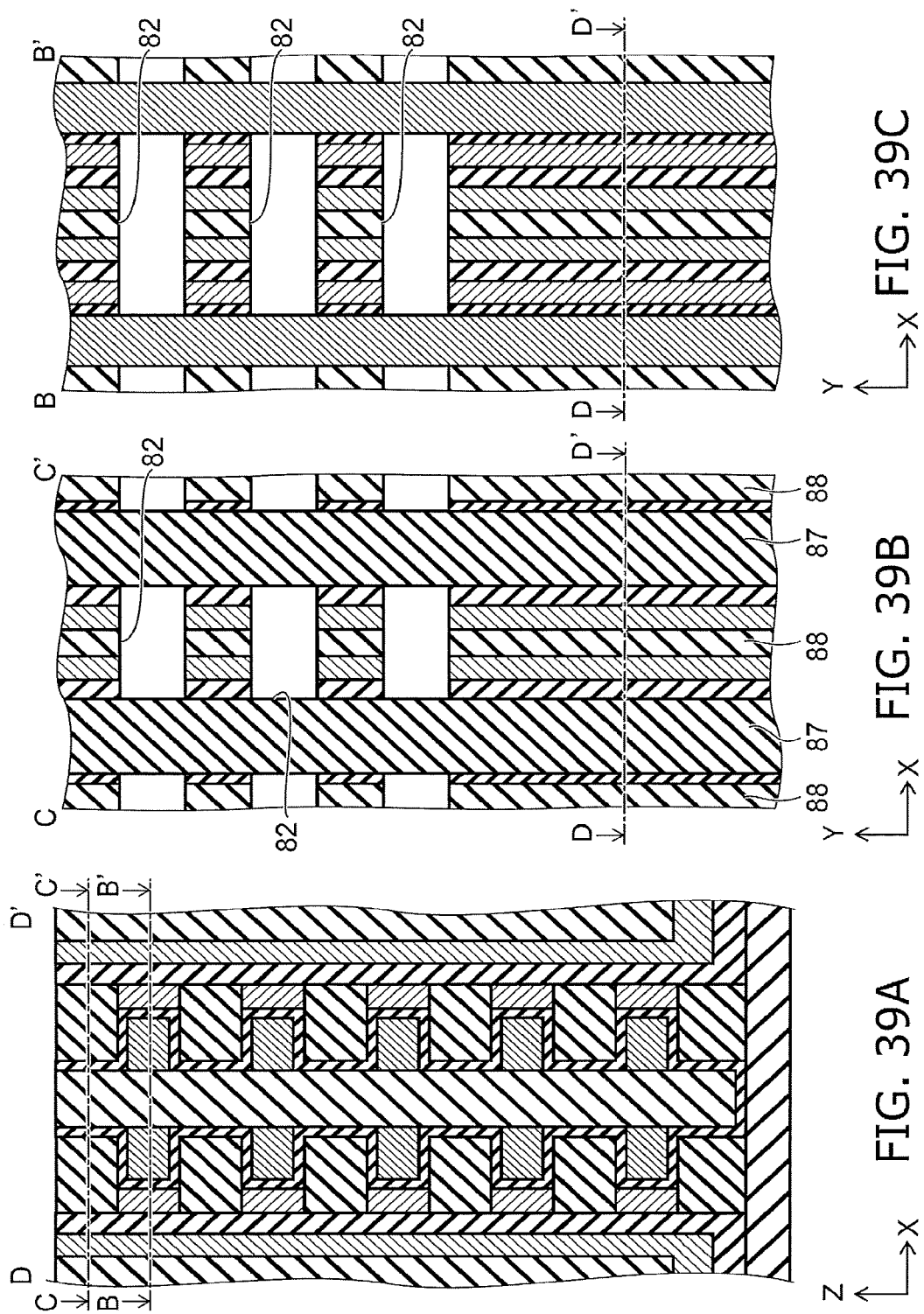

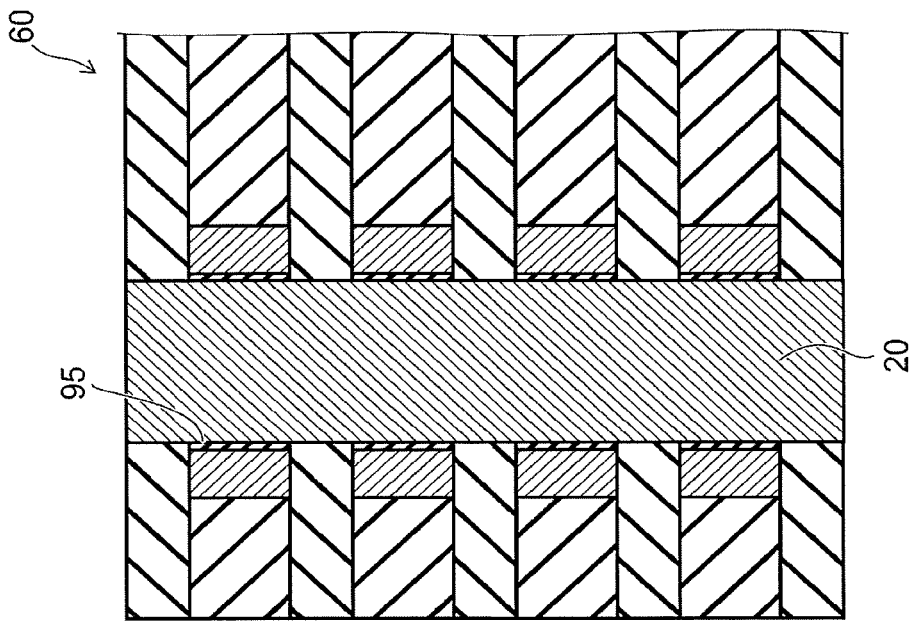
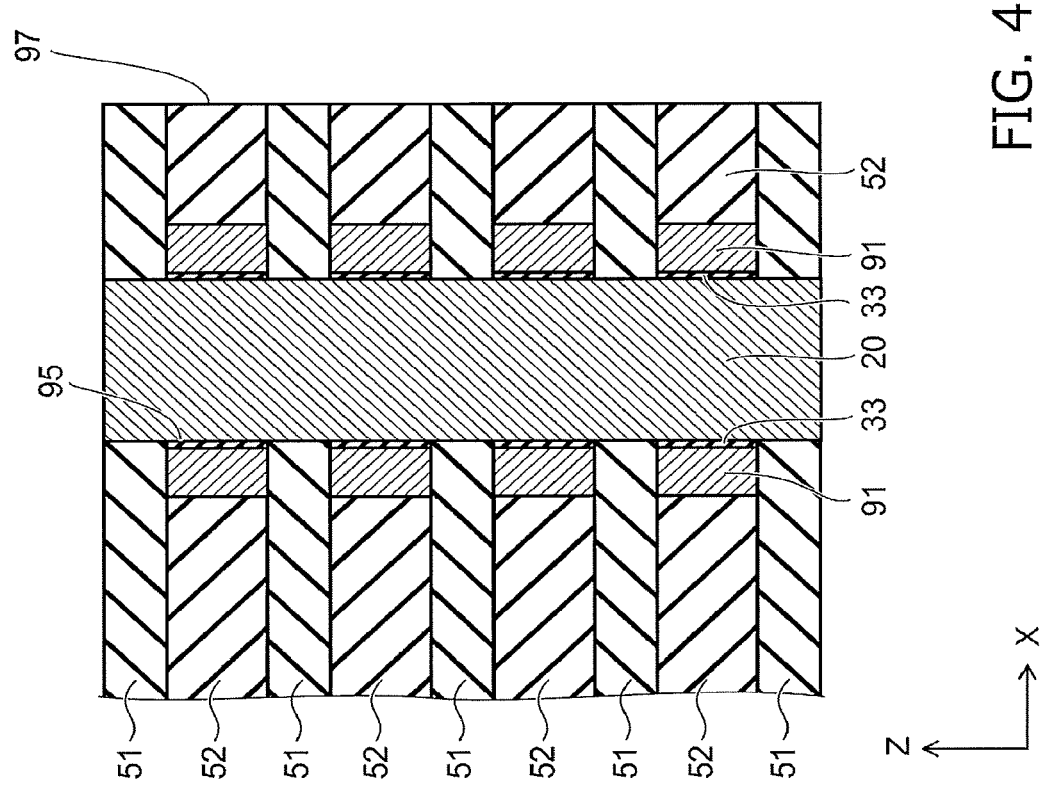
FIG. 49

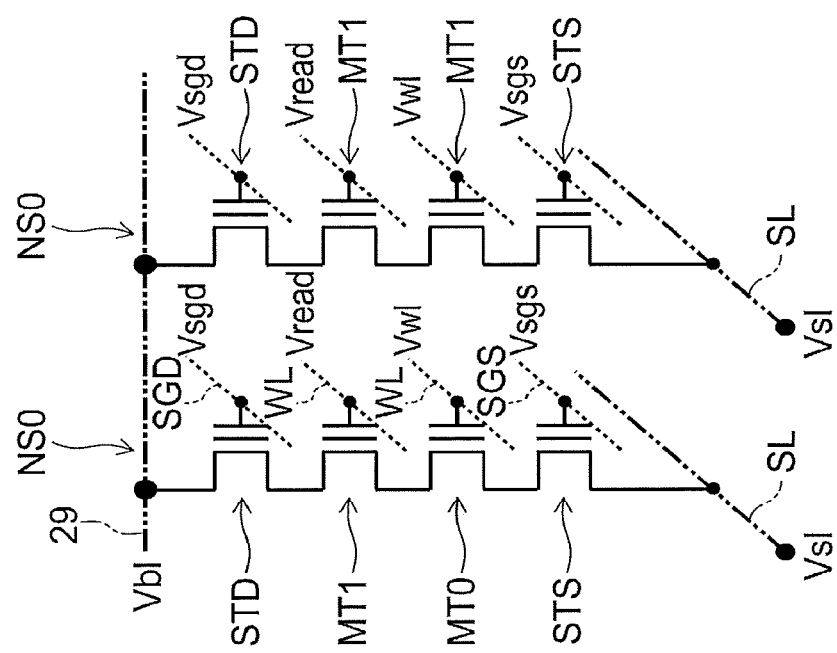

FIG. 63A

FIG. 63B SELECTION STRING

| NODE | POTENTIAL | NUMERICAL EXAMPLE OF POTENTIAL(V) |
|---|---|---|
| BIT LINE 29 | Vbl | 0.2~0.5 |
| SELECTION GATE LINE SGD | Vsgd | 2.5~4 |
| NON-SELECTION WORD LINE WL | Vread | 4.5~7 |
| SELECTION WORD LINE WL | Vwl | 0~5 (LOWER THAN Vread) |
| SELECTION GATE LINE SGS | Vsgs | 2.5~4 |
| SOURCE LINE SL | Vsl | 0 |

FIG. 63C NON-SELECTION STRING

| NODE | POTENTIAL | NUMERICAL EXAMPLE OF POTENTIAL(V) |
|---|---|---|
| BIT LINE 29 | Vbl | 0.2~0.5 |
| SELECTION GATE LINE SGD | Vsgd | 0 |
| NON-SELECTION WORD LINE WL | Vread | 4.5~7 |
| SELECTION WORD LINE WL | Vwl | 0~5 (LOWER THAN Vread) |
| SELECTION GATE LINE SGS | Vsgs | 2.5~4 |
| SOURCE LINE SL | Vsl | HIGHER THAN ZERO AND NOT HIGHER THAN Vsgs |

US 10,763,272 B2

SEMICONDUCTOR MEMORY DEVICE

CROSS-REFERENCE TO RELATED APPLICATIONS

This is a continuation application of U.S. patent application Ser. No. 15/205,954, filed Jul. 8, 2016, which is a continuation application of International Application PCT/JP2015/000044, filed on Jan. 7, 2015, which is a continuation of U.S. patent application Ser. No. 14/204,623, which is based upon and claims the benefit of priority from Japanese Application No. 2014-003793, filed Jan. 10, 2014, and Chinese Application No. 201401250359.4, filed Jun. 6, 2014; the entire contents of which are incorporated herein by reference.

FIELD

Embodiments described herein relate to a semiconductor memory device.

BACKGROUND

Although conventionally the planar structure of NAND flash memory has been shrunk to increase the bit density and reduce the bit cost, such shrink is approaching a limit. Therefore, in recent years, technology has been proposed to stack the memory cells in the vertical direction. The data retention characteristics of the memory cells are problematic in such a stacked memory device.

BRIEF DESCRIPTION OF THE DRAWINGS

FIG. 5A to FIG. 17B are plan views and cross-sectional views showing a method for manufacturing the semiconductor memory device according to the first embodiment;

FIG. 20A to FIG. 30C are plan views and cross-sectional views showing a method for manufacturing the semiconductor memory device according to the second embodiment;

FIGS. 35A to 37C are plan views and cross-sectional views showing the method for manufacturing the semiconductor memory device according to the third embodiment;

FIGS. 38A to 38C are cross-sectional views showing a semiconductor memory device according to a modification of the third embodiment;

FIGS. 39A to 39C are cross-sectional views showing a method for manufacturing the semiconductor memory device according to the modification of the third embodiment;

FIG. 45 to FIG. 53 are cross-sectional views showing a method for manufacturing the semiconductor memory device according to the fifth embodiment;

FIG. 63A is a schematic circuit diagram showing the selection NAND string and the non-selection NAND string, FIG. 63B shows a potential applied to the selection NAND string, and FIG. 63C shows a potential applied to the non-selection NAND string

DETAILED DESCRIPTION

Figure 1:
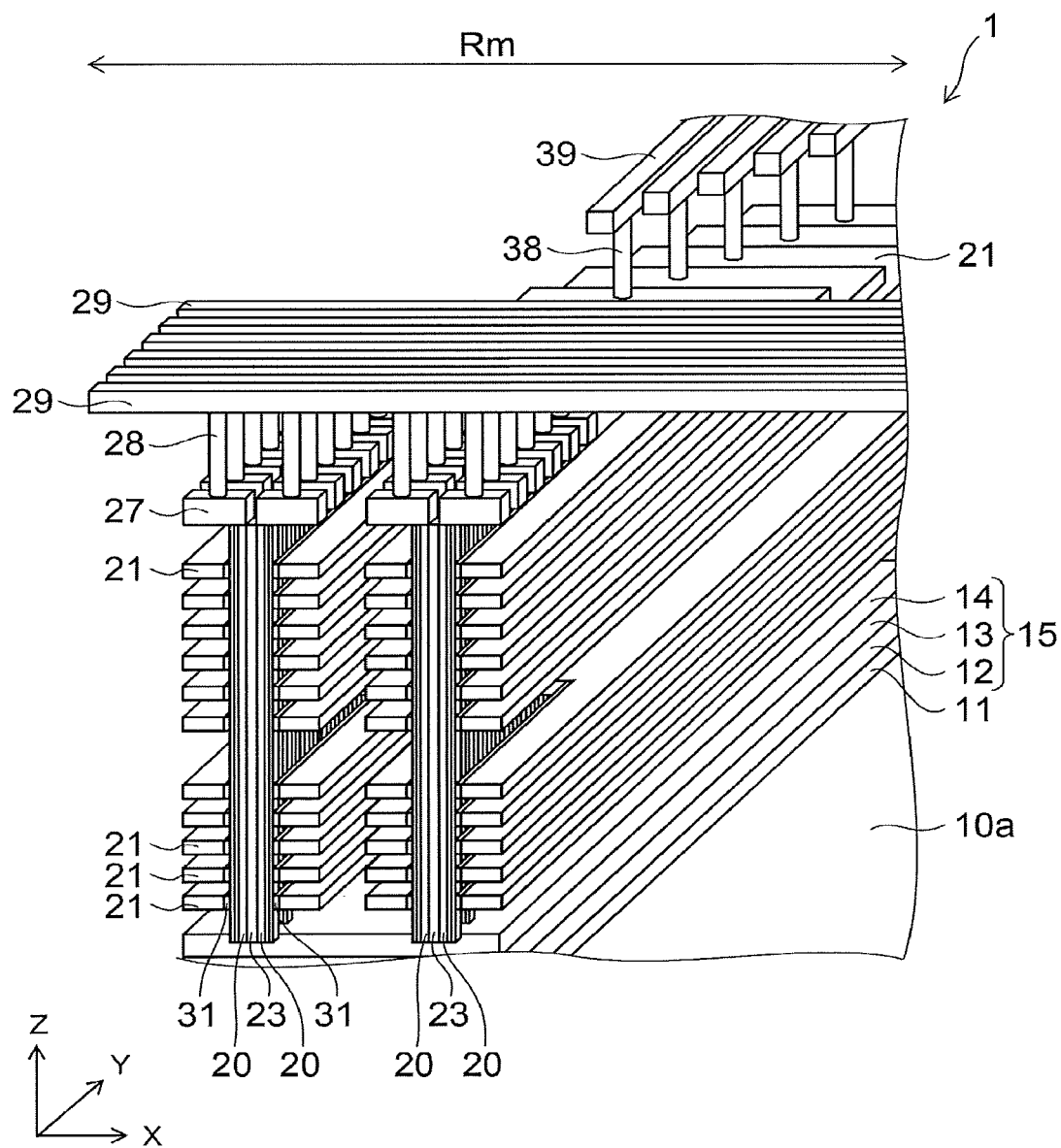
FIG. 1 is a perspective view showing a semiconductor memory device according to a first embodiment.

In general, according to one embodiment, a semiconductor memory device, includes a substrate, a first pillar column, a second pillar column, a first control column, a second control column, a third control column, a fourth control column, a plurality of second electrode films, a first insulating film and a second insulating film. The first pillar column has a plurality of semiconductor pillars provided on the substrate. Each of the plurality of semiconductor pillars extend in a vertical direction. The plurality of semiconductor pillars of the first pillar column are arranged by one sequence in a first direction intersecting with the vertical direction. The second pillar column has a plurality of semiconductor pillars provided on the substrate. Each of the plurality of semiconductor pillars extends in the vertical direction. The plurality of semiconductor pillars of the second pillar column are arranged by one sequence in the first direction. The second pillar column is located in a second direction of the first pillar column. The second direction intersects with the vertical direction and the first direction. The first control column has a plurality of first electrode films extending in the first direction. The plurality of first electrode films of the first control column are disposed to be separated from each other along the vertical direction. The second control column has a plurality of first electrode films extending in the first direction. The plurality of first electrode films of the second control column are disposed to be separated from each other along the vertical direction. The third control column has a plurality of first electrode films extending in the first direction. The plurality of first electrode films of the third control column are disposed to be separated from each other along the vertical direction. The fourth control column has a plurality of first electrode films extending in the first direction. The plurality of first electrode films of the fourth control column are disposed to be separated from each other along the vertical direction. The plurality of second electrode films are provided between the semiconductor pillars and the first electrode films. The plurality of second electrode films are disposed to be separated from each other along the vertical direction, the first direction and the second direction. The first insulating film is provided between one of the semiconductor pillars and one of the second electrode films. The second insulating film is provided between one of the second electrode films and one of the first electrode films. The first pillar column, the second pillar column, the first control column, the second control column, the third control column and the fourth control column are arranged in the second direction. The first pillar column is located between the first control column and the second control column. The second pillar column is located between the third control column and the fourth control column. The second control column and the third control column are located between the first pillar column and the second pillar column.

According to other embodiment, a semiconductor memory device includes two first electrode films, a first column and a second insulating film. The two first electrode films extend in a first direction and are separated from each other in a second direction intersecting with the first direction. The first column is provided between the two first electrode films and has a plurality of first members and a plurality of insulating members. Each of the first members and each of the insulating members are arranged alternately in the first direction. One of the plurality of first members has a semiconductor pillar, a second electrode film and a first insulating film provided between the semiconductor pillar and the second electrode film. The semiconductor pillar, the first insulating film and the second electrode film are arranged in the second direction. The second insulating film is provided between the first column and one of the two first electrode films.

First Embodiment

Embodiments of the invention will now be described with reference to the drawings.

First, a first embodiment will be described.

FIG. 1 is a perspective view showing a semiconductor memory device according to the embodiment.

Figure 2:
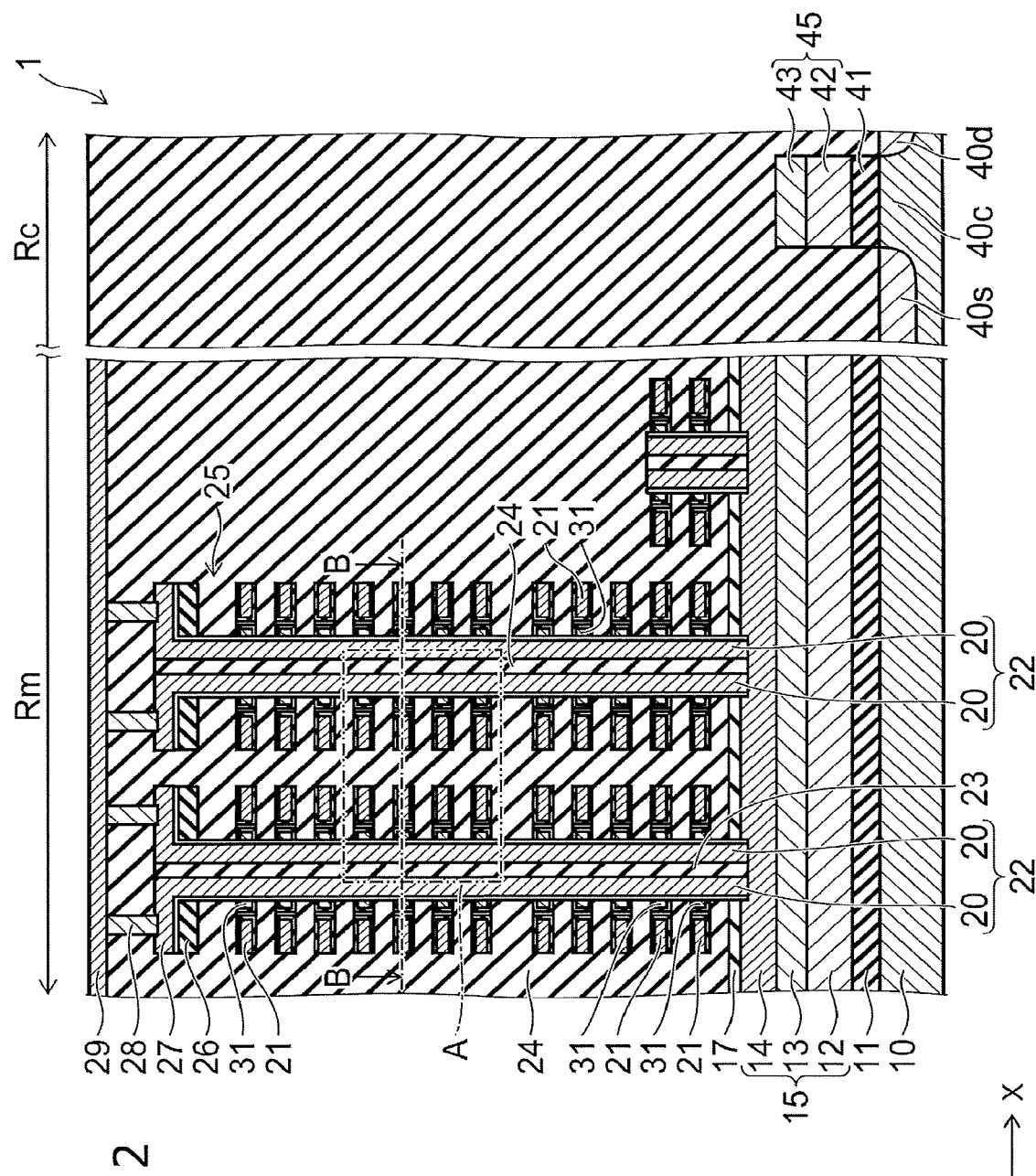
FIG. 2 is a cross-sectional view showing the semiconductor memory device according to the first embodiment.

FIG. 2 is a cross-sectional view showing the semiconductor memory device according to the embodiment.

Figure 3:
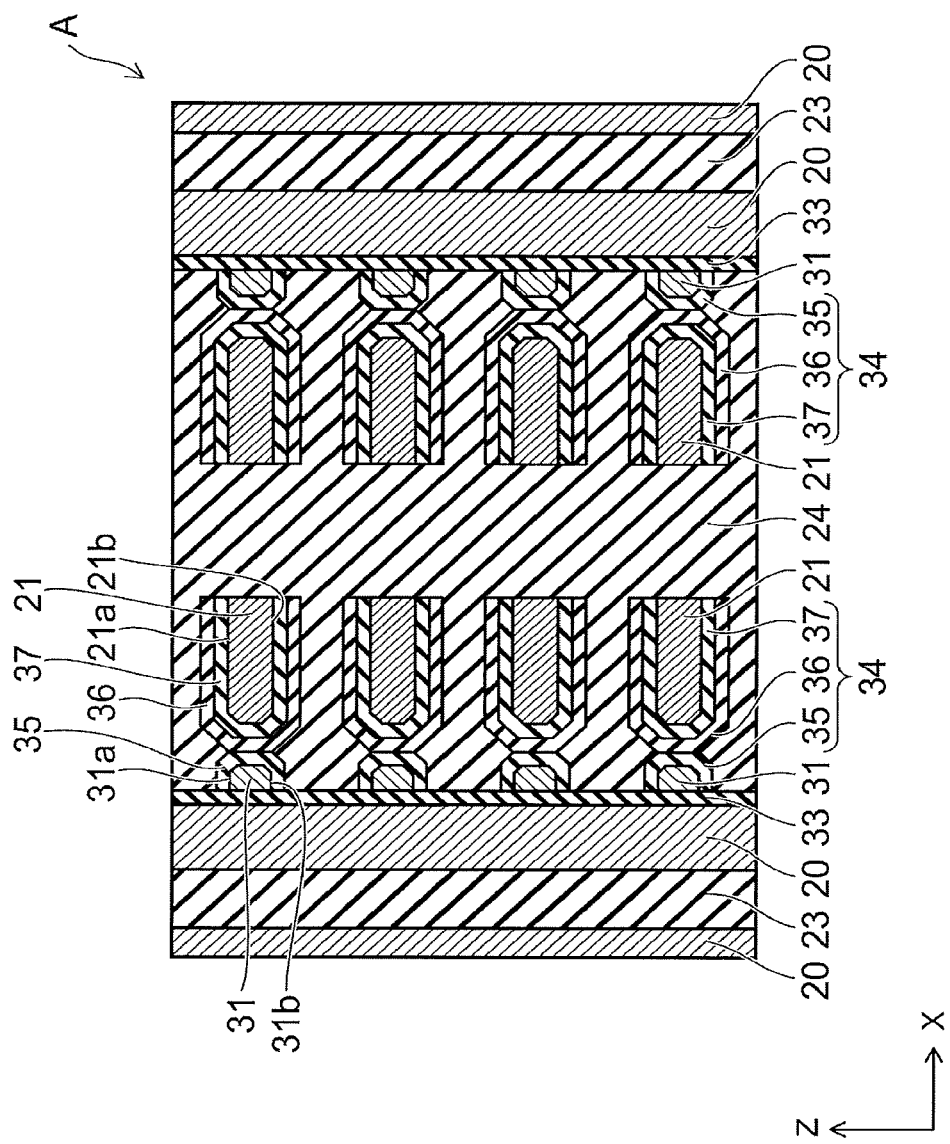
FIG. 3 is a cross-sectional view showing region A shown in FIG. 2.

FIG. 3 is a cross-sectional view showing region A shown in FIG. 2.

Figure 4:
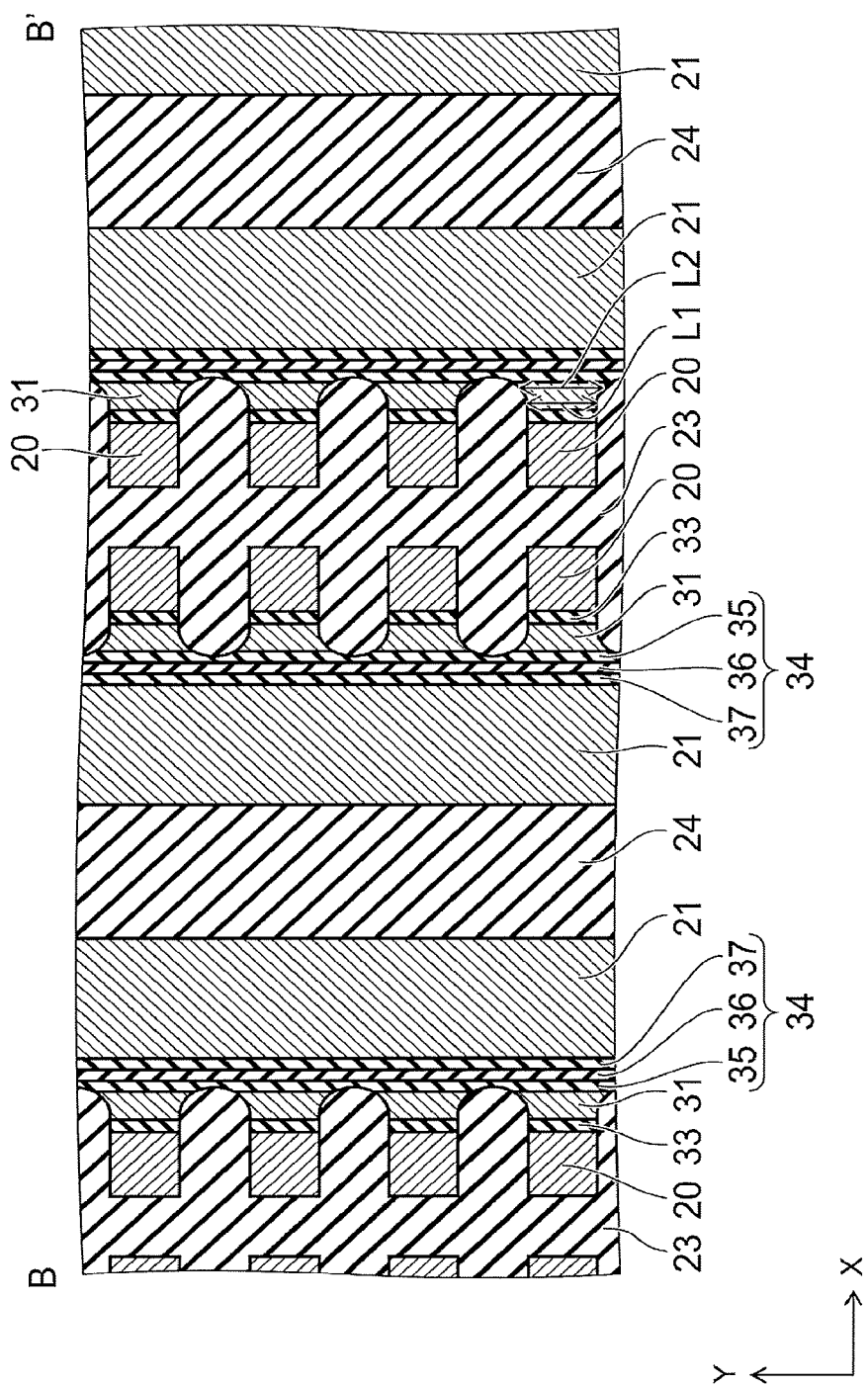
FIG. 4 is a cross-sectional view along line B-B' shown in FIG. 2.

FIG. 4 is a cross-sectional view along line B-B' shown in FIG. 2.

As shown in FIG. 1 and FIG. 2, a silicon substrate 10 is provided in the semiconductor memory device 1 according to the embodiment. A memory cell region Rm and a peripheral circuit region Rc are set in the silicon substrate 10. Hereinbelow, an XYZ orthogonal coordinate system is employed in the specification for convenience of description. Two mutually-orthogonal directions parallel to an upper surface 10*a* of the silicon substrate 10 are taken as an X-direction and a Y-direction; and a direction perpendicular to the upper surface 10*a* is taken as a Z-direction.

In the memory cell region Rm, an insulating film 11 (a third insulating film) that is made of, for example, silicon oxide, a conductive layer 12 that is made of, for example, polysilicon, an interconnect layer 13 that is made of, for example, tungsten, and a conductive layer 14 that is made of, for example, polysilicon are stacked in this order on the silicon substrate 10. A cell source line 15 is formed of the conductive layer 12, the interconnect layer 13, and the conductive layer 14. An insulating film 17 that is made of, for example, silicon oxide is provided on the cell source line 15. Multiple silicon pillars 20 that extend in the Z-direction are provided on the cell source line 15. The silicon pillars 20 are made of, for example, polysilicon; and the lower ends of the silicon pillars 20 pierce the insulating film 17 to be connected to the cell source line 15. The silicon pillars 20 are arranged in a matrix configuration along the X-direction and the Y-direction as viewed from the Z-direction and have a common connection with a single cell source line 15.

Multiple control gate electrode films (the first electrode films) 21 are provided sideward of the silicon pillar 20 to be separated from each other along the Z-direction. Each of the control gate electrode films 21 is made of, for example, tungsten and extends in the Y-direction. Therefore, the control gate electrode films 21 are not disposed between the silicon pillars 20 arranged along the Y-direction. Also, in the X-direction, two of the silicon pillars 20 are arranged alternately with two of the control gate electrode films 21. In other words, when the silicon pillars 20 arranged along the X-direction are organized into multiple sets 22 every two mutually-adjacent silicon pillars 20 and when two of the control gate electrode films 21 are arranged to be positioned between the sets 22, the control gate electrode films 21 are not disposed between the two silicon pillars 20 belonging to each set 22.

An inter-layer insulating film 23 is provided between the silicon pillars 20. An inter-layer insulating film 24 that is made of, for example, silicon oxide is provided between the control gate electrode films 21, below the control gate electrode film 21 of the lowermost layer, and above the control gate electrode film 21 of the uppermost layer. A hard mask 26 is provided on a stacked body 25 that is made of the multiple control gate electrode films 21, the inter-layer insulating film 23, and the inter-layer insulating film 24.

The silicon pillar 20 is drawn out onto the hard mask 26 to be a single body with an interconnect 27 extending in the X-direction. A via 28 is provided on the interconnect 27; and a bit line 29 that extends in the X-direction is provided on the via 28. The bit line 29 is connected to the interconnect 27 by the via 28. Thus, each of the silicon pillars 20 is connected between the bit line 29 and the cell source line 15. In other words, the semiconductor memory device 1 is an I-shaped pillar type stacked memory device.

The Y-direction end portion of the stacked body 25 is patterned into a stairstep configuration; and at the end portion of the stairstep configuration, the multiple control gate electrode films 21 that have the same position in the Z-direction are bundled together. A via 38 is provided on the end portion of the bundled control gate electrode films 21. A word line 39 that extends in the Y-direction is provided on the via 38. In the Z-direction, the position of the word line 39 is the same as the position of the bit line 29. The word line 39 is connected to the control gate electrode film 21 by the via 38.

As shown in FIG. 3 and FIG. 4, floating gate electrode films 31 (second electrode films) that are made of, for example, polysilicon are provided between the silicon pillars 20 and the control gate electrode films 21. Because the floating gate electrode films 31 are provided at each intersection between the silicon pillars 20 and the control gate electrode films 21, the floating gate electrode films 31 are arranged in a matrix configuration to be separated from each other along the Y-direction and the Z-direction. As described above, because the silicon pillars 20 and the control gate electrode films 21 are arranged along the X-direction, the floating gate electrode films 31 are also arranged along the X-direction. AS a result, the floating gate electrode films 31 are arranged in the XYZ three-dimensional matrix configuration. When viewed from the Z-direction, the configuration of the floating gate electrode film 31 is a fan-like shape that is wider on the control gate electrode film 21 side. Therefore, a length L1 in the Y-direction of the end portion of the floating gate electrode film 31 on the silicon pillar 20 side is shorter than a length L2 in the Y-direction of the end portion of the floating gate electrode film 31 on the control gate electrode film 21 side.

A tunneling insulating film 33 that is made of, for example, silicon oxide is provided between the silicon pillar 20 and the floating gate electrode films 31. The tunneling insulating film 33 is provided at each silicon pillar 20; and the configuration of the tunneling insulating film 33 is a band configuration that extends in the Z-direction and has the X-direction as the thickness direction and the Y-direction as the width direction.

On the other hand, a blocking insulating film 34 is provided between the floating gate electrode film 31 and the control gate electrode film 21. The blocking insulating film 34 is, for example, a three-layer film in which a silicon nitride layer 35, a silicon oxide layer 36, and a silicon nitride layer 37 are stacked in this order from the floating gate electrode film 31 side toward the control gate electrode film 21 side. The silicon nitride layer 35 is formed around the floating gate electrode film 31 to cover an upper surface 31a and a lower surface 31b of the floating gate electrode film 31. The silicon oxide layer 36 and the silicon nitride layer 37 are formed around the control gate electrode film 21 to cover an upper surface 21a and a lower surface 21b of the control gate electrode film 21.

Although the tunneling insulating film 33 normally is insulative, the tunneling insulating film 33 is a film in which a tunneling current flows when a voltage within the range of the drive voltage of the semiconductor memory device 1 is applied. The blocking insulating film 34 is a film in which a current substantially does not flow even when a voltage within the range of the drive voltage of the semiconductor memory device 1 is applied. The equivalent oxide thickness (EOT) of the tunneling insulating film 33 is thicker than the equivalent oxide thickness of the blocking insulating film 34; and the dielectric constant of the tunneling insulating film 33 is lower than the dielectric constant of the blocking insulating film.

In the peripheral circuit region Rc as shown in FIG. 2, a source region 40s and a drain region 40d are formed in the silicon substrate 10 to be separated from each other. The region between the source region 40s and the drain region 40d is a channel region 40c. A gate insulating film 41 (a fourth insulating film) that is made of, for example, silicon oxide is provided on the silicon substrate 10 in the region directly above the channel region 40c; and a conductive layer 42 that is made of, for example, polysilicon and an interconnect layer 43 that is made of, for example, tungsten are stacked in this order on the gate insulating film 41. A gate electrode 45 is formed of the conductive layer 42 and the interconnect layer 43. A transistor 46 includes the source region 40s, the drain region 40d, the channel region 40c, the gate insulating film 41, and the gate electrode 45. The transistor 46 is included in the peripheral circuit.

As described below, the insulating film 11 that is in the memory cell region Rm and the gate insulating film 41 that is in the peripheral circuit region Rc are formed by dividing the same silicon oxide film; the conductive layer 12 that is in the memory cell region Rm and the conductive layer 42 that is in the peripheral circuit region Rc are formed by dividing the same polysilicon layer; and the interconnect layer 13 that is in the memory cell region Rm and the interconnect layer 43 that is in the peripheral circuit region Rc are formed by dividing the same tungsten layer.

A method for manufacturing the semiconductor memory device according to the embodiment will now be described.

FIG. 5A to FIG. 17B are plan views and cross-sectional views showing the method for manufacturing the semiconductor memory device according to the embodiment.

Only the memory cell region Rm is shown in FIG. 5A to FIG. 17B.

First, as shown in FIG. 1 and FIG. 2, the channel region 40c, the source region 40s, and the drain region 40d are formed in the upper layer portion of the silicon substrate 10 in the peripheral circuit region Rc. Then, a silicon oxide film is formed on the silicon substrate 10 in both the memory cell region Rm and the peripheral circuit region Rc. Therefore, in the peripheral circuit region Rc, a relatively thin silicon oxide film is formed in the low breakdown voltage transistor (LV Tr) region; and a relatively thick silicon oxide film is formed in the high breakdown voltage transistor (HV Tr) region. Also, a relatively thick silicon oxide film is formed in the memory cell region Rm.

Then, a polysilicon layer is formed on the entire surface. STI (Shallow Trench Isolation) is formed in the upper layer portion of the silicon substrate 10 in the peripheral circuit region Rc using an appropriate mask (not shown). Then, a tungsten layer is formed. Then, a polysilicon layer and a silicon oxide film are formed only in the memory cell region Rm. Then, these layers are patterned by RIE (Reactive Ion Etching).

Thereby, the insulating film 11, the conductive layer 12, the interconnect layer 13, the conductive layer 14, and the insulating film 17 are formed for each block in the memory cell region Rm. The cell source line 15 is formed of the stacked body made of the conductive layer 12, the interconnect layer 13, and the conductive layer 14. Erasing is possible by block unit by forming the cell source line 15 to be divided for each block. On the other hand, the gate insulating film 41, the conductive layer 42, and the interconnect layer 43 are formed in the peripheral circuit region Rc. The gate electrode 45 is formed of the stacked body made of the conductive layer 42 and the interconnect layer 43. Thereby, the transistor 46 is formed in the peripheral circuit region Rc.

Then, as shown in FIGS. 5A and 5B, a silicon oxide film 51 and a silicon nitride film 52 are stacked alternately on the insulating film 17 (referring to FIG. 2) in the memory cell region Rm. Thereby, the stacked body 25 is formed. At this time, because the gate length (the total thickness of the control gate electrode film 21 and the blocking insulating film provided around the control gate electrode film 21) on the electrode side is longer than the gate length (the total thickness of the floating gate electrode film 31 and the blocking insulating film provided around the floating gate electrode film 31) on the channel side, the film thickness ratio of the silicon oxide film 51 and the silicon nitride film 52 that are stacked is adjusted according to the film thickness of the blocking films filled from both sides. FIG. 5A is a cross-sectional view; and FIG. 5B is a top view. This is similar for the following drawings as well.

Continuing as shown in FIGS. 6A and 6B, the hard mask 26 that is made of, for example, silicon nitride is formed on the stacked body 25. Then, the hard mask 26 is patterned; and anisotropic etching such as RIE, etc., of the stacked body 25 is performed using the patterned hard mask 26 as a mask. Thereby, multiple trenches 53 are made in the stacked body 25 to extend in the Y-direction. The trenches 53 pierce the stacked body 25.

Then, as shown in FIGS. 7A and 7B, the silicon nitride films 52 are recessed by performing wet etching via the trench 53. Thereby, the exposed surfaces of the silicon nitride films 52 recede at the inner surface of the trench 53 to make recesses 54 that extend in the Y-direction. Then, oxidation treatment is performed by SPA, etc. Thereby, the exposed surfaces of the silicon nitride films 52 at the inner surface of the trench 53 are covered with a thin silicon oxide layer 50.

Figure 8B:
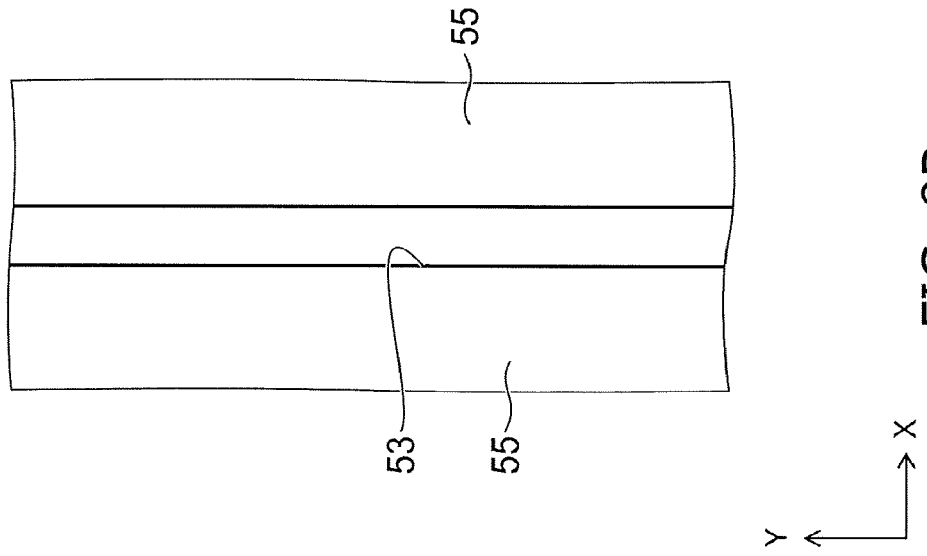
Figure 8A:
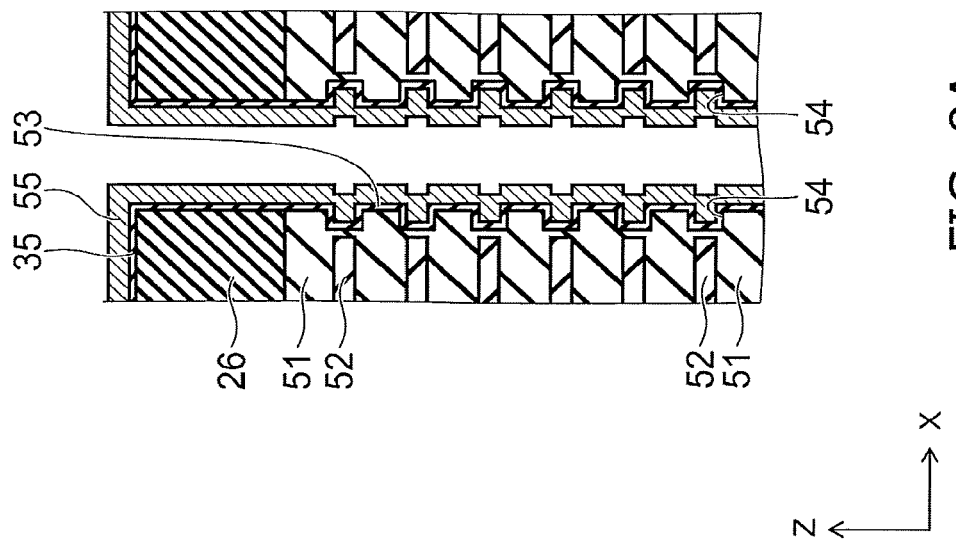

Continuing as shown in FIGS. 8A and 8B, the silicon nitride layer 35 is formed on the entire surface. Then, a polysilicon film 55 is formed on the entire surface. The silicon nitride layer 35 and the polysilicon film 55 also are formed on the inner surface of the trench 53 to enter the recesses 54.

Figure 9B:
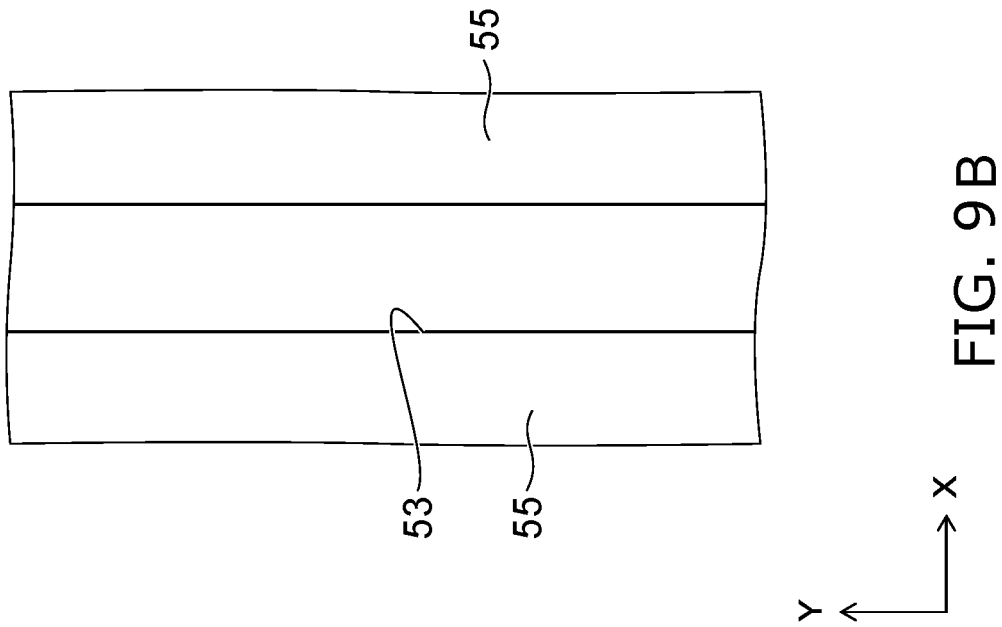
Figure 9A:
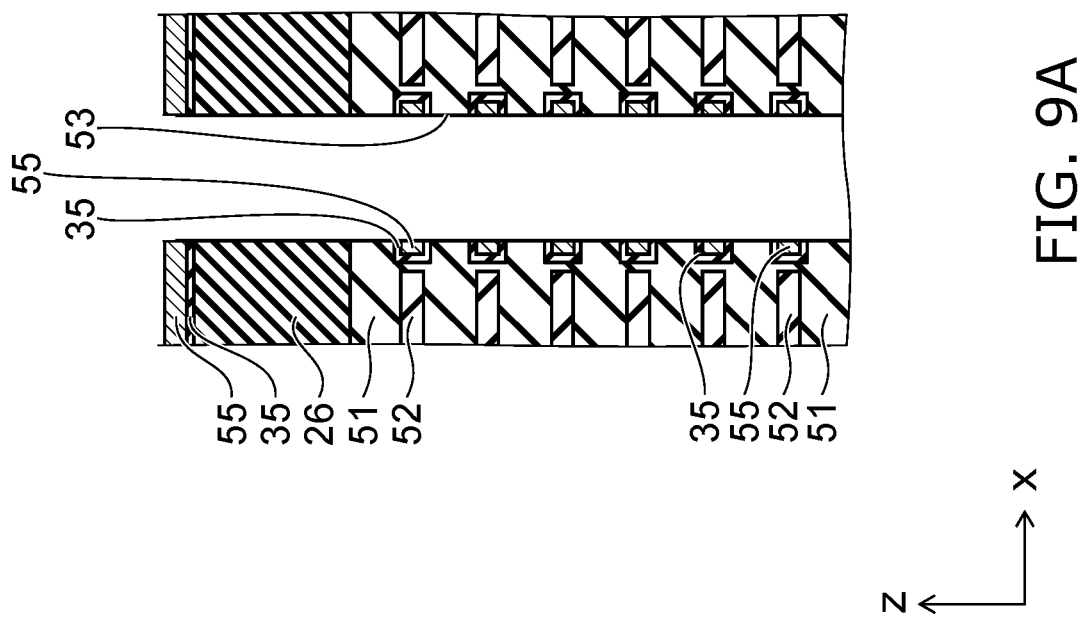

Then, as shown in FIGS. 9A and 9B, by performing anisotropic etching such as RIE, etc., along the trench 53, the polysilicon film 55 and the silicon nitride layer 35 are selectively removed to remain inside the recesses 54; and the polysilicon films 55 that remain inside the recesses 54 adjacent to each other in the Z-direction are separated from each other. Similarly, the silicon nitride layers 35 that remain inside the recesses 54 adjacent to each other in the Z-direction also are separated from each other.

Continuing as shown in FIGS. 10A and 10B, the tunneling insulating film 33, a polysilicon film 56, and an insulating film 57 are deposited in this order.

Figure 11B:
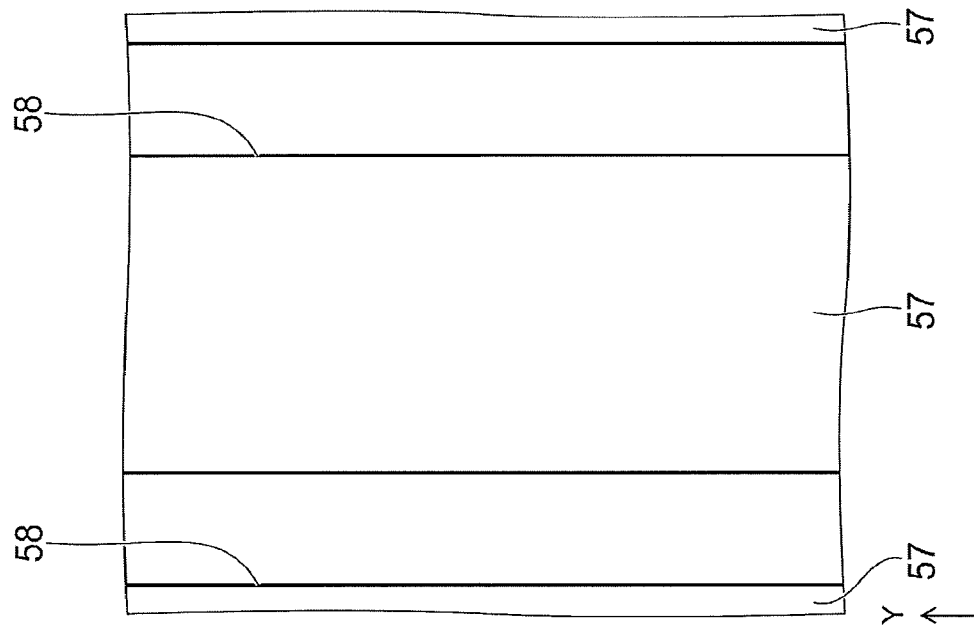
Figure 11A:
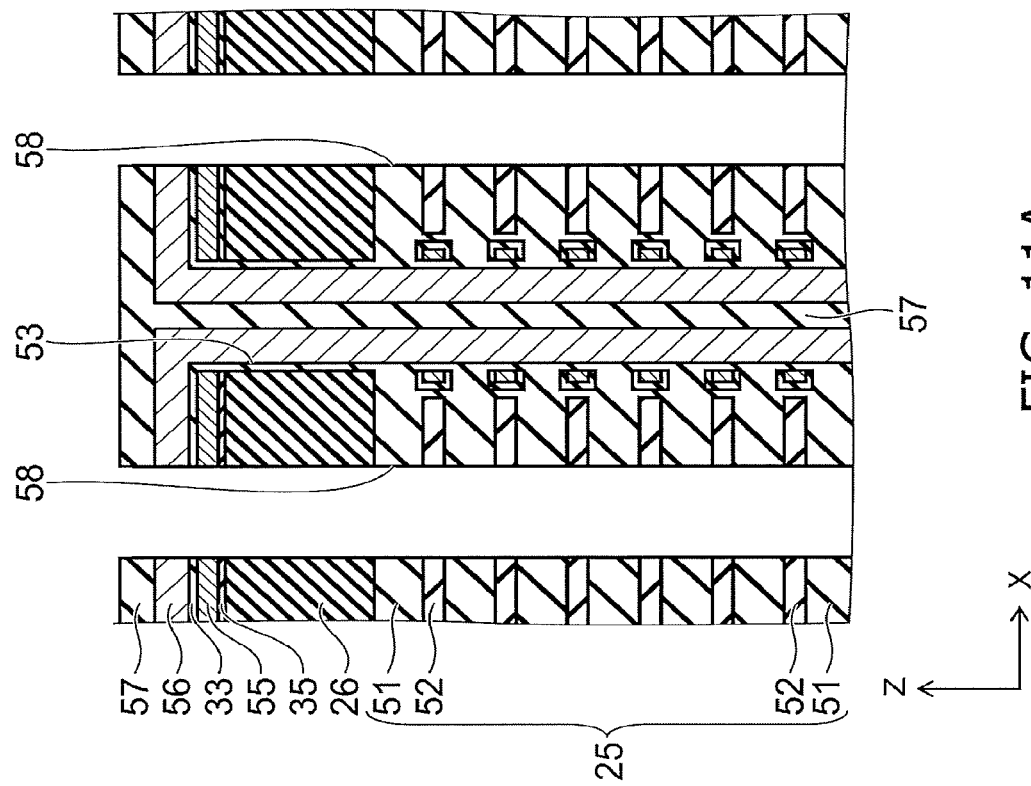

Then, as shown in FIGS. 11A and 11B, trenches 58 are made in the stacked body 25 and the stacked body stacked above the stacked body 25 to extend in the Y-direction between the trenches 53. Thereby, the trenches 53 and the trenches 58 are arranged alternately along the X-direction.

Figure 12B:
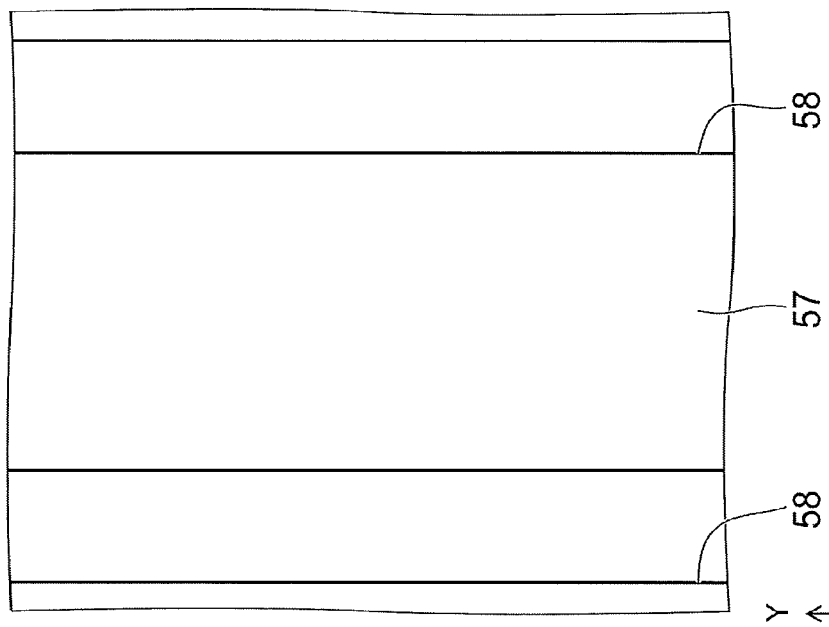
Figure 12A:
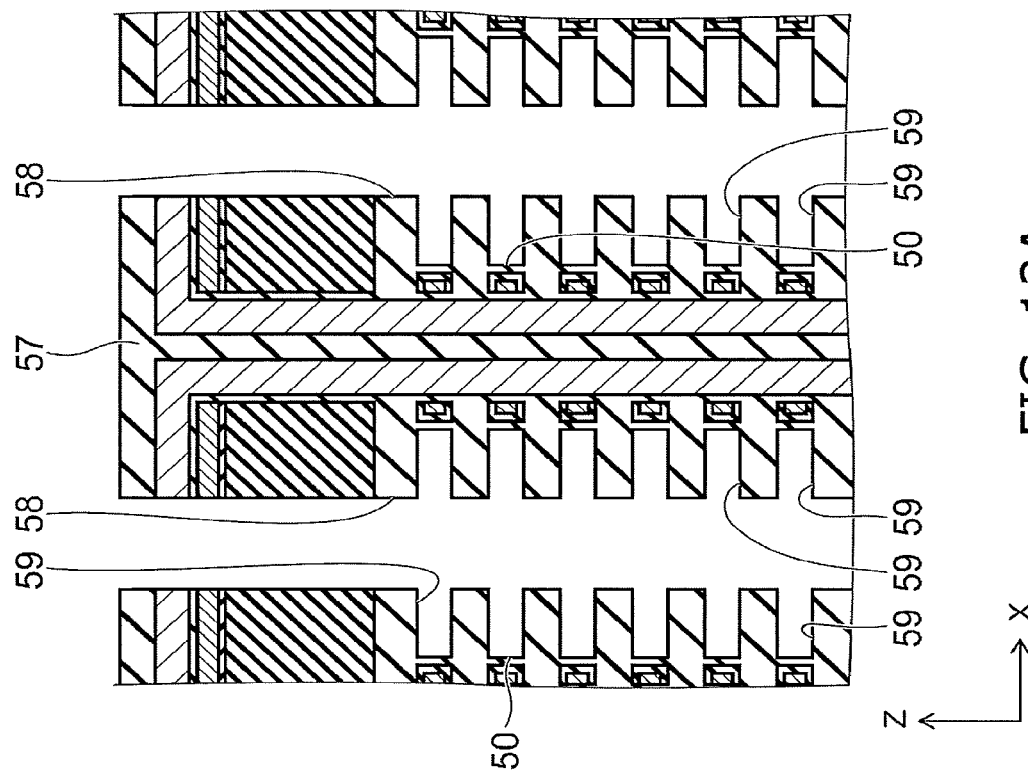

Continuing as shown in FIGS. 12A and 12B, the silicon nitride films 52 are recessed by performing wet etching using hot phosphoric acid via the trench 58. The recessing is stopped by the silicon oxide layer 50 that is exposed at the back surfaces of recesses 59. Thereby, the silicon nitride films 52 are removed; and the recesses 59 are made in the inner surface of the trench 58 to extend in the Y-direction. At this time, the silicon nitride layer 35 is not damaged because the silicon nitride layer 35 is protected by the silicon oxide layer 50.

Then, as shown in FIGS. 13A and 13B, the silicon oxide layer 50 that is exposed at the back surfaces of the recesses 59 is removed. Thereby, the silicon nitride layers 35 are exposed at the back surfaces of the recesses 59. Then, the silicon oxide layer 36 and the silicon nitride layer 37 are formed on the inner surface of the trench 58. As a result, as shown in FIG. 3, the blocking insulating film 34 is formed of the silicon nitride layer 35, the silicon oxide layer 36, and the silicon nitride layer 37. Then, a tungsten film 61 is formed on the entire surface by, for example, CVD (Chemical Vapor Deposition). The silicon oxide layer 36, the silicon nitride layer 37, and the tungsten film 61 also enter the recesses 59 via the trench 58.

Figure 14B:
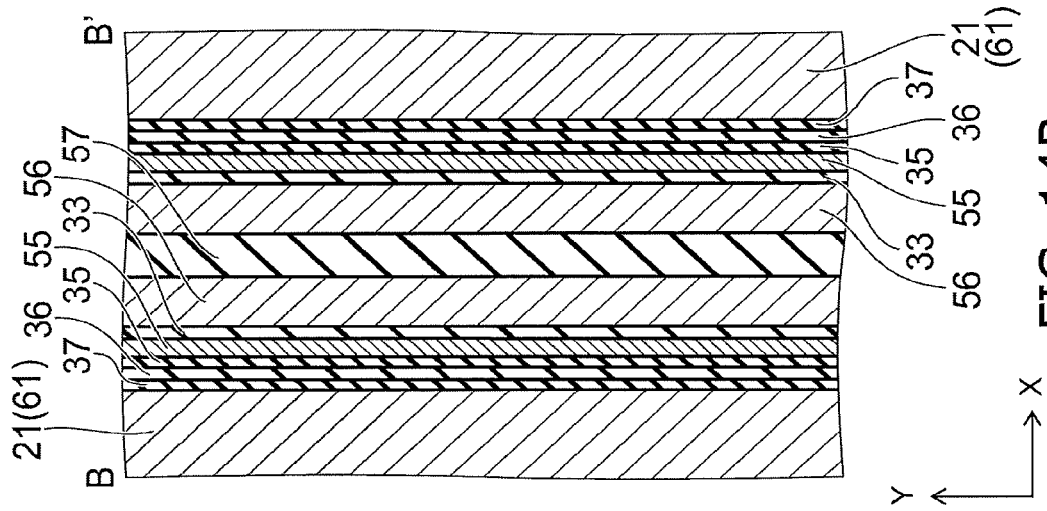
Figure 14A:
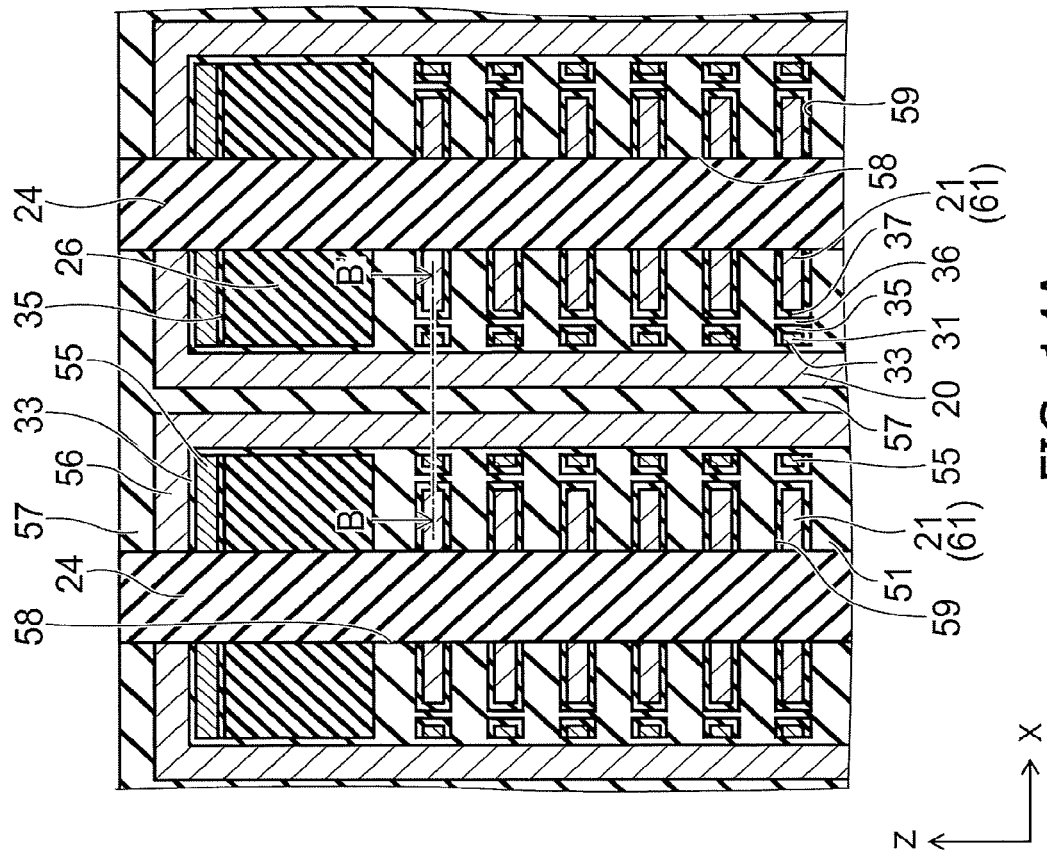

Continuing as shown in FIGS. 14A and 14B, the tungsten film 61 is selectively removed by performing anisotropic etching such as RIE, etc. Thereby, the tungsten film 61 is caused to remain inside the recesses 59; and the tungsten films 61 that remain inside the recesses 59 adjacent to each other in the Z-direction are separated from each other. As a result, the control gate electrode films 21 that are made of the tungsten films 61 are formed inside the recesses 59. Subsequently, the inter-layer insulating film 24 is filled into the trench 58; and the upper surface of the inter-layer insulating film 24 is planarized. FIG. 14B is a cross-sectional view along line B-B' shown in FIG. 14A.

Figure 15B:
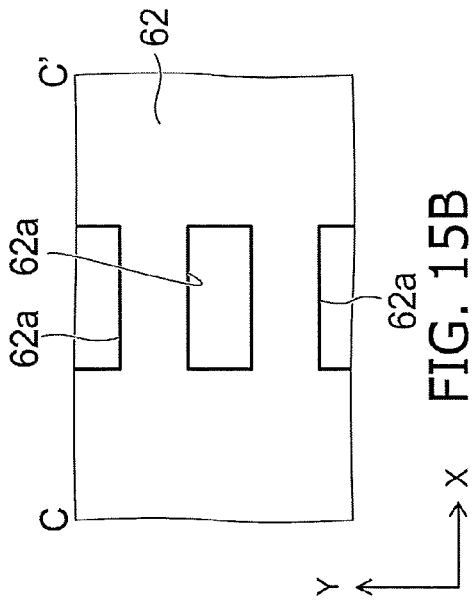
Figure 15C:
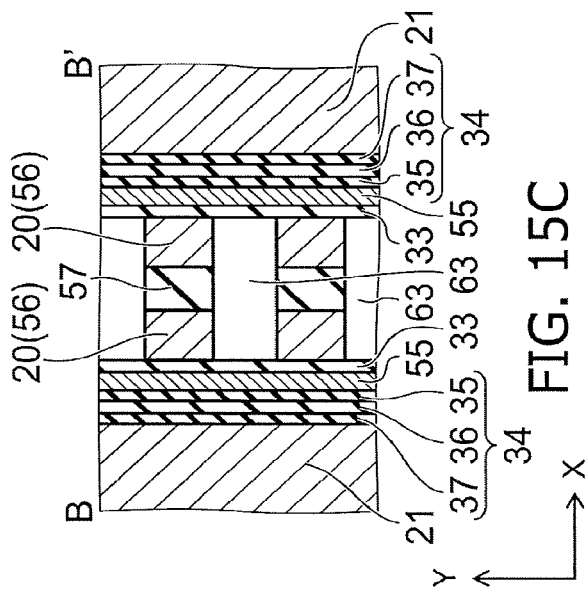
Figure 15A:
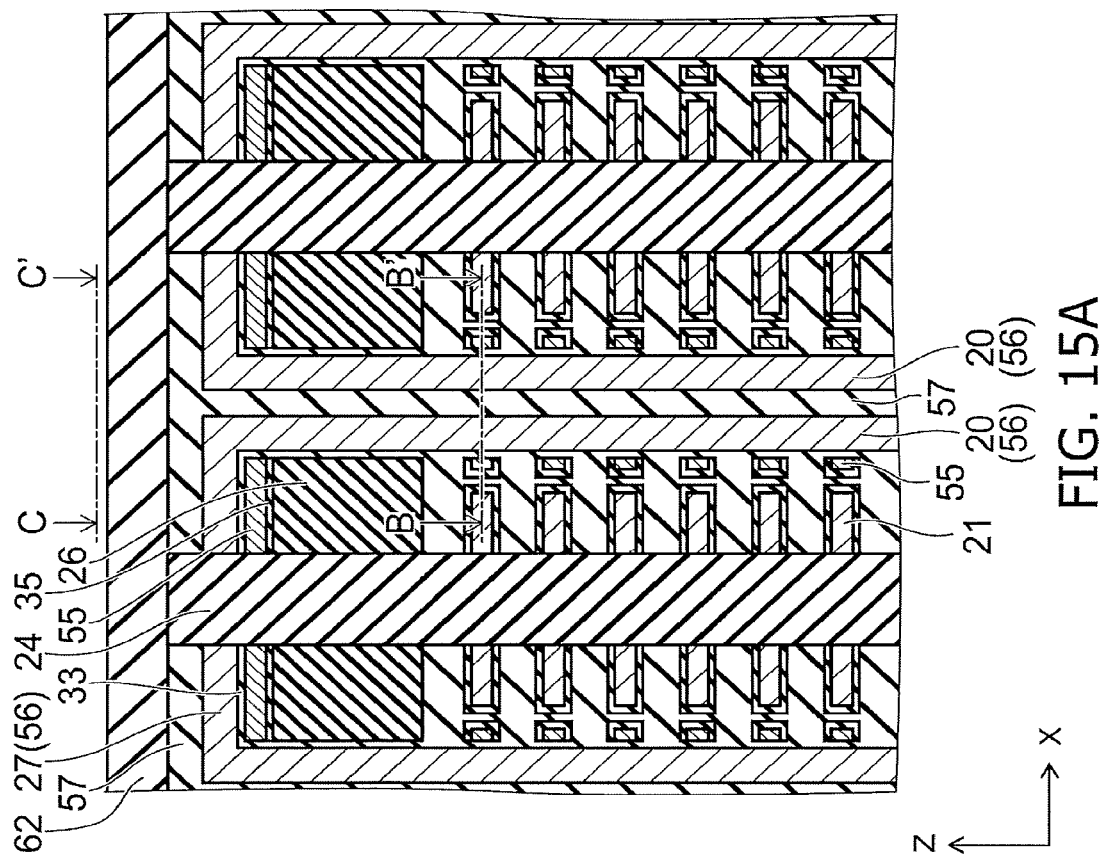

Then, as shown in FIGS. 15A to 15C, a hard mask 62 is formed in which openings 62a are arranged in a matrix configuration along the X-direction and the Y-direction. The configuration of each of the openings 62a is a rectangle with the X-direction as the longitudinal direction; and the openings 62a are arranged intermittently along the Y-direction in the region directly above the polysilicon films 56 and the insulating film 57 between the polysilicon films 56 but are not disposed in the region directly above the inter-layer insulating film 24. Then, the polysilicon film 56 and the insulating film 57 are divided along the Y-direction by performing anisotropic etching such as RIE, etc., using the hard mask 62 and the hard mask 26 as a mask. Thereby, a through-hole 63 is made in the polysilicon film 56 and the insulating film 57 in the region directly under the opening 62a; the portion of the polysilicon film 56 that is formed on the hard mask 26 becomes the interconnect 27; and the portion of the polysilicon film 56 that is divided by the through-hole 63 becomes the silicon pillar 20. FIG. 15B is a plan view along line C-C' shown in FIG. 15A; and FIG. 15C is a cross-sectional view along line B-B' shown in FIG. 15A.

Figure 16:
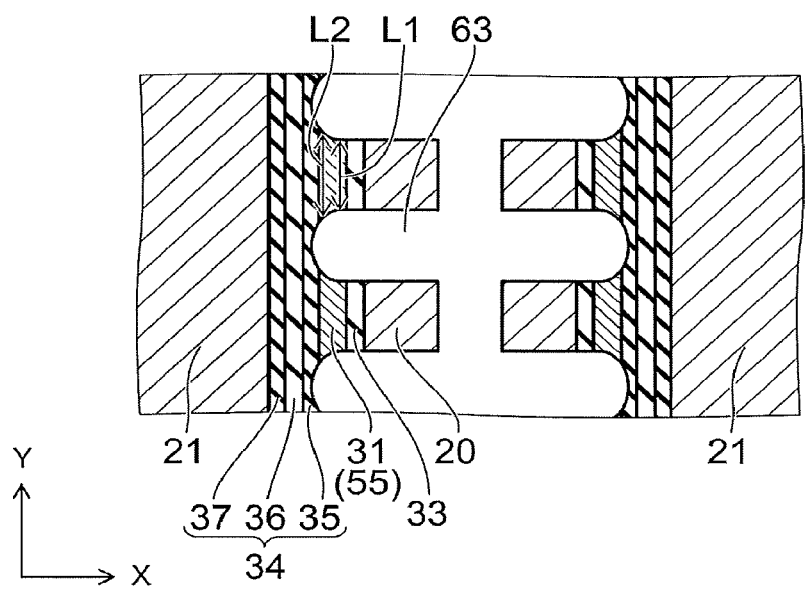

Continuing as shown in FIG. 16, the tunneling insulating film 33 and the polysilicon films 55 are selectively removed by performing isotropic etching such as CDE (Chemical Dry Etching), wet etching, etc., via the through-hole 63. Thereby, the tunneling insulating film 33 and the polysilicon films 55 are divided along the Y-direction. The insulating film 57 (see FIG. 15A) also is removed. As a result, the floating gate electrode films 31 are formed of the polysilicon films 55. At this time, because the polysilicon films 55 are etched from the silicon pillar 20 side, the length L1 in the Y-direction of the end portion of the floating gate electrode film 31 on the silicon pillar 20 side is shorter than the length L2 in the Y-direction of the end portion of the floating gate electrode film 31 on the control gate electrode film 21 side. On the other hand, at this time, the inter-layer insulating film 24 remains without being removed.

Figures 17A, 17B:
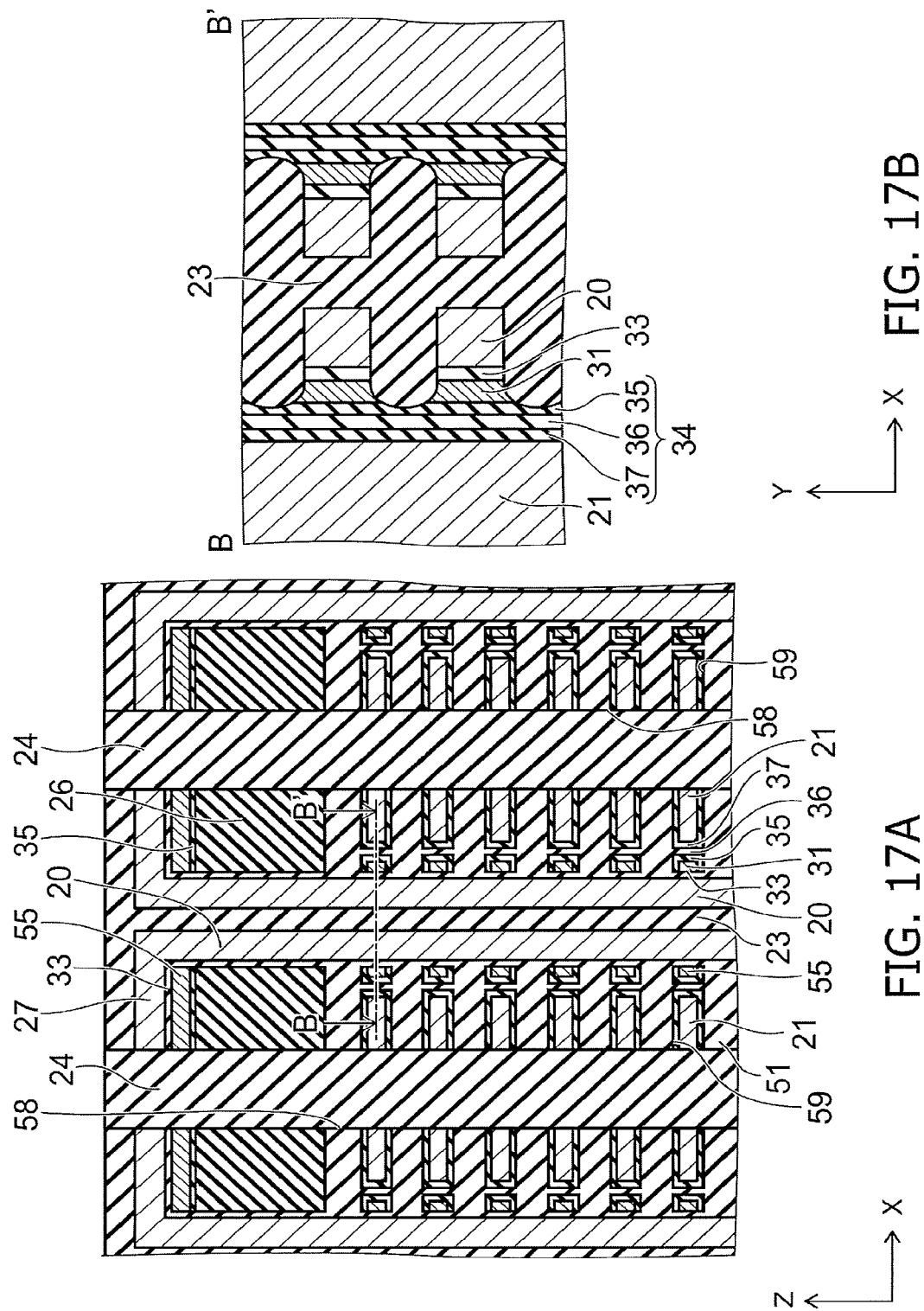

Then, as shown in FIGS. 17A and 17B, the inter-layer insulating film 23 is deposited on the entire surface. The inter-layer insulating film 23 is filled also inside the through-hole 63. The silicon oxide film 51 also becomes a portion of the inter-layer insulating film 23.

Continuing as shown in FIG. 1 and FIG. 2, the vias 28, the vias 38, the bit lines 29, and the word lines 39 are formed. Thus, the semiconductor memory device 1 according to the embodiment is manufactured.

Effects of the embodiment will now be described.

In the embodiment, the floating gate electrode films 31 that are made of polysilicon are provided as charge storage units. Therefore, the data retention characteristics of the memory cells are good; and the erasing operation is fast because the charge that is stored in the floating gate electrode films 31 can be erased by moving electrons instead of holes. The data retention characteristics are even better because the floating gate electrode films 31 are separated from each other.

In the embodiment, because the blocking insulating film 34 is a three-layer film made of the silicon nitride layer 35, the silicon oxide layer 36, and the silicon nitride layer 37, the coupling ratio can be ensured while suppressing the leakage current. Also, the silicon nitride layer 35 is formed from the silicon pillar 20 side in the process shown in FIGS. 8A and 8B; and the silicon oxide layer 36 and the silicon nitride layer 37 are formed from the control gate electrode film 21 side in the process shown in FIGS. 13A and 13B.

Thus, by dividing the three-layer film of the blocking insulating film 34 into two and forming the three-layer film from both sides, compared to the case of forming from only one side, the thickness of the blocking insulating film 34 can be distributed on the two X-direction sides of the floating gate electrode film 31; and the thickness in the Z-direction as an entirety can be reduced. Thereby, the height in the Z-direction of the recesses 54 (referring to FIGS. 8A and 8B) and the recesses 59 (referring to FIGS. 13A and 13B) can be reduced; the bit density of the memory cells in the Z-direction can be increased; and the aspect ratio can be reduced.

In the embodiment, the blocking insulating film 34 is divided for each of the control gate electrode films 21 along the Z-direction. Thereby, the electrons that are stored in the floating gate electrode film 31 can be prevented from propagating through the blocking insulating film 34 and leaking. As a result, the data retention characteristics of the memory cells are good.

In the embodiment, as shown in FIG. 4, the configuration of the floating gate electrode film 31 is a fan-like shape that is wider on the control gate electrode film 21 side. Thereby, the IPD capacitance between the floating gate electrode film 31 and the control gate electrode film 21 can be large; and the coupling ratio can be large.

Although an example is illustrated in the embodiment in which the blocking insulating film 34 is a three-layer film, this is not limited thereto. The layers of the blocking insulating film 34 are not limited to the silicon oxide layer (the $SiO_2$ layer) and the silicon nitride layers (the $Si_3N_4$ layers) and may be a high dielectric constant layer such as, for example, an $Al_2O_3$ layer, a MgO layer, a SrO layer, a SiN layer, a BaO layer, a TiO layer, a $Ta_2O_5$ layer, a $BaTiO_3$ layer, a BaZrO layer, a $ZrO_2$ layer, a $Y_2O_3$ layer, a ZrSiO layer, a HfAlO layer, a HfSiO layer, a $La_2O_3$ layer, a LaAlO layer, etc.

Although an example is illustrated in the embodiment in which the floating gate electrode film 31 is formed of polysilicon, the floating gate electrode film 31 is not limited thereto and may be formed of, for example, a metal silicide or a metal.

Although an example is illustrated in the embodiment in which the control gate electrode film 21 is formed of tungsten, the control gate electrode film 21 is not limited thereto and may be formed of, for example, a metal silicide by filling a polysilicon film and subsequently siliciding the polysilicon film.

In the process shown in FIGS. 5A and 5B, the silicon nitride films 52 of the lowermost layer and the uppermost layer may be formed to be thicker than the other silicon nitride films 52. Thereby, the film thicknesses of the selection gate electrode films that are formed below and above the control gate electrode films 21 can be thicker than those of the control gate electrode films 21. As a result, a selection transistor that has a gate length longer than that of the memory cell transistor can be formed.

Several layers of the control gate electrode films 21 provided at the upper portion of the stacked body 25 may be shorted to each other to be used as the selection gate electrode film; and several layers of the control gate electrode films 21 provided at the lower portion of the stacked body 25 may be shorted to each other to be used as the selection gate electrode film. Thereby, a selection transistor that has a gate length longer than that of the memory cell transistor can be formed.

Modification of First Embodiment

A modification of the embodiment will now be described.

Figure 18:
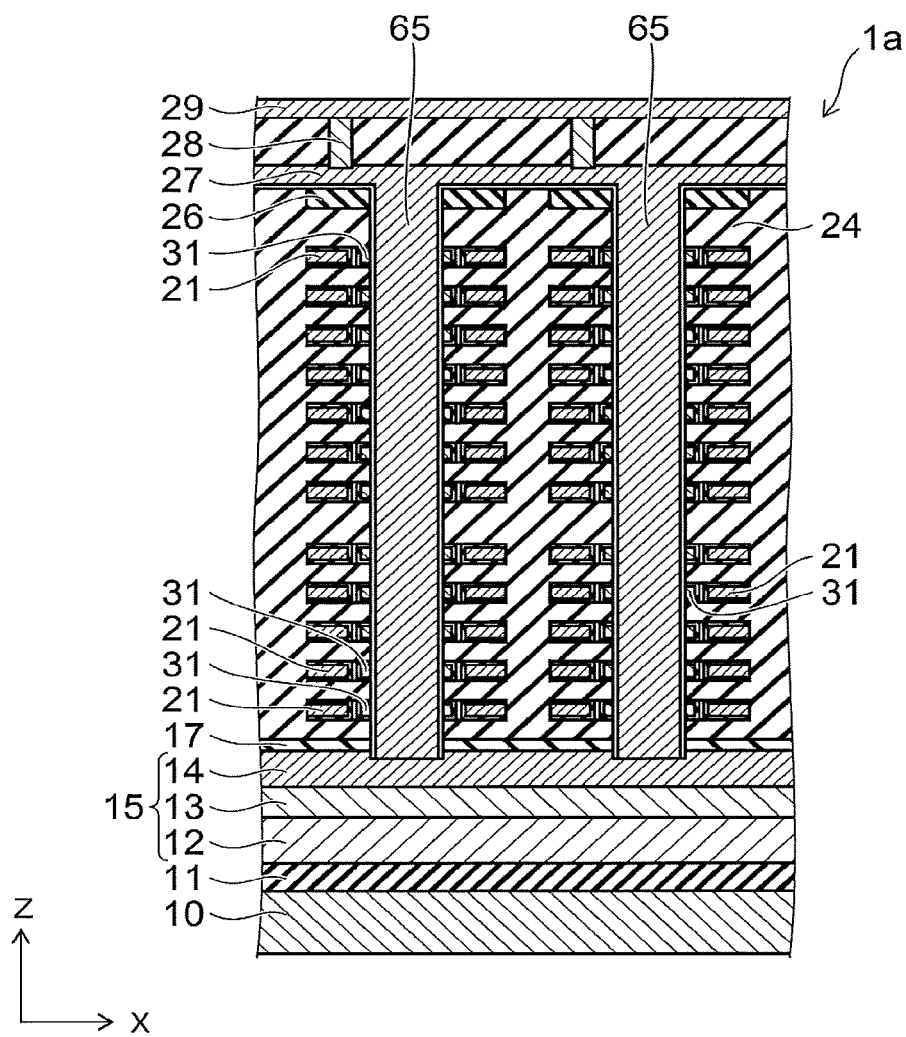
FIG. 18 is a cross-sectional view showing a semiconductor memory device according to a modification of the first embodiment.

FIG. 18 is a cross-sectional view showing a semiconductor memory device according to the modification.

In the semiconductor memory device 1a according to the modification as shown in FIG. 18, one wide silicon pillar 65 is provided between two floating gate electrode films 31 adjacent to each other in the X-direction. In other words, the inter-layer insulating film 24 is not provided between the two silicon pillars 20 belonging to each of the sets 22; and the two silicon pillars 20 are formed as one body.

In the semiconductor memory device 1a according to the modification, the two X-direction side portions of the wide silicon pillar 65 are used as distinct channels. Otherwise, the configuration, the manufacturing method, and the effects of the modification are similar to those of the first embodiment described above.

Second Embodiment

A second embodiment will now be described.

Figure 19:
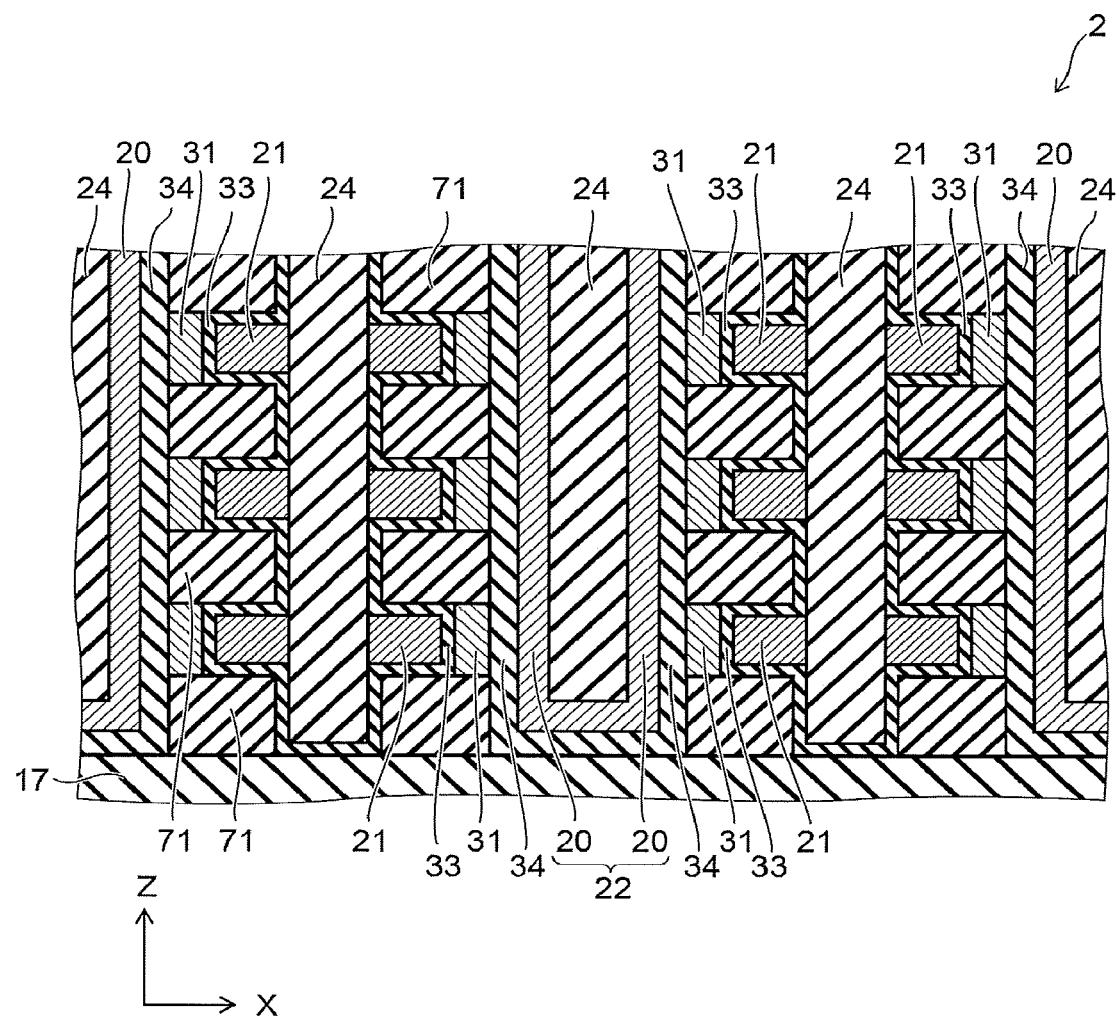
FIG. 19 is a cross-sectional view showing a semiconductor memory device according to a second embodiment.

FIG. 19 is a cross-sectional view showing a semiconductor memory device according to the embodiment.

As shown in FIG. 19, the semiconductor memory device 2 according to the embodiment differs from the semiconductor memory device 1 (referring to FIG. 1 to FIG. 4) according to the first embodiment described above in that the disposition of the tunneling insulating film 33 and the blocking insulating film 34 is reversed.

In other words, in the semiconductor memory device 2, the blocking insulating film 34 is disposed between the silicon pillar 20 and the floating gate electrode films 31; and the tunneling insulating film 33 is disposed between the floating gate electrode films 31 and the control gate electrode films 21. Therefore, the components included in the memory cell are arranged in the order of silicon pillar 20-blocking insulating film 34-floating gate electrode film 31-tunneling insulating film 33-control gate electrode film 21.

More specifically, in the semiconductor memory device 2, silicon oxide films 71 are arranged to be separated from each other along the Z-direction; and the floating gate electrode films 31 and the control gate electrode films 21 are provided in the spaces between the mutually-adjacent silicon oxide films 71. Also, the tunneling insulating film 33 is disposed to cover the upper surface and the lower surface of the control gate electrode film 21 and the side surface of the control gate electrode film 31 on the floating gate electrode film 31 side. On the other hand, the blocking insulating film 34 is disposed linearly along the side surface of the silicon pillar 20.

Similarly to the first embodiment, the blocking insulating film 34 may be a multilayered film, e.g., a three-layer film. However, the blocking insulating film 34 is not subdivided between the silicon pillar 20 side and the control gate electrode film 21 side; and the entire blocking insulating film 34 is disposed on the silicon pillar 20 side.

In the semiconductor memory device 2, the lower end portions of the two silicon pillars 20 belonging to the set 22 are connected to each other; and the cell source line 15 is not provided. A source line (not shown) is provided above the stacked body. In other words, the semiconductor memory device 2 is a U-shaped pillar type stacked memory device. Otherwise, the configuration of the embodiment is similar to that of the first embodiment described above.

The basic operations and the read-out method of the semiconductor memory device 2 are similar to those of a normal NAND flash memory; and the polarity of the voltage applied between the silicon pillar 20 and the control gate electrode film 21 in the programming operation and the erasing operation are the reverse of those of a normal NAND flash memory. Thereby, the charge is caused to move into and out of the silicon pillar 20 from the control gate electrode film 21.

A method for manufacturing the semiconductor memory device according to the embodiment will now be described.

FIG. 20A to FIG. 30C are plan views and cross-sectional views showing the method for manufacturing the semiconductor memory device according to the embodiment.

First, as shown in FIGS. 20A and 20B, the insulating film 17 that is made of silicon oxide is formed on the silicon substrate 10 (referring to FIG. 2); and subsequently, a stacked body 73 is formed by alternately stacking the silicon oxide film 71 and a poly silicon film 72. The polysilicon film 72 may be doped with boron (B), may be doped with phosphorus (P), or may not be doped. FIG. 20A is a cross-sectional view; and FIG. 20B is a top view. This is similar for the following drawings as well.

Figure 21B:
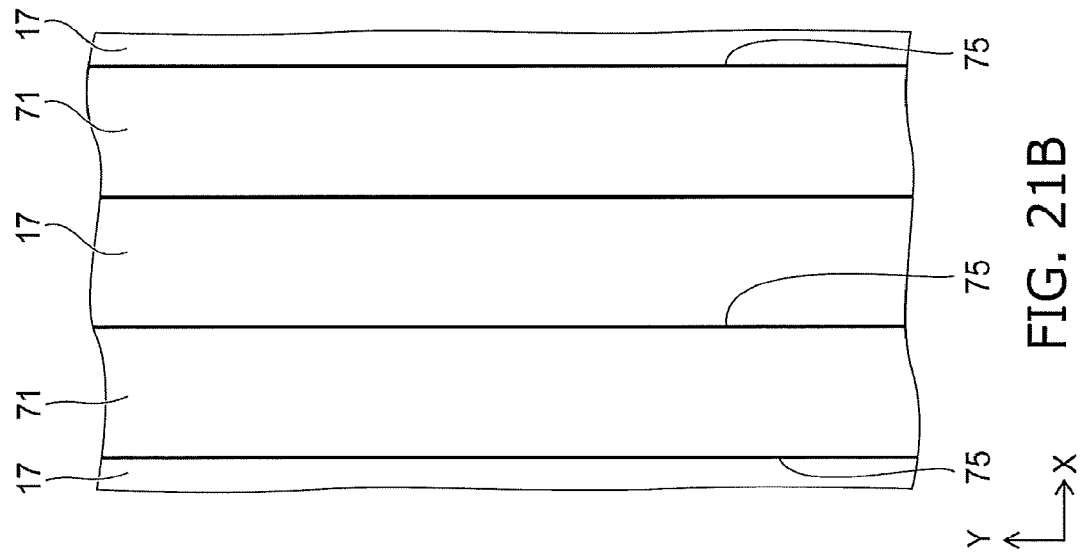
Figure 21A:
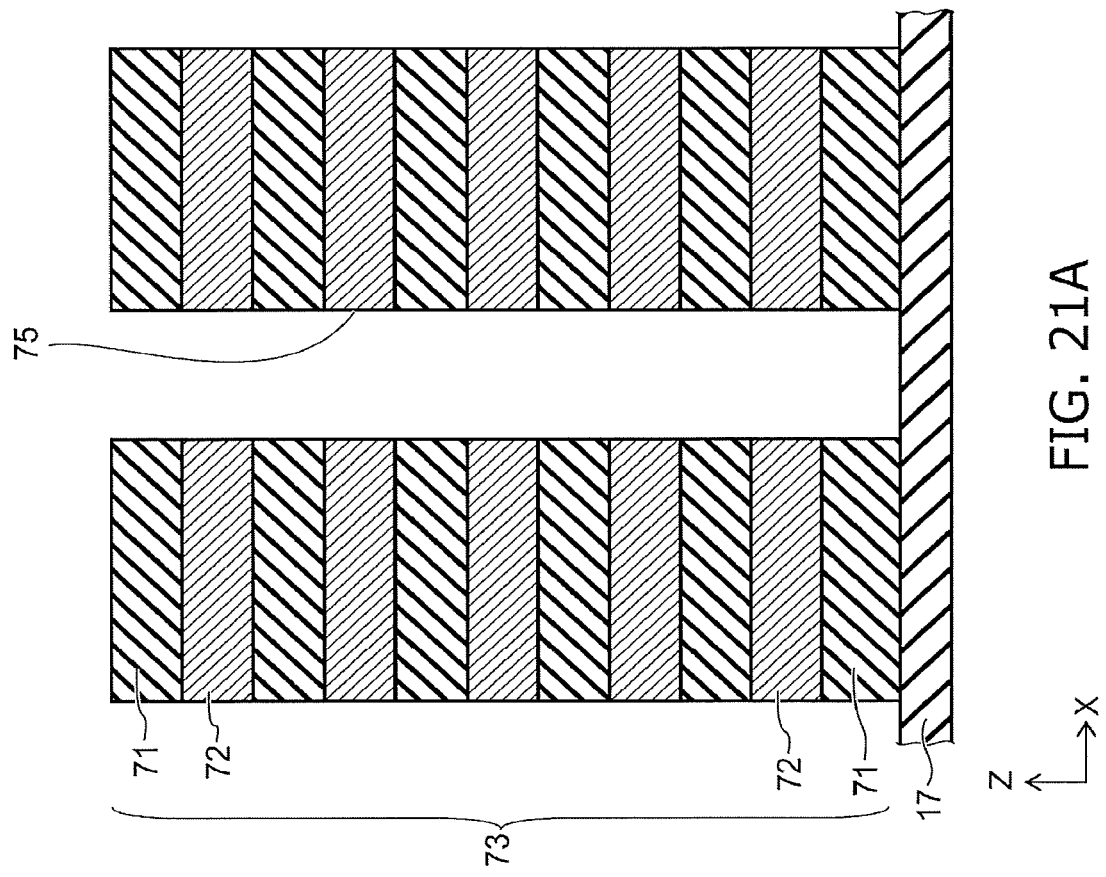

Then, as shown in FIGS. 21A and 21B, multiple trenches 75 are made in the stacked body 73 to extend in the Y-direction by forming a hard mask (not shown) on the stacked body 73, patterning by lithography, and performing anisotropic etching such as RIE, etc., using the patterned hard mask as a mask. The trenches 75 pierce the stacked body 73 in the Z-direction but do not pierce the insulating film 17.

Continuing as shown in FIGS. 22A and 22B, on the inner surface of the trench 75, the blocking insulating film 34 is formed; and subsequently, a polysilicon film 77 is formed. The blocking insulating film 34 and the polysilicon film 77 are formed on the side surface of the trench 75 and on the bottom surface of the trench 75 to be folded back into a U-shaped as viewed from the Y-direction. Accordingly, the relationship between the width of the trench 75 and the film thicknesses of the blocking insulating film 34 and the polysilicon film 77 is set such that such folding back is possible. Then, the inter-layer insulating film 24 is filled into the trench 75 by depositing silicon oxide.

Then, as shown in FIGS. 23A and 23B, trenches 78 are made in the portion of the stacked body 73 between the trenches 75 to extend in the Y-direction by forming a hard mask (not shown) on the stacked body 73, patterning by lithography, and performing anisotropic etching such as RIE, etc., using the patterned hard mask as a mask. The trenches 75 and the trenches 78 are arranged alternately along the X-direction.

Continuing as shown in FIGS. 24A and 24B, wet etching is performed using, for example, TMY (choline aqueous solution). Thereby, the polysilicon films 72 are etched isotropically via the trench 78; and the exposed surfaces of the polysilicon films 72 at the inner surface of the trench 78 are caused to recede. Thereby, recesses 79 are made at the inner surface of the trench 78.

Then, as shown in FIGS. 25A and 25B, the tunneling insulating film 33 is formed by depositing silicon oxide on the inner surface of the trench 78. At this time, the tunneling insulating film 33 is formed also on the inner surfaces of the recesses 79 to contact the polysilicon films 72. The tunneling insulating film 33 may be formed by thermal oxidation of the exposed surfaces of the polysilicon films 72.

Continuing as shown in FIGS. 26A and 26B, a tungsten film 81 is formed inside the trench 78 by, for example, depositing tungsten by CVD. At this time, the tungsten film 81 is filled also into the recesses 79.

Then, as shown in FIGS. 27A and 27B, the portion of the tungsten film 81 that is not filled into the recesses 79 is removed by etching the tungsten film 81. Thereby, the tungsten films 81 that remain inside the recesses 79 are separated from each other between the recesses 79 to become the control gate electrode films 21. Then, the inter-layer insulating film 24 is filled into the trench 78; and the upper surface of the inter-layer insulating film 24 is planarized. Instead of tungsten, silicon may be deposited in the process shown in FIGS. 26A and 26B; and the silicon may be silicided in this process. Thereby, the control gate electrode films 21 are formed of a metal silicide.

Figure 28C:
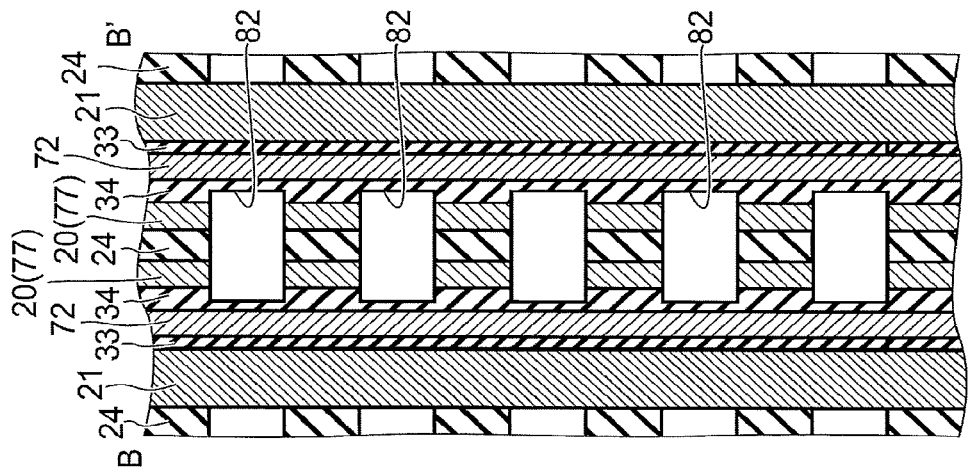
Figure 28B:
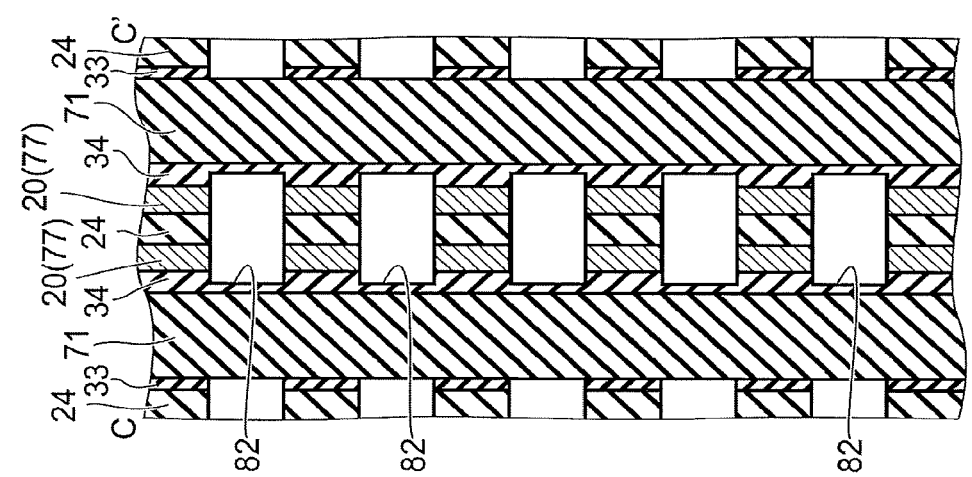
Figure 28A:
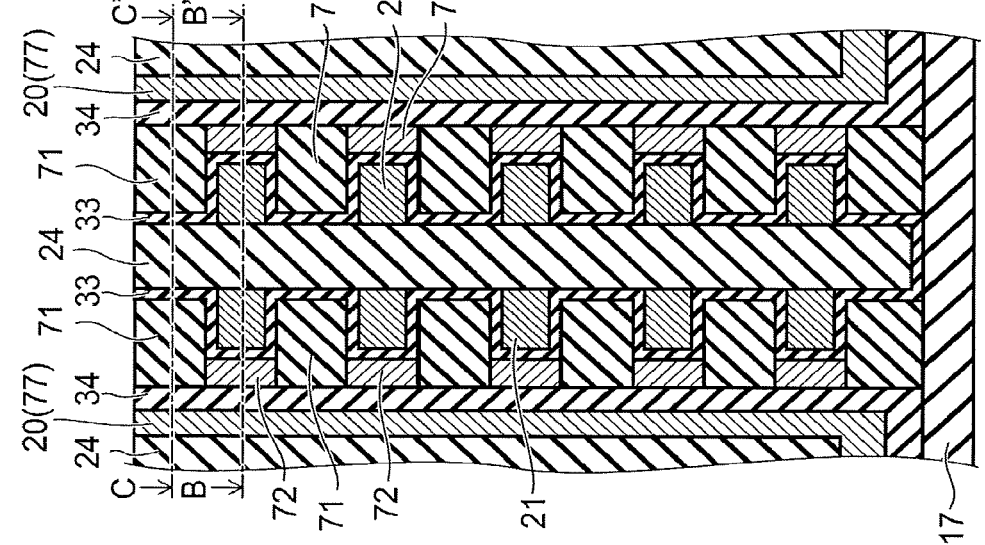

Continuing as shown in FIGS. 28A to 28C, through-holes 82 are made in the trench 75 by selectively removing the inter-layer insulating film 24, the polysilicon film 77, and the blocking insulating film 34 by performing anisotropic etching using an appropriate mask. The polysilicon film 77 is divided periodically along the Y-direction by the through-holes 82 to become the silicon pillars 20. FIG. 28A is a cross-sectional view; FIG. 28B is a cross-sectional view along line C-C' shown in FIG. 28A; and FIG. 28C is a cross-sectional view along line B-B' shown in FIG. 28A. This is similar for FIGS. 29A to 29C and FIGS. 30A to 30C.

Figure 29C:
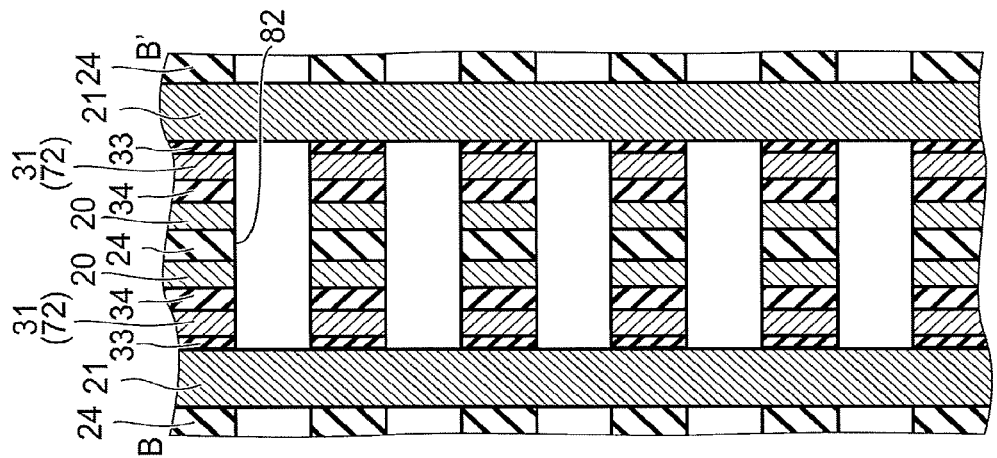
Figure 29B:
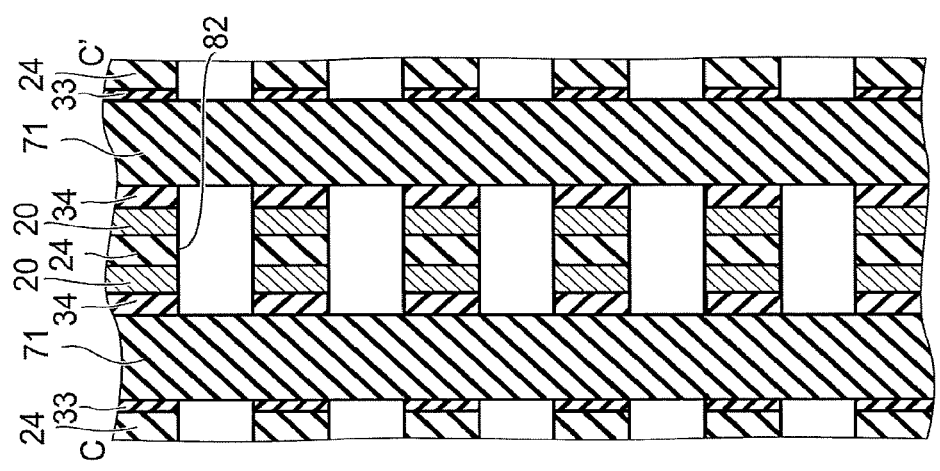
Figure 29A:
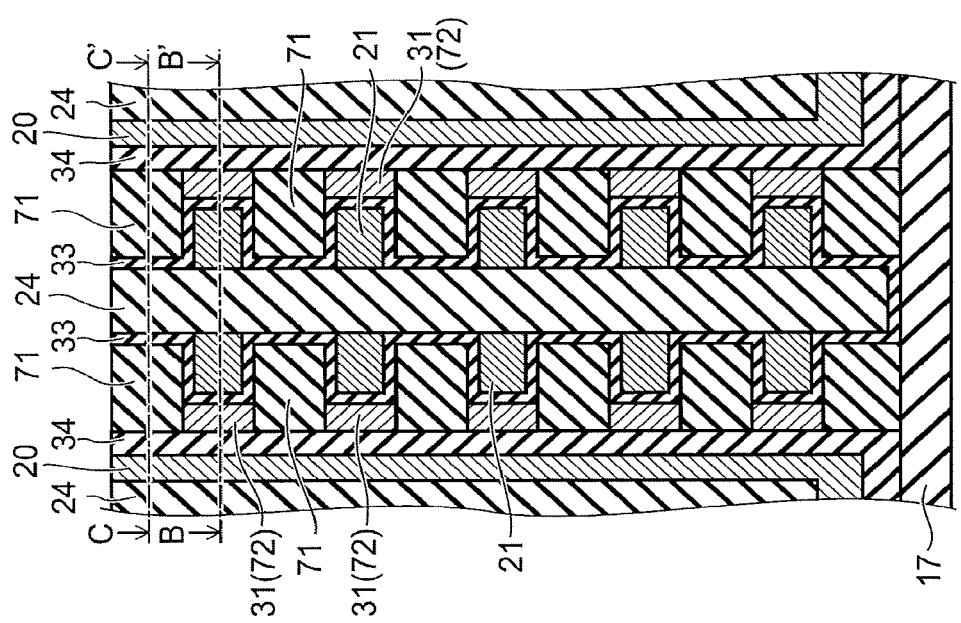

Then, as shown in FIGS. 29A to 29C, the blocking insulating film 34, the polysilicon films 72, and the tunneling insulating film 33 are further removed via the through-holes 82 to be divided along the Y-direction by performing isotropic etching such as CDE, wet etching, etc. Thereby, the polysilicon films 72 that are divided along the Y-direction become the floating gate electrode films 31. At this time, the configuration of the floating gate electrode film 31 becomes a fan-like shape that is wider on the control gate electrode film 21 side according to the conditions of the isotropic etching.

Continuing as shown in FIGS. 30A to 30C, the inter-layer insulating film 24 is filled into the through-holes 82 by, for example, depositing silicon oxide and planarizing the upper surface of the silicon oxide. Then, the vias 28, the vias 38, the source lines, the bit lines 29, and the word lines 39 (referring to FIG. 1 and FIG. 2) are formed by normal methods. Thus, the semiconductor memory device 2 according to the embodiment is manufactured.

Effects of the embodiment will now be described.

In the programming operation and the erasing operation of a NAND memory device, it is necessary for the current to flow in the tunneling insulating film and for the current to not flow easily in the blocking insulating film. To this end, it is necessary for the physical film thickness of the blocking insulating film to be thicker than the physical film thickness of the tunneling insulating film. Accordingly, if the blocking insulating film 34 is to be formed to extend around into the gaps between the silicon oxide films 71, it is necessary to set the spacing between the silicon oxide films 71 to be long in the Z-direction, which obstructs higher integration of the memory cells in the Z-direction. Further, the aspect ratio of the trenches 75 and 78 undesirably increases; and patterning becomes difficult.

If the spacing of the silicon oxide films 71 nevertheless is set to be short, the thickness of the control gate electrode film 21, which is covered with the blocking insulating film 34 at the upper surface and the lower surface of the control gate electrode film 21, becomes shorter than the spacing of the silicon oxide films 71. Accordingly, the interconnect resistance of the control gate electrode film 21 increases; the gate length of the memory cell transistor becomes short; and the characteristics of the memory cell transistor undesirably degrade due to the short channel effect.

Conversely, in the embodiment, the blocking insulating film 34 is formed on the inner surface of the trench 75 in the process shown in FIGS. 22A and 22B. Thus, by forming the blocking insulating film 34 at an early stage, it is no longer necessary for the blocking insulating film 34 to extend around into the gaps between the silicon oxide films 71; and the spacing of the silicon oxide films 71 can be shorter. As shown in FIG. 19, in the embodiment, although the tunneling insulating film 33 extends around into the gaps between the silicon oxide films 71, there are few problems because the tunneling insulating film 33 is thinner than the blocking insulating film 34 as described above. Thus, according to the embodiment, the bit density of the memory cells in the Z-direction can be increased after ensuring the thickness of the control gate electrode film 21; and the aspect ratio can be reduced. Otherwise, the effects of the embodiment are similar to those of the first embodiment described above.

First Modification of Second Embodiment

A first modification of the embodiment will now be described.

Figure 31:
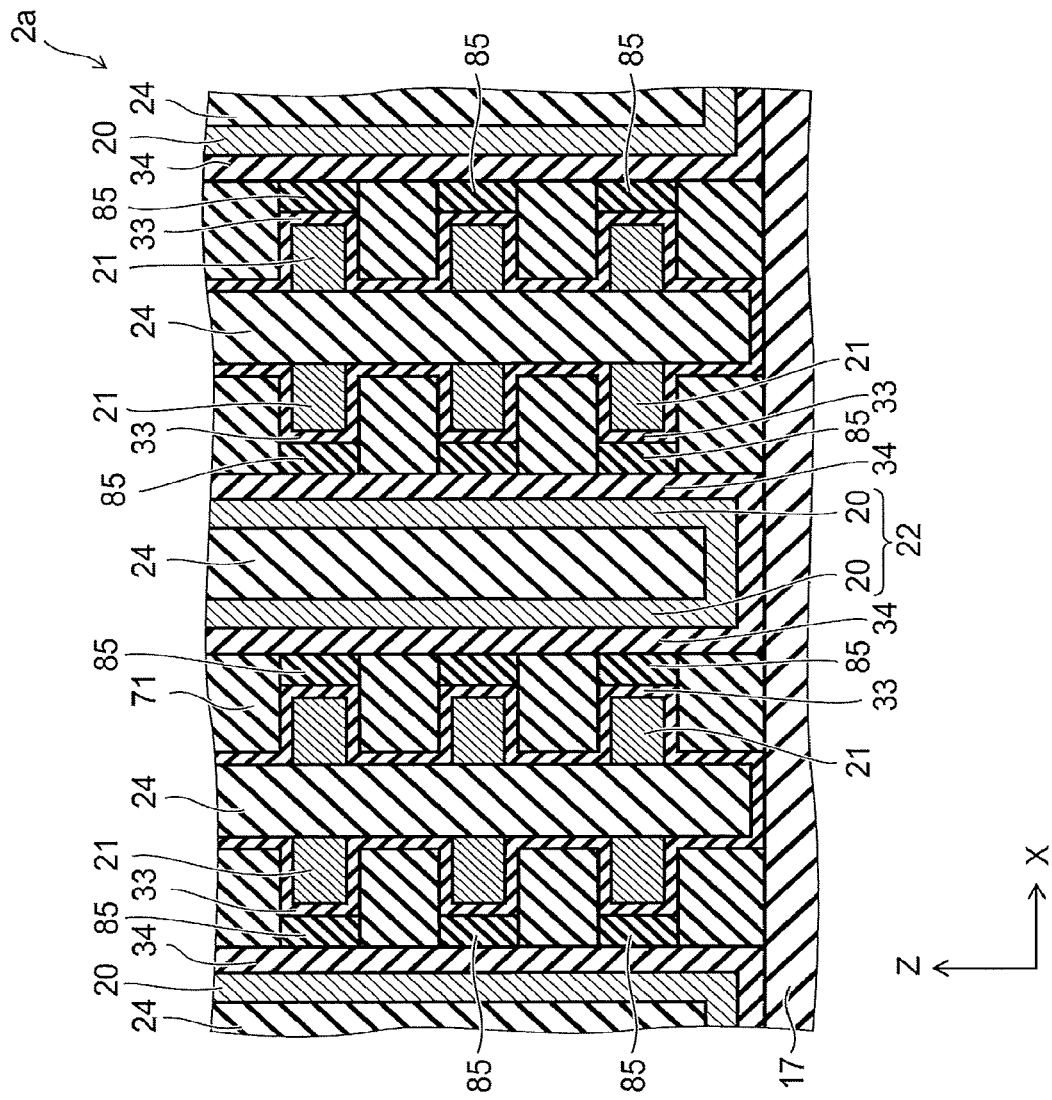
FIG. 31 is a cross-sectional view showing a semiconductor memory device according to a first modification of the second embodiment.

FIG. 31 is a cross-sectional view showing a semiconductor memory device according to the modification.

In the semiconductor memory device 2a according to the modification as shown in FIG. 31, a charge storage film 85 that is made of an insulative charge storage material is provided instead of the floating gate electrode film 31 that is made of a conductive material. The charge storage film 85 is formed of, for example, silicon nitride. Accordingly, the memory cell of the semiconductor memory device 2a has a MONOS structure. Otherwise, the configuration, the manufacturing method, the operations, and the effects of the modification are similar to those of the second embodiment described above.

Second Modification of Second Embodiment

A second modification of the embodiment will now be described.

Figure 32:
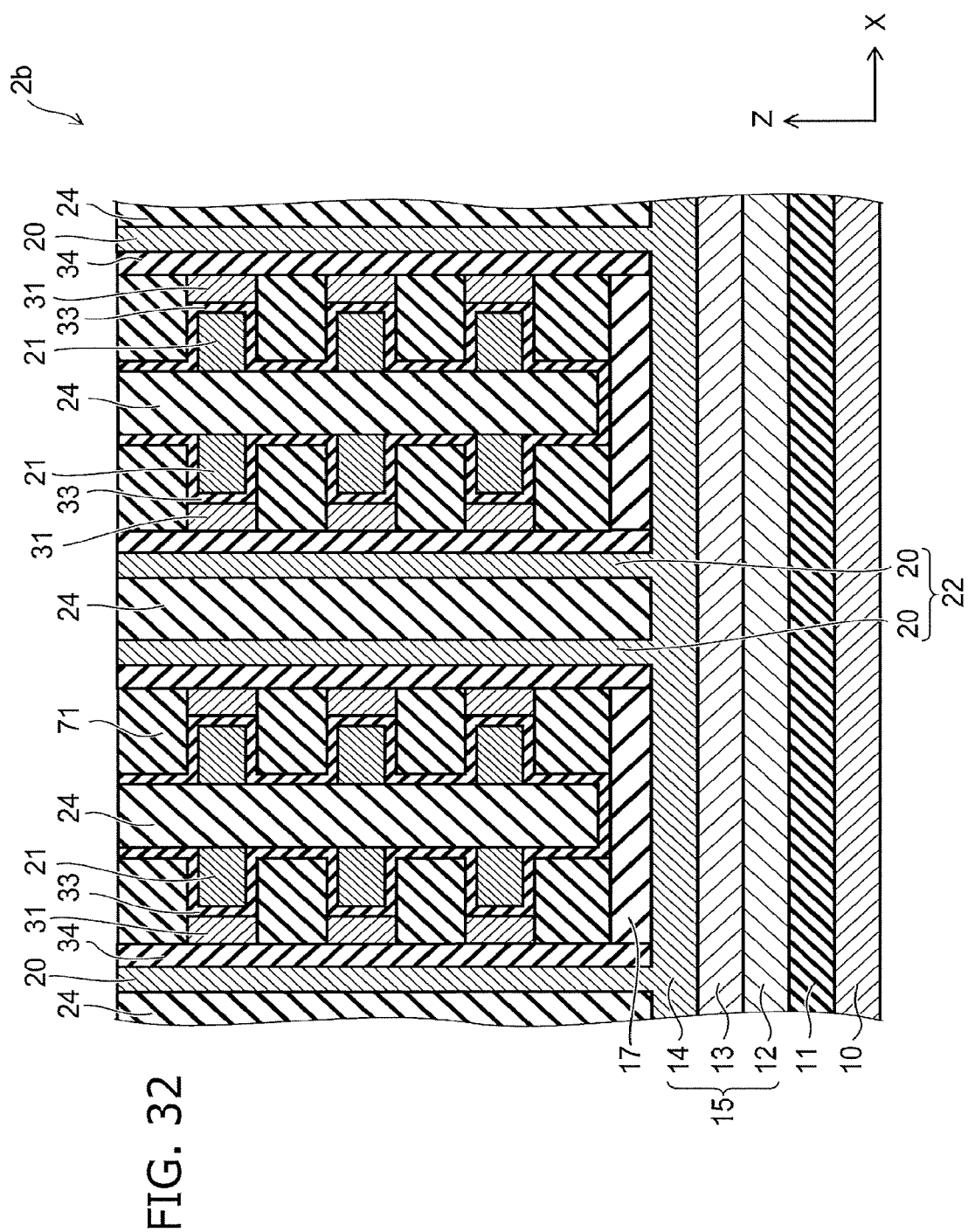
FIG. 32 is a cross-sectional view showing a semiconductor memory device according to a second modification of the second embodiment.

FIG. 32 is a cross-sectional view showing a semiconductor memory device according to the modification.

In the semiconductor memory device 2b according to the modification as shown in FIG. 32, the cell source line 15 is provided; and the lower end of the silicon pillar 20 is connected to the cell source line 15. In other words, the semiconductor memory device 2b is an I-shaped pillar type stacked memory device.

To connect the lower end of the silicon pillar 20 to the cell source line 15 when manufacturing the semiconductor memory device 2b according to the modification, it is necessary for the portion of the blocking insulating film 34 formed on the bottom surface of the trench 75 to be removed by etching in the process shown in FIGS. 22A and 22B. However, the etching does not damage the tunneling insulating film 33 because the tunneling insulating film 33 is not yet formed at this time. Otherwise, the configuration, the manufacturing method, the operations, and the effects of the modification are similar to those of the second embodiment described above.

Third Modification of Second Embodiment

A third modification of the embodiment will now be described.

Figure 33:
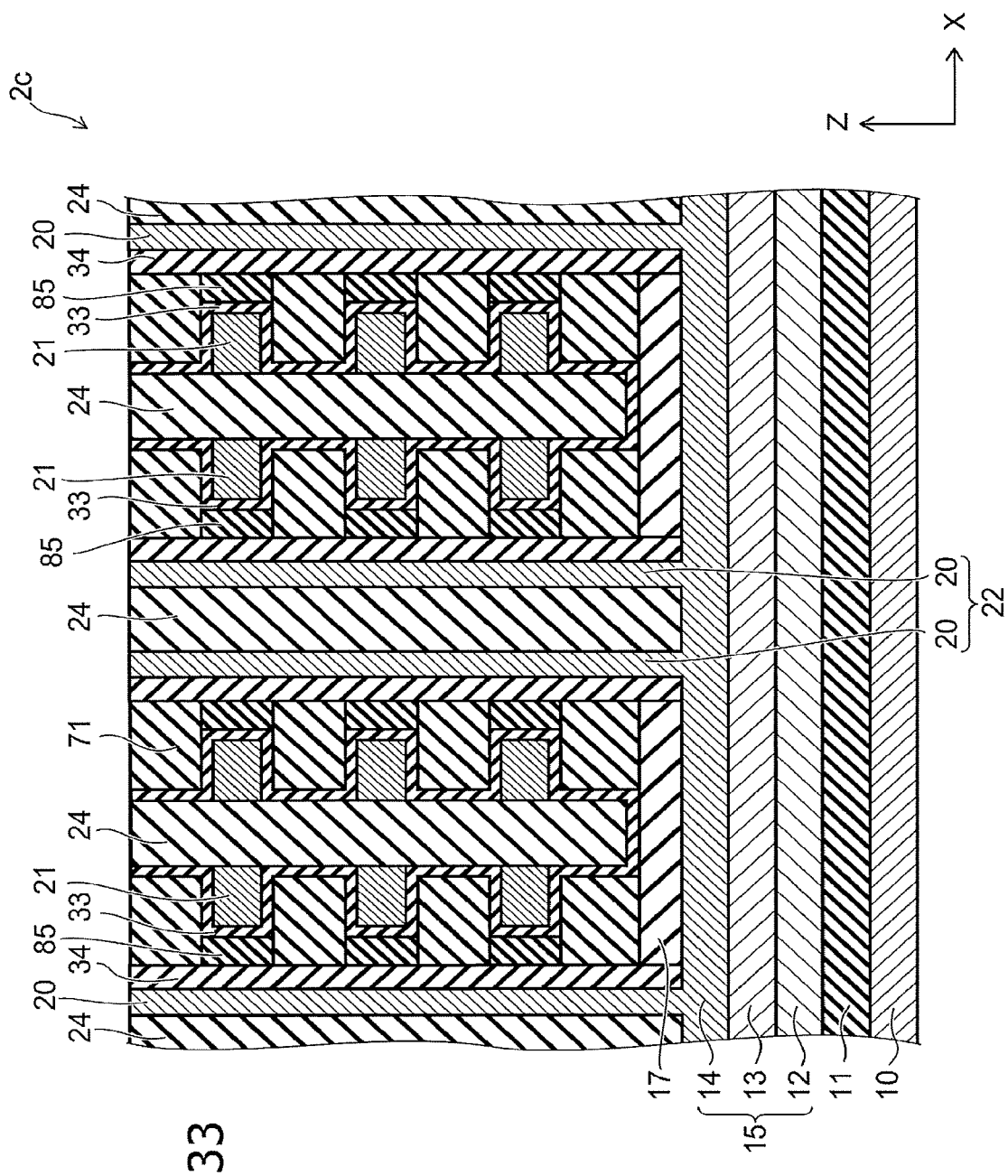
FIG. 33 is a cross-sectional view showing a semiconductor memory device according to a third modification of the second embodiment.

FIG. 33 is a cross-sectional view showing a semiconductor memory device according to the modification.

As shown in FIG. 33, the modification is an example in which the first modification and the second modification described above are combined. Namely, in the semiconductor memory device 2c according to the modification, the charge storage film 85 that is made of an insulative charge storage material is provided; and the lower end of the silicon pillar 20 is connected to the cell source line 15. Accordingly, the semiconductor memory device 2c has a MONOS structure and is the I-shaped pillar type. Otherwise, the configuration, the manufacturing method, the operations, and the effects of the modification are similar to those of the second embodiment and the first and second modifications of the second embodiment described above.

Third Embodiment

A third embodiment will now be described.

Figure 34:
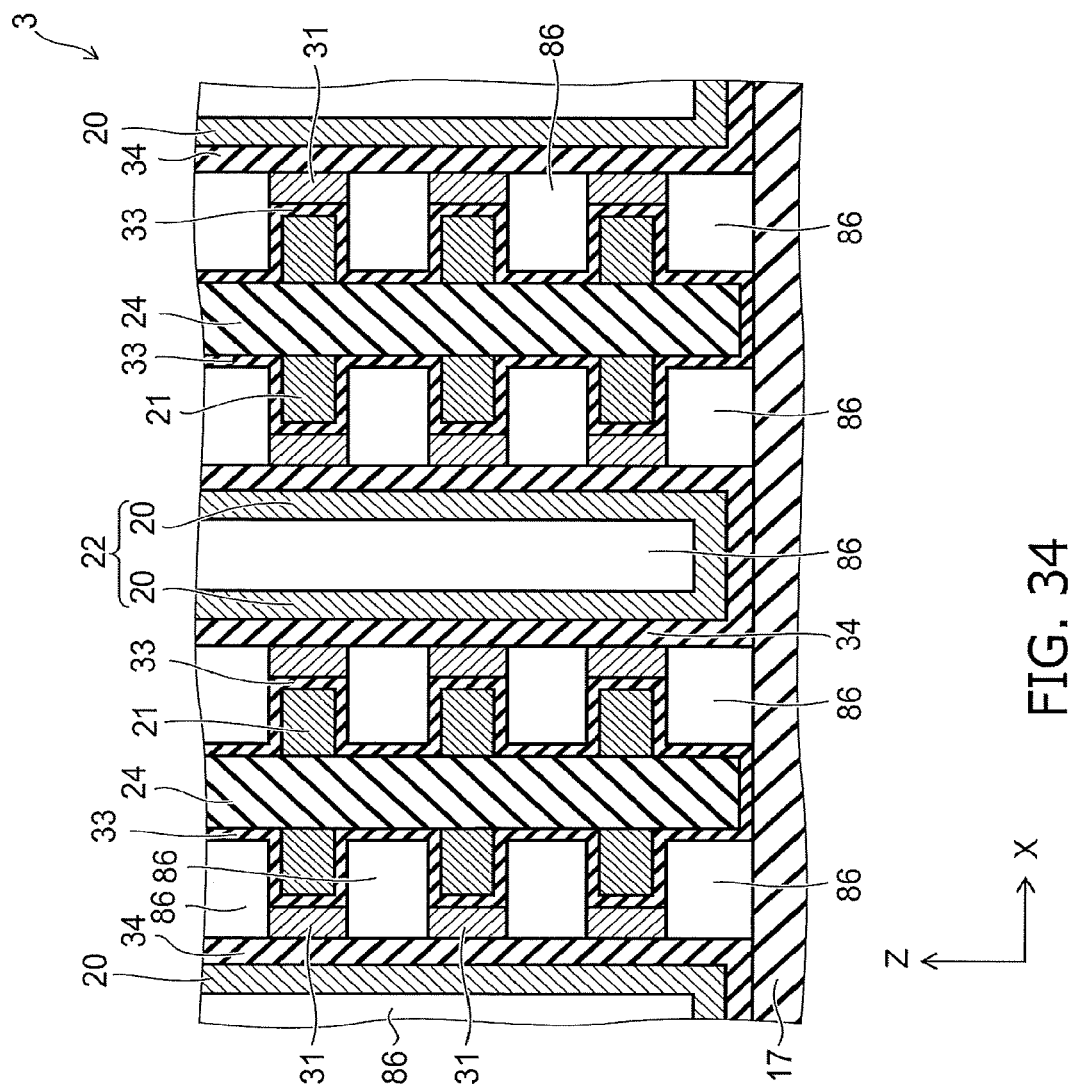
FIG. 34 is a cross-sectional view showing a semiconductor memory device according to a third embodiment.

FIG. 34 is a cross-sectional view showing a semiconductor memory device according to the embodiment.

Compared to the semiconductor memory device 2 (referring to FIG. 19) according to the second embodiment described above, in the semiconductor memory device 3 according to the embodiment as shown in FIG. 34, an air gap 86 is made between the silicon pillars 20, the control gate electrode films 21, the floating gate electrode films 31, the tunneling insulating films 33, and the blocking insulating films 34. More specifically, the air gap 86 is made between the control gate electrode films 21 adjacent to each other in the Z-direction, between the floating gate electrode films 31 adjacent to each other in the Z-direction, between the silicon pillars 20 adjacent to each other in the Y-direction, between the blocking insulating films 34, between the floating gate electrode films 31, between the tunneling insulating films 33, and between the two silicon pillars 20 adjacent to each other in the X-direction and belonging to the same set 22.

A method for manufacturing the semiconductor memory device according to the embodiment will now be described.

FIGS. 35A and 35B to FIGS. 37A to 37C are plan views and cross-sectional views showing the method for manufacturing the semiconductor memory device according to the embodiment.

Figure 35B:
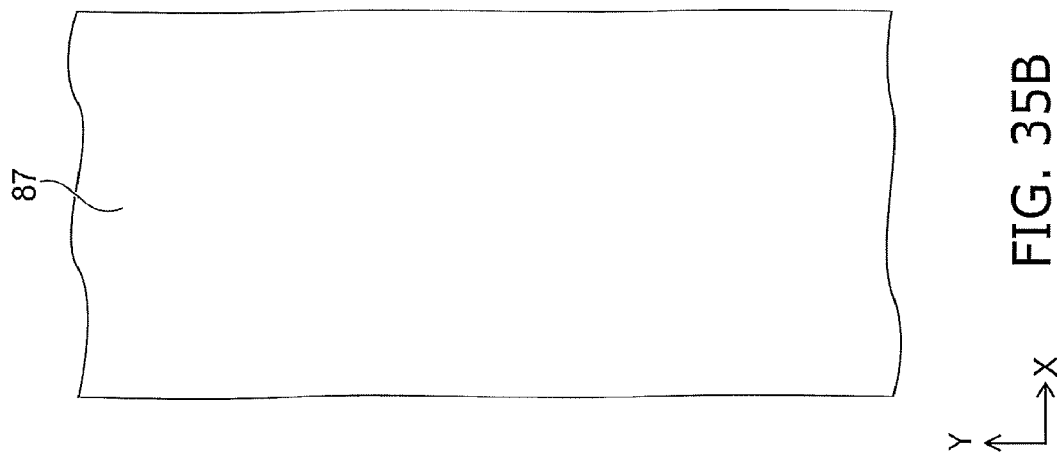
Figure 35A:
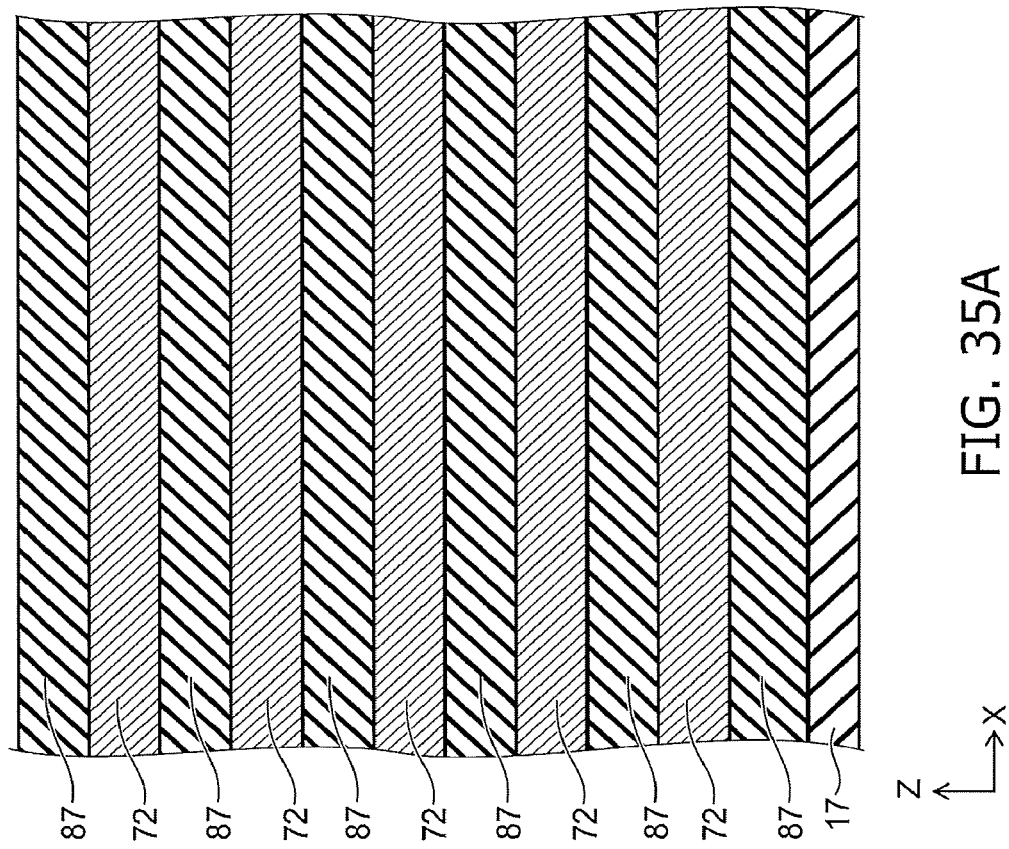
Figure 36C:
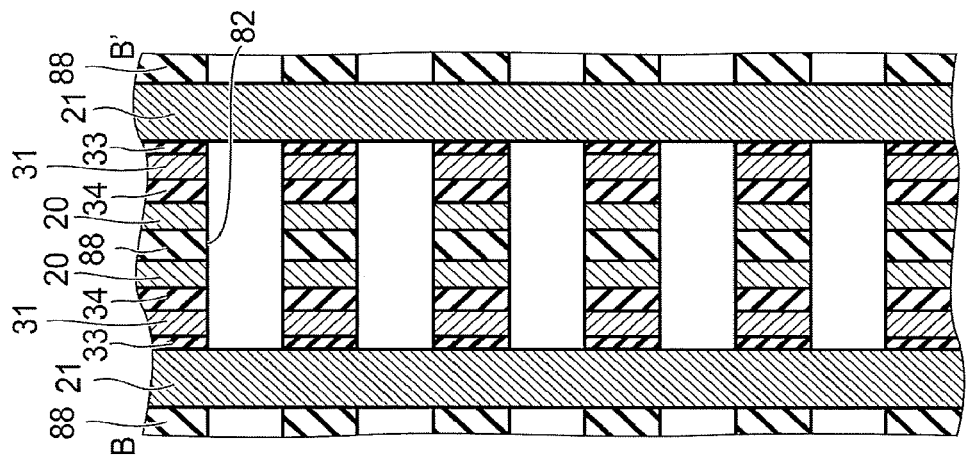
Figure 36B:
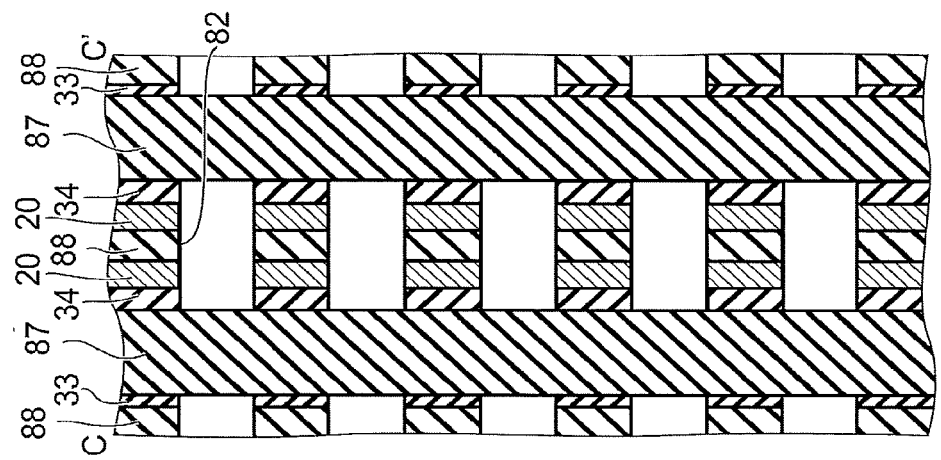
Figure 36A:
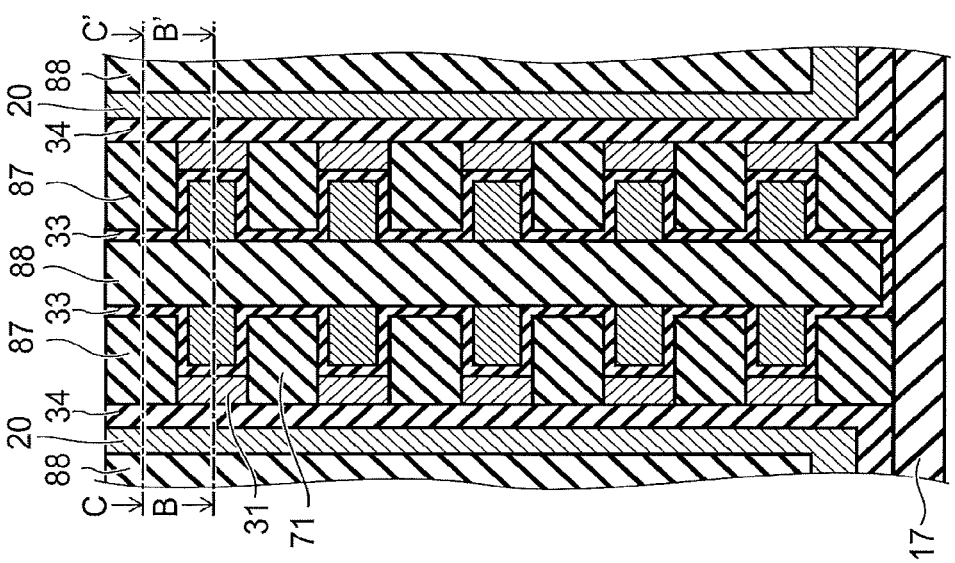

FIG. 35A is a cross-sectional view; and FIG. 35B is a plan view. FIG. 36A is a cross-sectional view; FIG. 36B is a cross-sectional view along line C-C' shown in FIG. 36A; and FIG. 36C is a cross-sectional view along line B-B' shown in FIG. 36A. This is similar for FIGS. 37A to 37C.

First, as shown in FIGS. 35A and 35B, a stacked body is formed by forming the insulating film 17 made of silicon oxide on the silicon substrate 10 (referring to FIG. 2) and subsequently stacking a silicon nitride film 87 alternately with the polysilicon film 72.

Then, the processes shown in FIGS. 21A and 21B to FIGS. 29A to 29C are implemented. However, in the processes shown in FIGS. 24A and 24B and FIGS. 27A and 27B, a silicon nitride film 88 is filled instead of the inter-layer insulating film 24 made of silicon oxide.

Thereby, as shown in FIGS. 36A to 36C, an intermediate structural body that is similar to the intermediate structural body shown in FIGS. 29A to 29C is made. However, in the intermediate structural body of the embodiment, the silicon nitride films 87 are provided instead of the silicon oxide films 71; and the silicon nitride film 88 is provided instead of the inter-layer insulating film 24.

Then, as shown in FIGS. 37A to 37C, the silicon nitride films 87 and the silicon nitride film 88 are removed by, for example, wet etching. Thereby, the air gap 86 is made in the space where the silicon nitride films 87 and the silicon nitride film 88 were disposed. Thus, the semiconductor memory device 3 according to the embodiment is manufactured.

According to the embodiment, because the air gap 86 is made between the silicon pillars 20, the control gate electrode films 21, the floating gate electrode films 31, the tunneling insulating films 33, and the blocking insulating films 34, the proximity effect can be suppressed; and the breakdown voltage can be increased.

Otherwise, the configuration, the manufacturing method, the operations, and the effects of the embodiment are similar to those of the second embodiment described above.

It is possible for the air gap to be made only between the silicon pillars 20 by alternately stacking the silicon oxide film 71 and the polysilicon film 72 instead of the silicon nitride film 87 and the polysilicon film 72 in the process shown in FIGS. 35A and 35B.

Modification of Third Embodiment

A modification of the embodiment will now be described.

FIGS. 38A to 38C are cross-sectional views showing a semiconductor memory device according to the modification.

FIG. 38A is a cross-sectional view; FIG. 38B is a cross-sectional view along line C-C' shown in FIG. 38A; and FIG. 38C is a cross-sectional view along line B-B' shown in FIG. 38A. FIG. 38A is a cross-sectional view along line D-D' shown in FIG. 38C. This is similar for FIGS. 39A to 39C described below.

As shown in FIGS. 38A to 38C, the semiconductor memory device 3a according to the modification differs from the semiconductor memory device 3 (referring to FIG. 34) according to the third embodiment described above in that a reinforcing member 89 is formed in multiple regions by causing the silicon nitride films 87 and 88 to partially remain. The reinforcing member 89 extends in the Z-direction and is disposed intermittently along the Y-direction inside the semiconductor memory device 3a.

FIGS. 39A to 39C are cross-sectional views showing a method for manufacturing the semiconductor memory device according to the modification.

In the modification as shown in FIGS. 39A to 39C, the through-holes 82 are not made in the region where the reinforcing member 89 is to be formed. Thereby, in the process shown in FIGS. 37A to 37C, the silicon nitride films 87 and 88 remain locally to become the reinforcing member 89 when performing wet etching of the silicon nitride films 87 and 88 via the through-holes 82.

According to the modification, by providing the reinforcing member 89, the mechanical strength of the semiconductor memory device 3a can be ensured; and collapse can be prevented. Otherwise, the configuration, the manufacturing method, the operations, and the effects of the modification are similar to those of the third embodiment described above.

Fourth Embodiment

A fourth embodiment will now be described.

Figure 40:
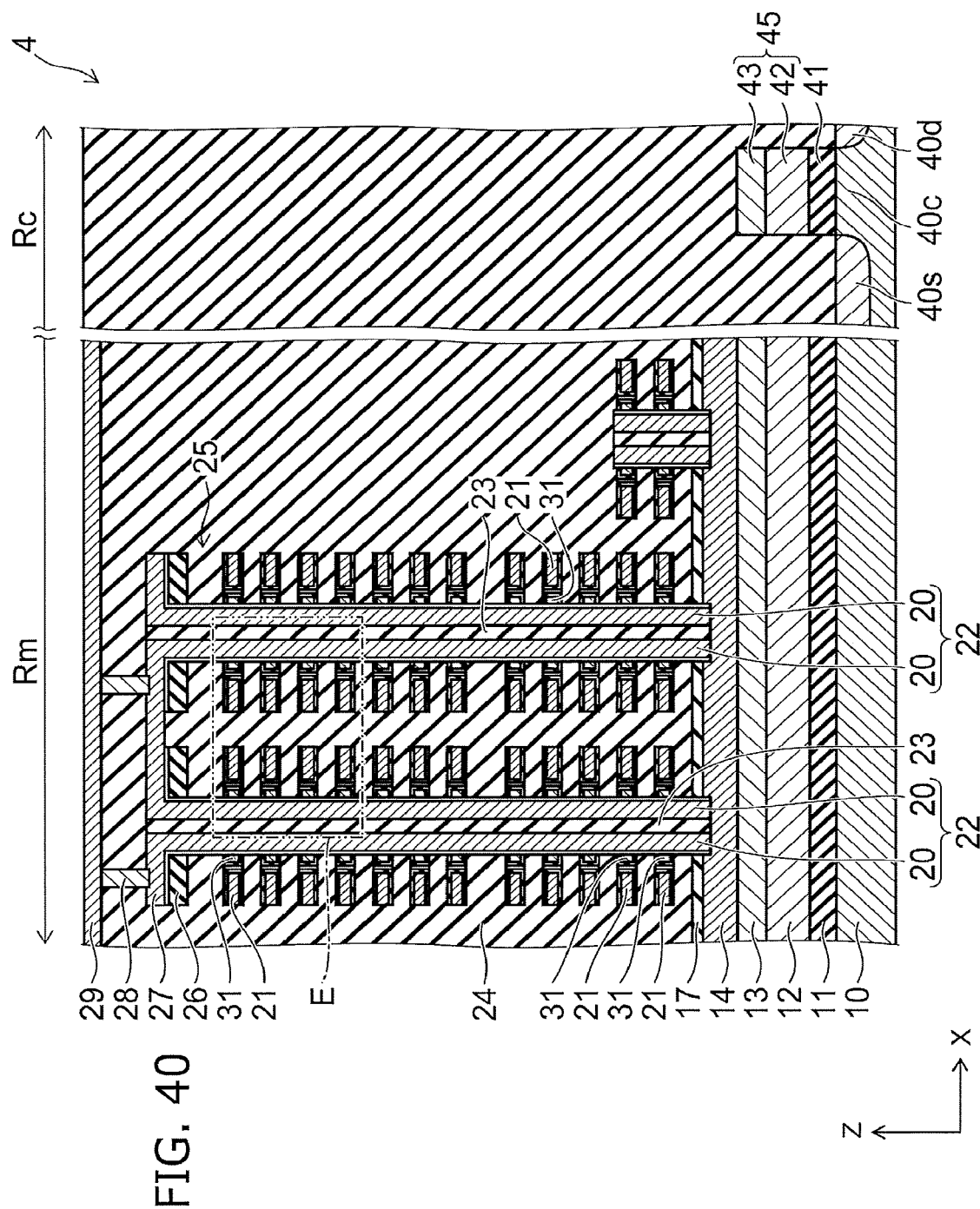
FIG. 40 is a cross-sectional view showing a semiconductor memory device according to a forth embodiment.

FIG. 40 is a cross-sectional view showing a semiconductor memory device according to the embodiment.

Figure 41:
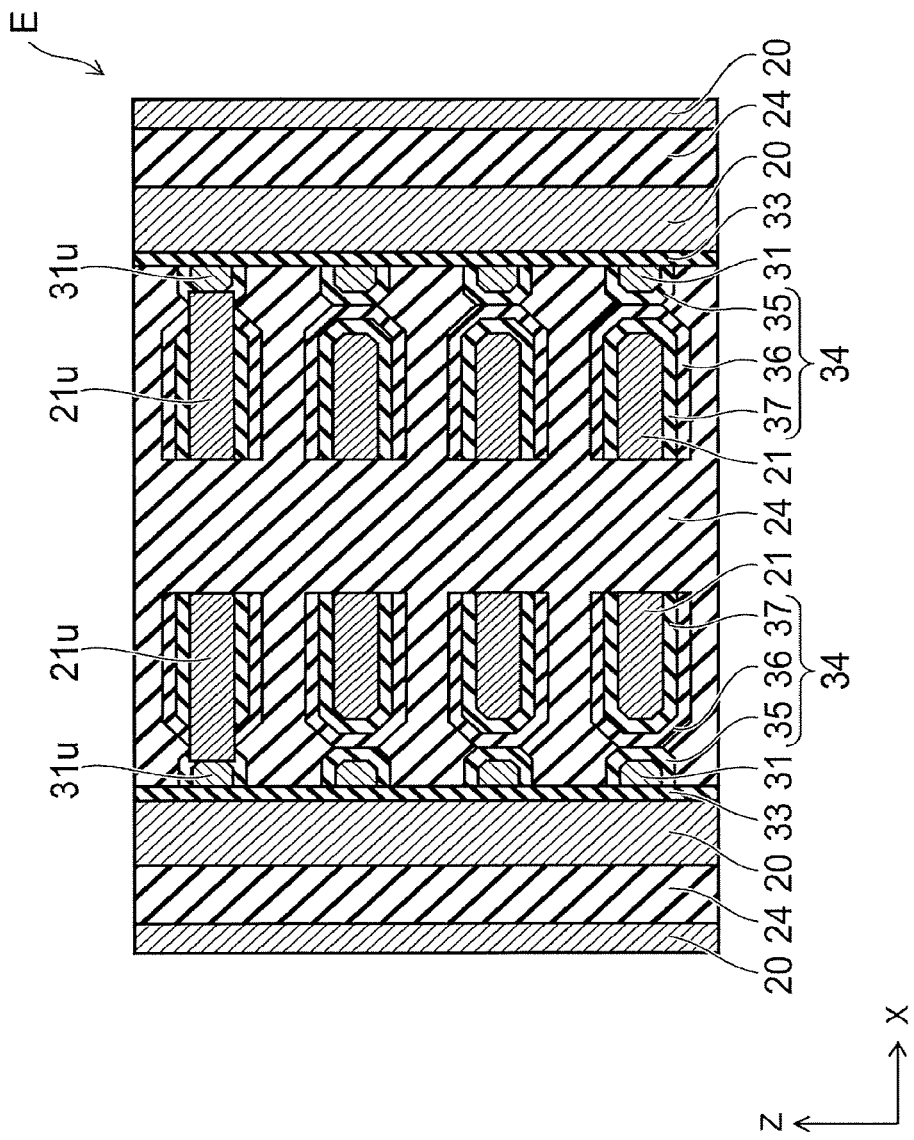
FIG. 41 is a cross-sectional view showing region E shown in FIG. 40.

FIG. 41 is a cross-sectional view showing region E shown in FIG. 40.

As shown in FIG. 40 and FIG. 41, the semiconductor memory device 4 according to the embodiment differs from the semiconductor memory device 1 (referring to FIG. 1 to FIG. 4) according to the first embodiment described above in that the blocking insulating film 34 is not disposed between a control gate electrode film 21u of the uppermost level and a floating gate electrode film 31u of the uppermost level; and the control gate electrode film 21u of the uppermost level is connected to the floating gate electrode film 31u of the uppermost level.

The semiconductor memory device according to the embodiment will now be described.

Figure 42B:
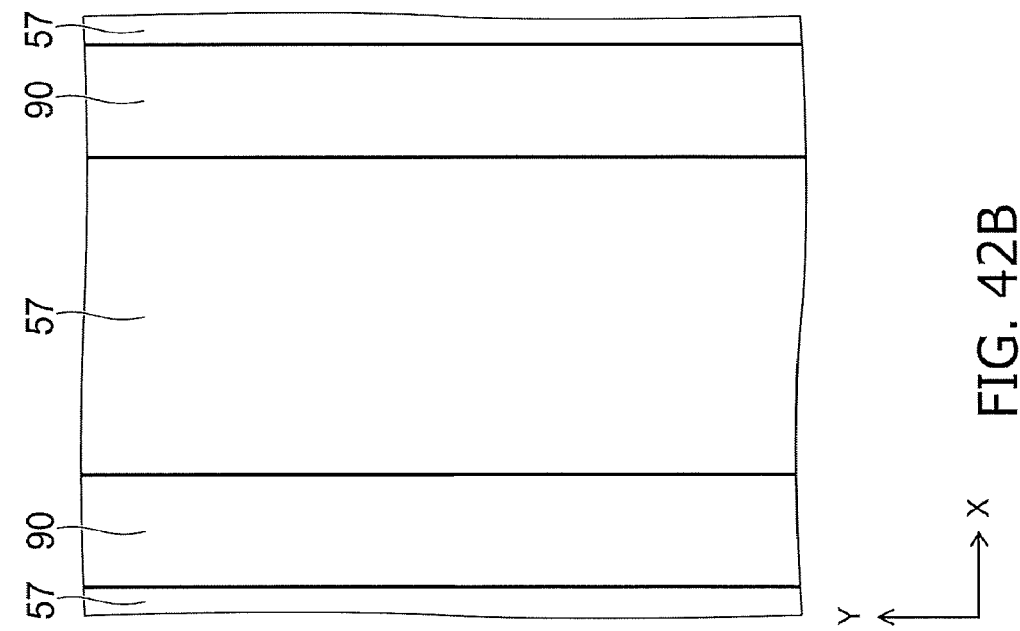
FIG. 42B is a plan view.
Figure 42A:
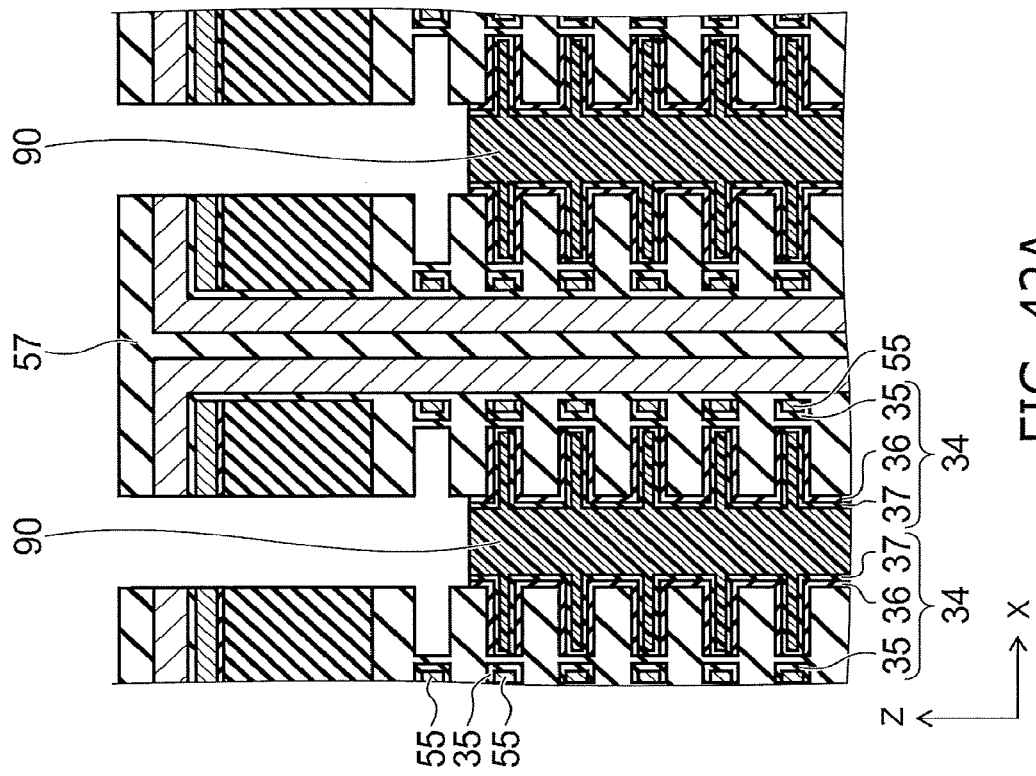
FIG. 42A is a cross-sectional view showing a method for manufacturing the semiconductor memory device according to the forth embodiment.

FIG. 42A is a cross-sectional view showing a method for manufacturing the semiconductor memory device according to the embodiment; and FIG. 42B is a plan view.

First, the processes shown in FIGS. 5A and 5B to FIGS. 12A and 12B are implemented.

Then, as shown in FIGS. 42A and 42B, the silicon oxide layer 36 and the silicon nitride layer 37 are formed on the inner surface of the trench 58. Then, a resist material 90 is filled into the trench 58; and a recess 59u of the uppermost level is exposed by the upper surface of the resist material 90 being recessed. Then, the portions of the silicon nitride layer 37, the silicon oxide layer 36, and the silicon nitride layer 35 that are exposed from the resist material 90 are removed by, for example, wet etching. Thereby, the polysilicon film 55 is exposed at the back surface of the recess 59u of the uppermost level. Then, the resist material 90 is removed.

Continuing as shown in FIGS. 13A and 13B, the tungsten film 61 is formed on the inner surface of the trench 58. At this time, the tungsten film 61 contacts the polysilicon film 55 inside the recess 59u of the uppermost level. The subsequent processes are similar to those of the first embodiment described above.

According to the embodiment, the control gate electrode film 21u of the uppermost level and the floating gate electrode film 31u of the uppermost level can be electrically integrated to be used as the selection gate electrode film by causing the control gate electrode film 21u to connect the floating gate electrode film 31u. Thereby, a selection gate transistor can be formed in which the threshold does not fluctuate because charge is not stored.

Otherwise, the configuration, the manufacturing method, the operations, and the effects of the embodiment are similar to those of the first embodiment described above.

Fifth Embodiment

A fifth embodiment will now be described.

Figure 43:
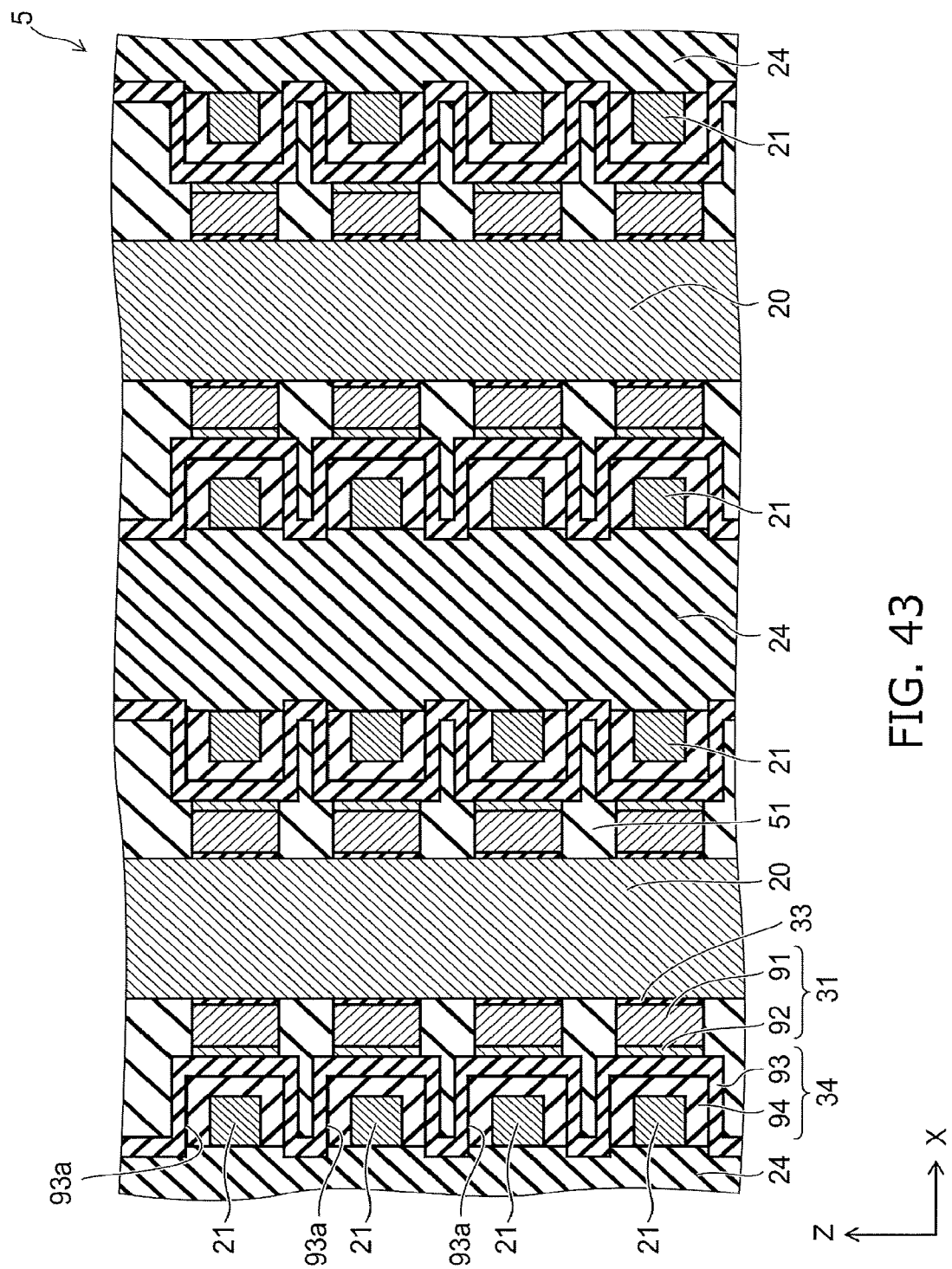
FIG. 43 and FIG. 44 are cross-sectional views showing a semiconductor memory device according to a fifth embodiment.
Figure 44:
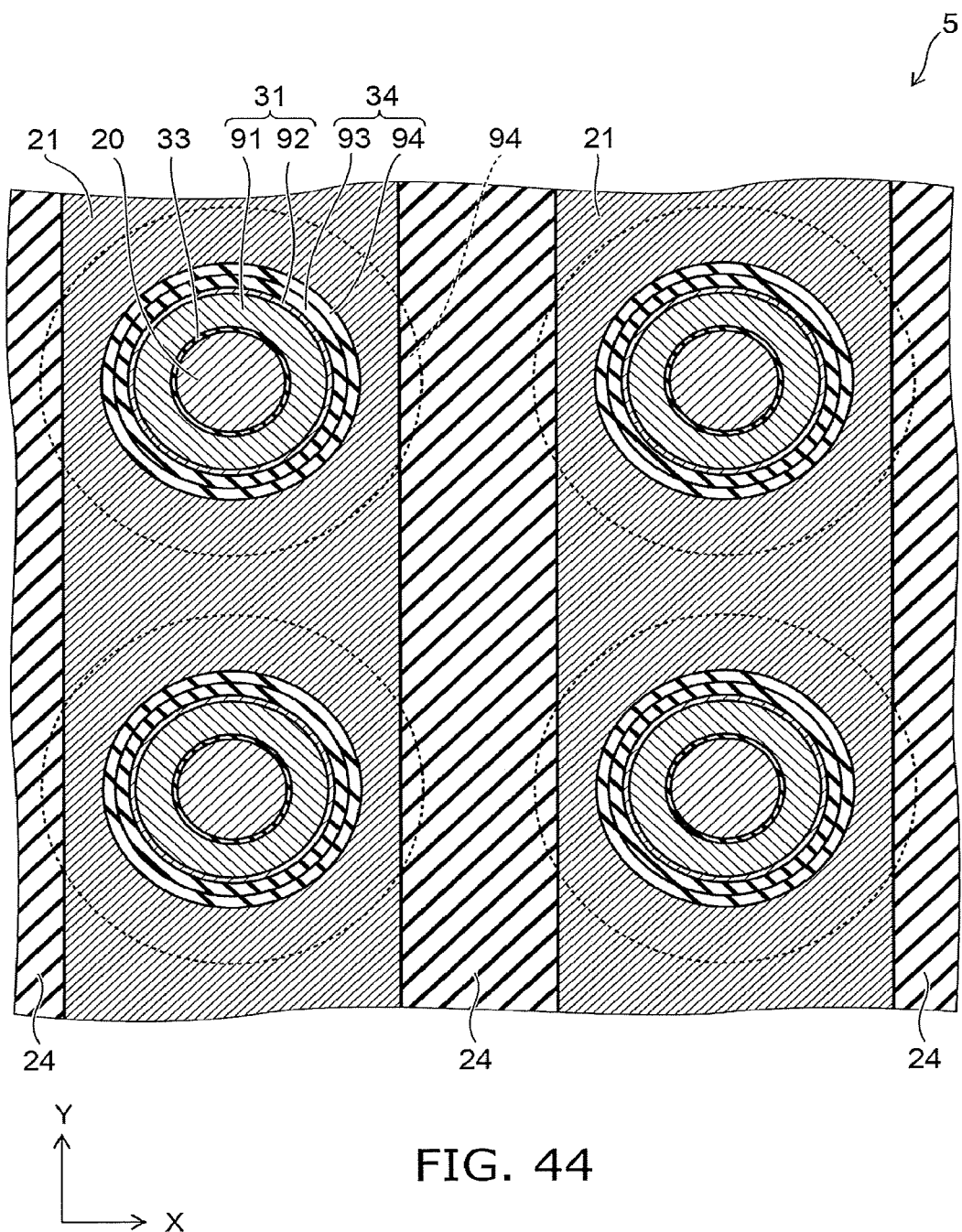

FIG. 43 and FIG. 44 are cross-sectional views showing a semiconductor memory device according to the embodiment.

In the semiconductor memory device 5 according to the embodiment as shown in FIG. 43 and FIG. 44, the multiple silicon pillars 20 are provided and arranged in a matrix configuration along the X-direction and the Y-direction. Each of the silicon pillars 20 has a circular columnar configuration extending in the Z-direction. The tunneling insulating films 33, the floating gate electrode films 31, and the blocking insulating film 34 are provided in circular ring configurations around each of the silicon pillars 20 in order from the inside, i.e., the silicon pillar 20 side. In other words, the floating gate electrode films 31 are provided around the silicon pillar 20 as viewed from the Z-direction.

The tunneling insulating films 33 and the floating gate electrode films 31 are divided in the Z-direction. The silicon oxide films 51 are provided between the stacked bodies having the circular ring configurations made of the tunneling insulating film 33 and the floating gate electrode film 31 in the Z-direction. In the floating gate electrode film 31, a polysilicon layer 91 is disposed on the inner side; and a metal silicide layer 92 is disposed on the outer side. The metal silicide layer 92 is formed of a metal silicide but may be formed of a metal.

In the blocking insulating film 34, a silicon oxide layer 93 is disposed on the inner side; and high dielectric constant layers 94 are disposed on the outer side. The high dielectric constant layers 94 are made of a material having a higher dielectric constant than silicon oxide, for example, hafnium (Hf), aluminum oxide (AlO), titanium nitride (TiN), tantalum nitride (TaN), or tantalum oxide (TaO). The silicon oxide layer 93 is provided continuously in a tubular configuration in the Z-direction. However, the diameter of the tube fluctuates periodically such that the diameter of the portions corresponding to the floating gate electrode films 31 is relatively small and the diameter of the portions corresponding to the silicon oxide films 51 is relatively large. Therefore, the silicon oxide layer 93 has a circular tubular bellows-like configuration. The high dielectric constant layers 94 are disposed inside recesses 93a at the outer surface of the circular tubular bellows-like configuration made of the silicon oxide layer 93 and are divided for each of the recesses 93a. The configuration of the blocking insulating film 34 is not limited to the two-layer structure made of the silicon oxide layer 93 and the high dielectric constant layers 94. For example, the configuration may be a combination of any layer of a silicon oxide layer (a $SiO_2$ layer), a silicon nitride layer (a $Si_3N_4$ layer), an $Al_2O_3$ layer, a MgO layer, a SrO layer, a SiN layer, a BaO layer, a TiO layer, a $Ta_2O_5$ layer, a $BaTiO_3$ layer, a BaZrO layer, a $ZrO_2$ layer, a $Y_2O_3$ layer, a ZrSiO layer, a HfAlO layer, a HfSiO layer, a $La_2O_3$ layer, a LaAlO layer, etc.

In the semiconductor memory device 5, the multiple control gate electrode films 21 are provided to be arranged in a matrix configuration along the X-direction and the Z-direction. The control gate electrode films 21 have band configurations extending in the Y-direction. The control gate electrode film 21 is a conductive film, e.g., a two-layer film made of a titanium nitride layer (TiN) and a tungsten layer (W), a two-layer film made of a tungsten nitride layer (WN) and a tungsten layer (W), or a two-layer film made of a tantalum nitride layer (TaN) and a tungsten layer (W). However, the configuration of the control gate electrode film 21 is not limited thereto; and, for example, a metal silicide layer formed by siliciding a polysilicon film may be used.

The structural body that is made of the silicon pillar 20, the tunneling insulating film 33, the floating gate electrode films 31, and the blocking insulating film 34 pierces the control gate electrode films 21. The control gate electrode films 21 are disposed in the recesses 93a. In other words, the control gate electrode films 21 are provided around the floating gate electrode films 31 as viewed from the Z-direction. The inter-layer insulating film 24 is provided between the structural bodies made of the silicon pillar 20, the tunneling insulating film 33, the floating gate electrode films 31, the blocking insulating film 34, and the control gate electrode films 21.

A method for manufacturing the semiconductor memory device according to the embodiment will now be described.

FIG. 45 to FIG. 53 are cross-sectional views showing the method for manufacturing the semiconductor memory device according to the embodiment.

First, similarly to the first embodiment described above, the insulating film 11, the cell source line 15, and the insulating film 17 (referring to FIG. 1 and FIG. 2) are formed on the silicon substrate 10.

Figure 45:
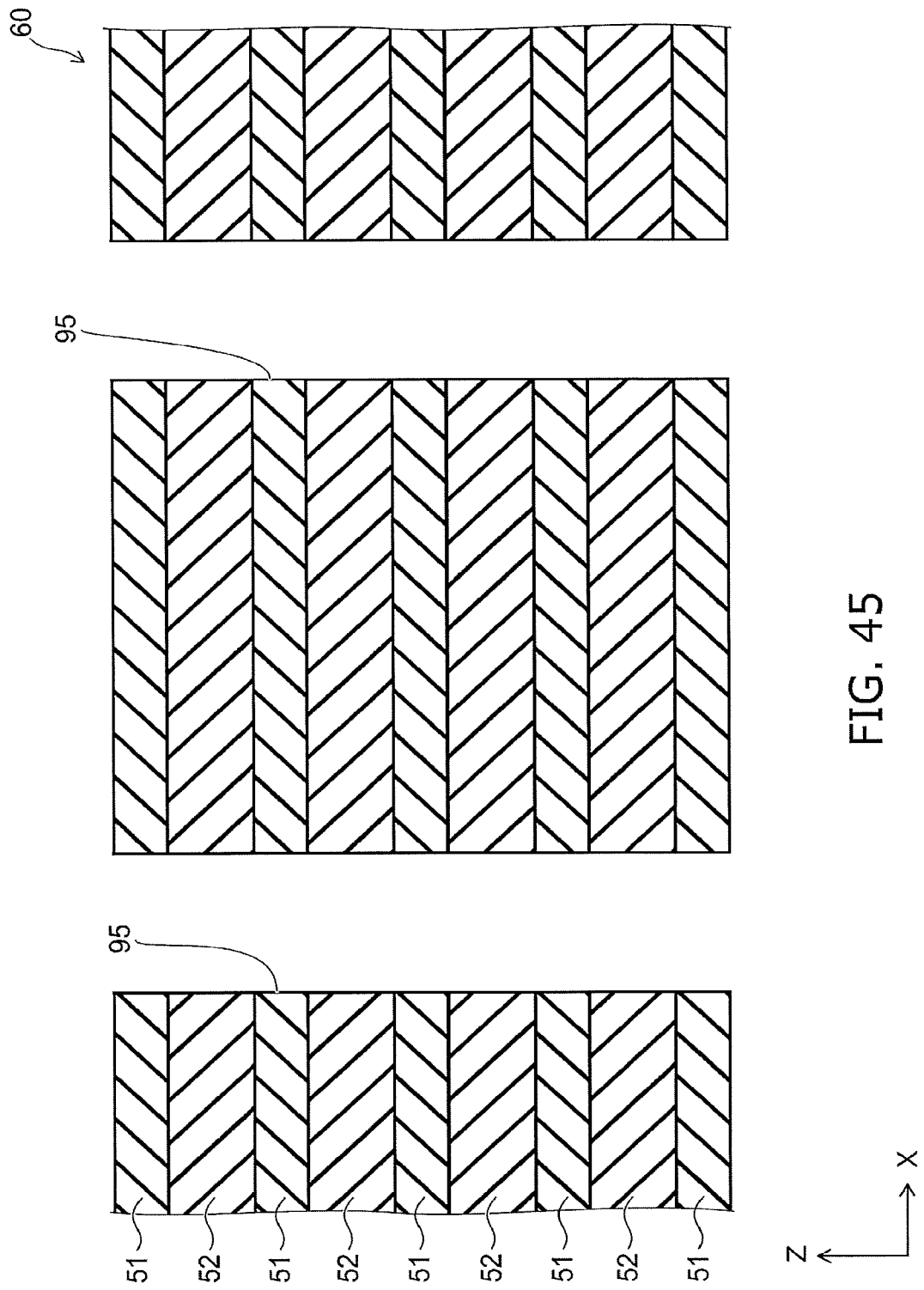

Then, as shown in FIG. 45, the stacked body 60 is formed by alternately stacking the silicon oxide film 51 and the silicon nitride film 52.

Continuing, multiple memory holes 95 are made in the stacked body 60. The memory holes 95 extend in the Z-direction and pierce the stacked body 60 and the insulating film 17 (referring to FIG. 2) to reach the cell source line 15.

Figure 46:
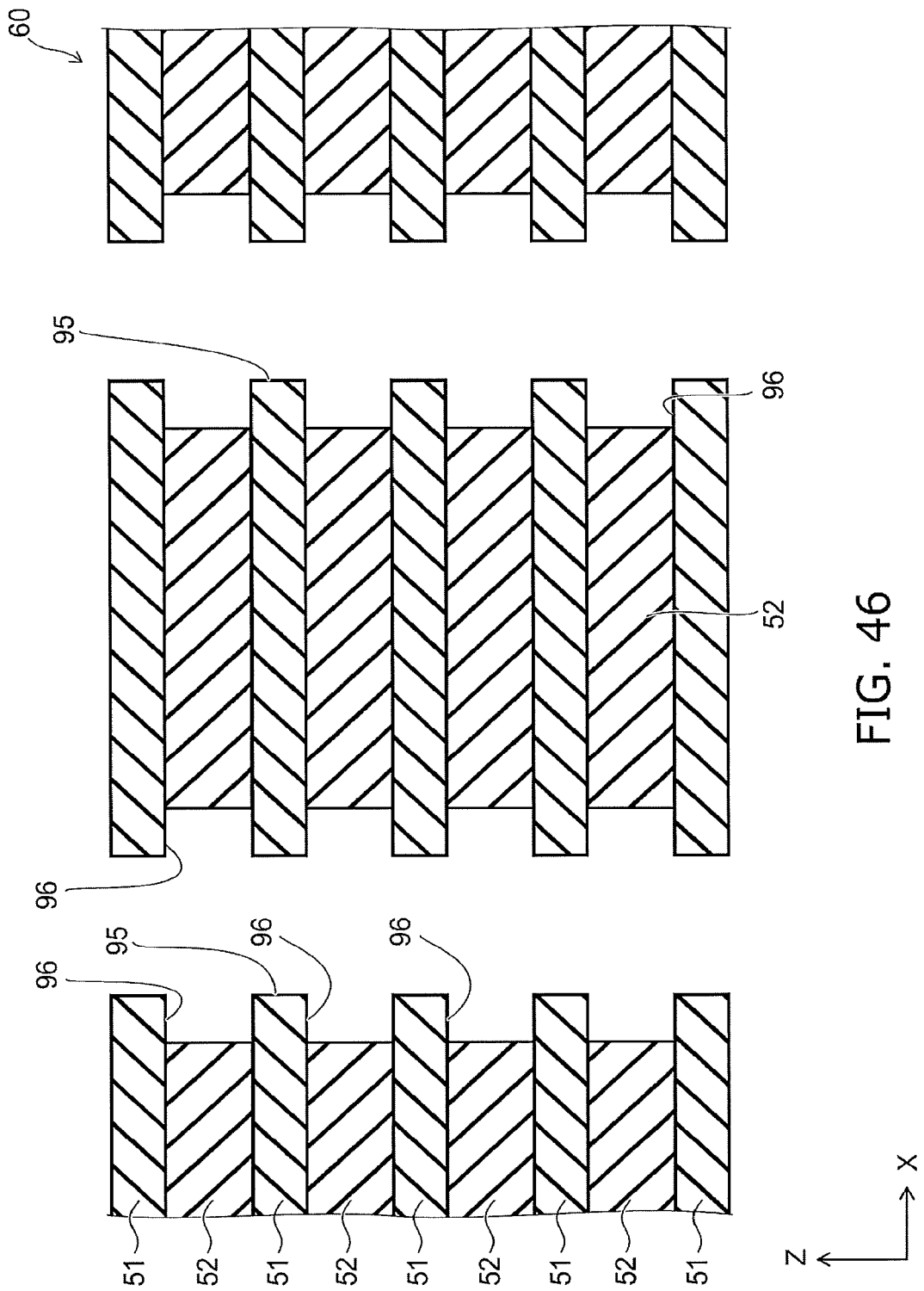

Then, as shown in FIG. 46, the exposed surfaces of the silicon nitride films 52 at the inner surface of the memory hole 95 are caused to recede by performing wet etching. Thereby, recesses 96 having annular configurations are made in the inner surface of the memory hole 95.

Figure 47:
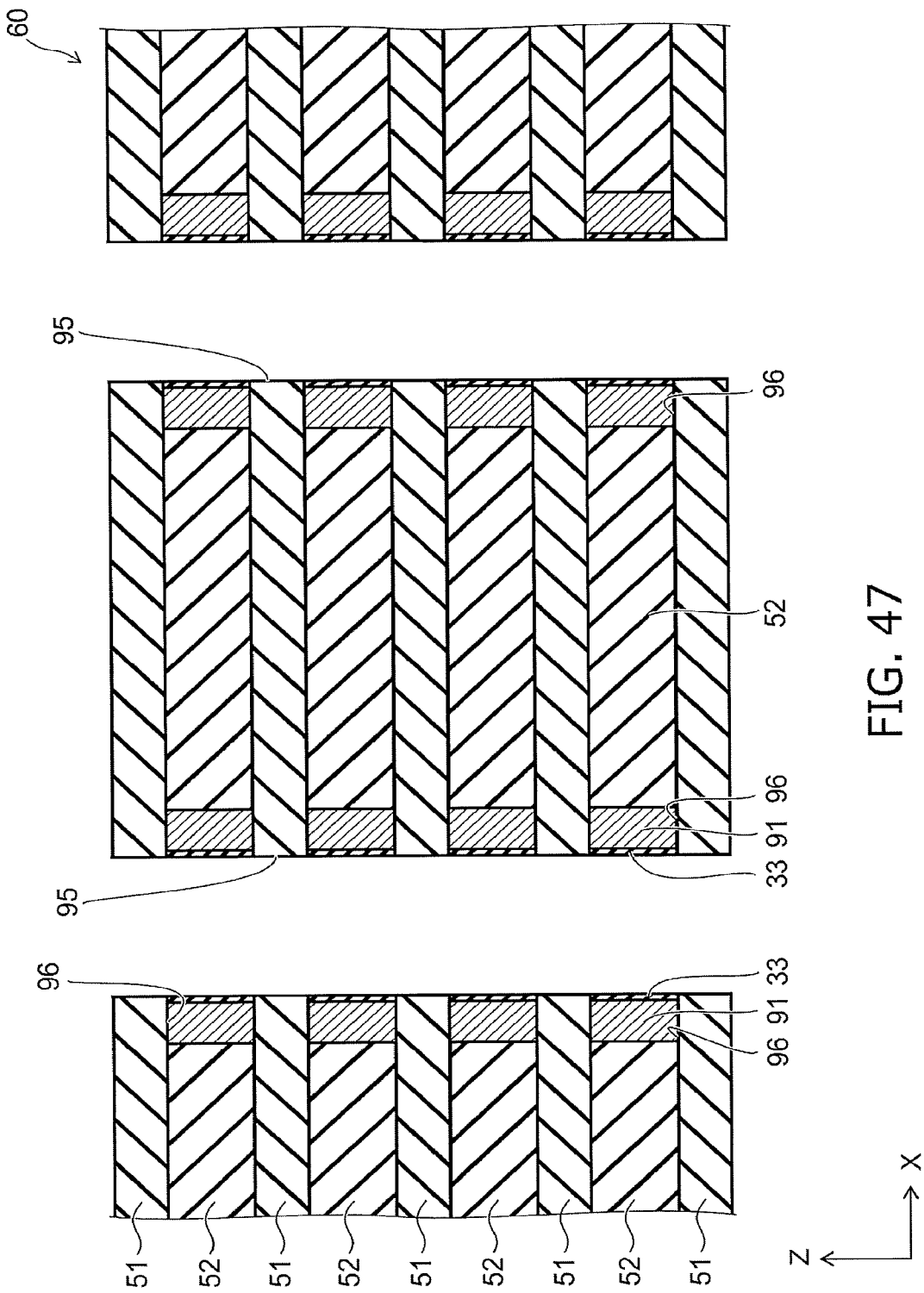

Continuing as shown in FIG. 47, the polysilicon layers 91 are filled into the recess 96 by depositing polysilicon and selectively removing the polysilicon by performing isotropic etching. Then, the tunneling insulating films 33 are formed by oxidizing the exposed surfaces of the polysilicon layers 91.

Figure 48:
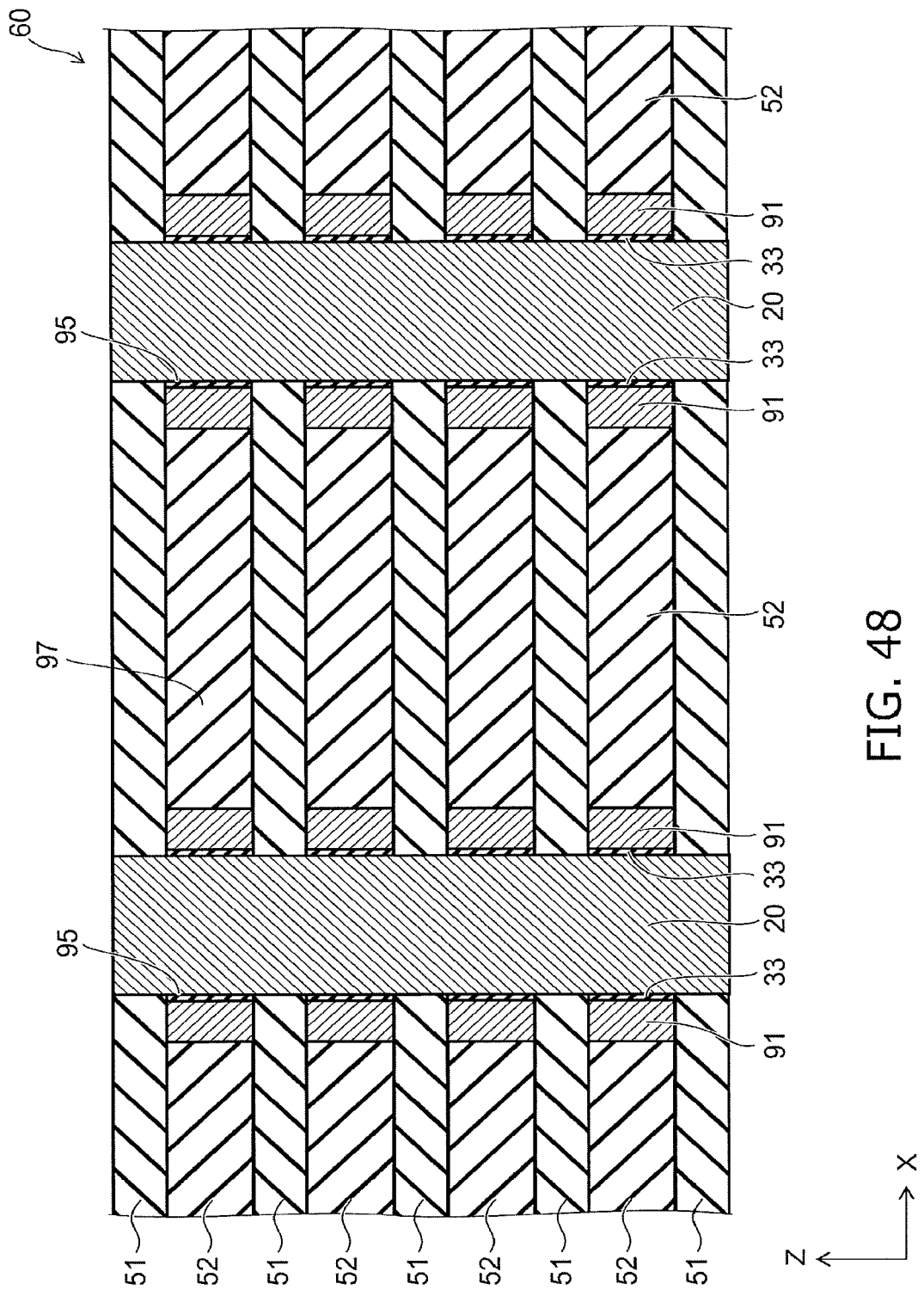

Then, as shown in FIG. 48, the silicon pillar 20 is formed by filling polysilicon into the memory hole 95. The silicon pillar 20 is connected to the cell source line 15 (referring to FIG. 2).

Continuing as shown in FIG. 49, a trench 97 is made in the portion of the stacked body 60 between the memory holes 95. The trench 97 spreads in the Y-direction and the Z-direction, and pierces the stacked body 60 in the Z-direction but does not pierce the insulating film 17 (referring to FIG. 2).

Figure 50:
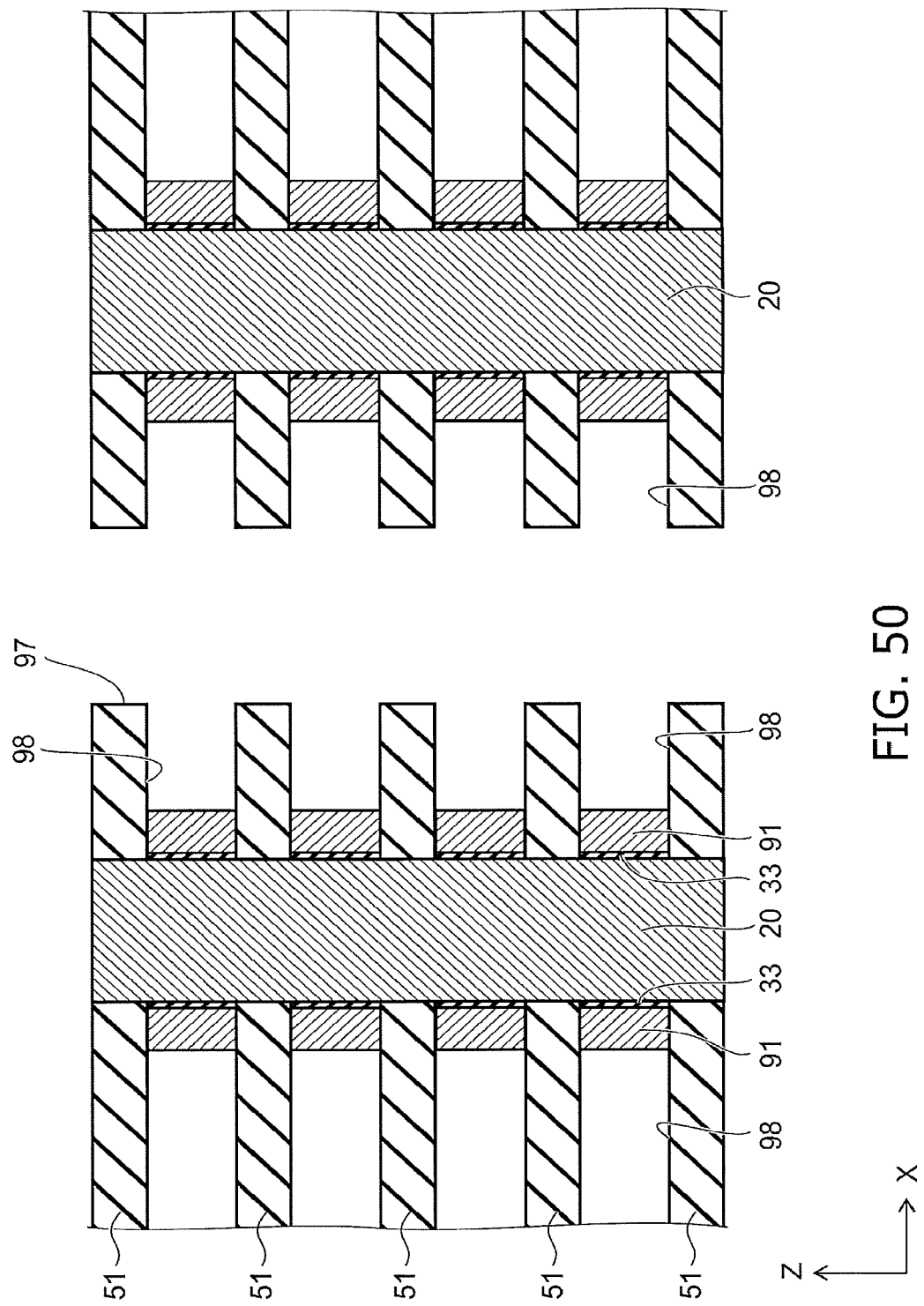

Then, as shown in FIG. 50, the silicon nitride films 52 are removed by performing wet etching via the trench 97. Thereby, recesses 98 are made at the inner surface of the trench 97. The polysilicon layers 91 are exposed at the back surfaces of the recesses 98.

Figure 51:
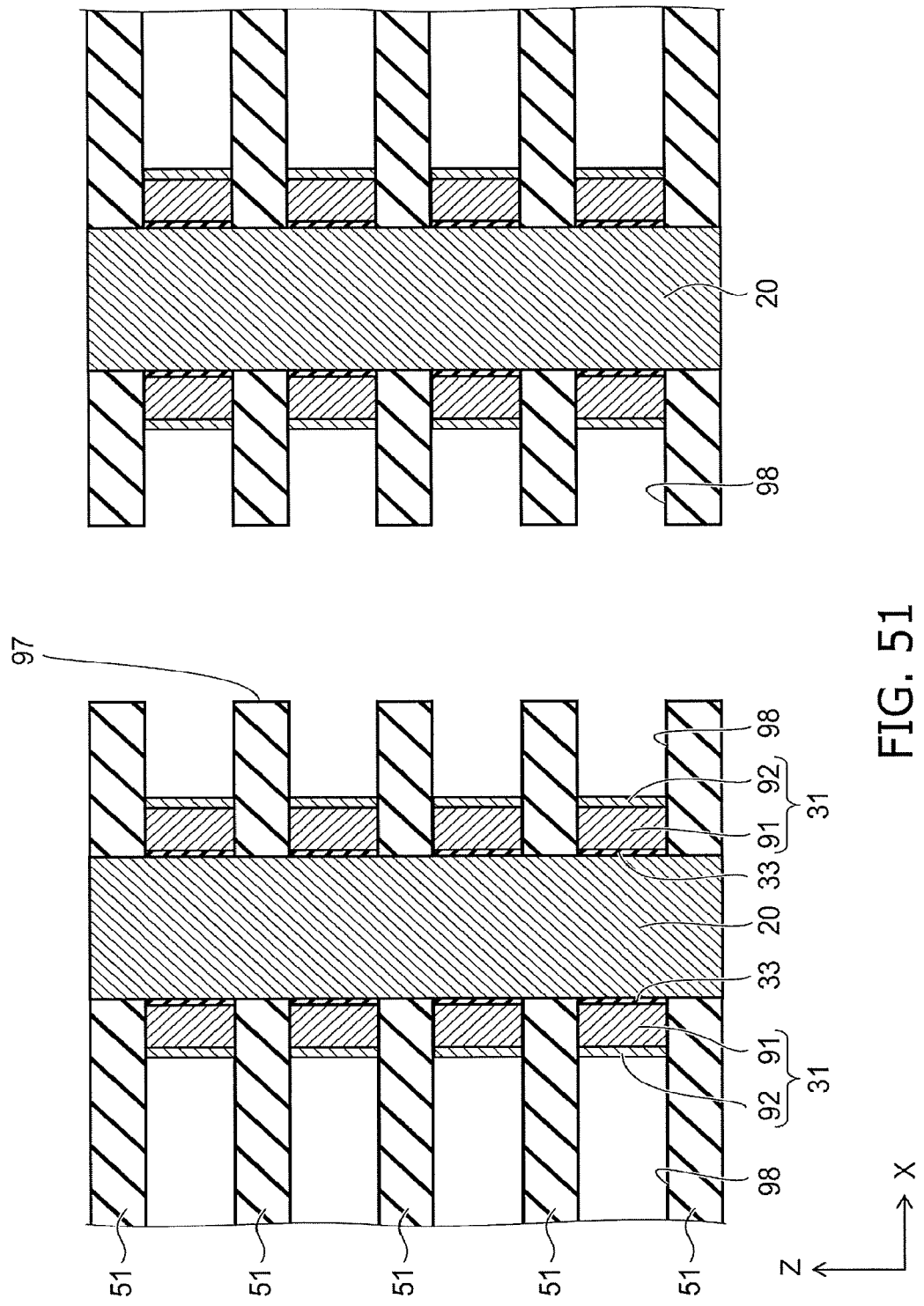

Continuing as shown in FIG. 51, the exposed surfaces of the polysilicon layers 91 inside the recesses 98 are silicided by siliciding via the trench 97 and the recesses 98. Thereby, the metal silicide layers 92 are formed. The floating gate electrode film 31 includes the polysilicon layer 91 and the metal silicide layer 92.

Figure 52:
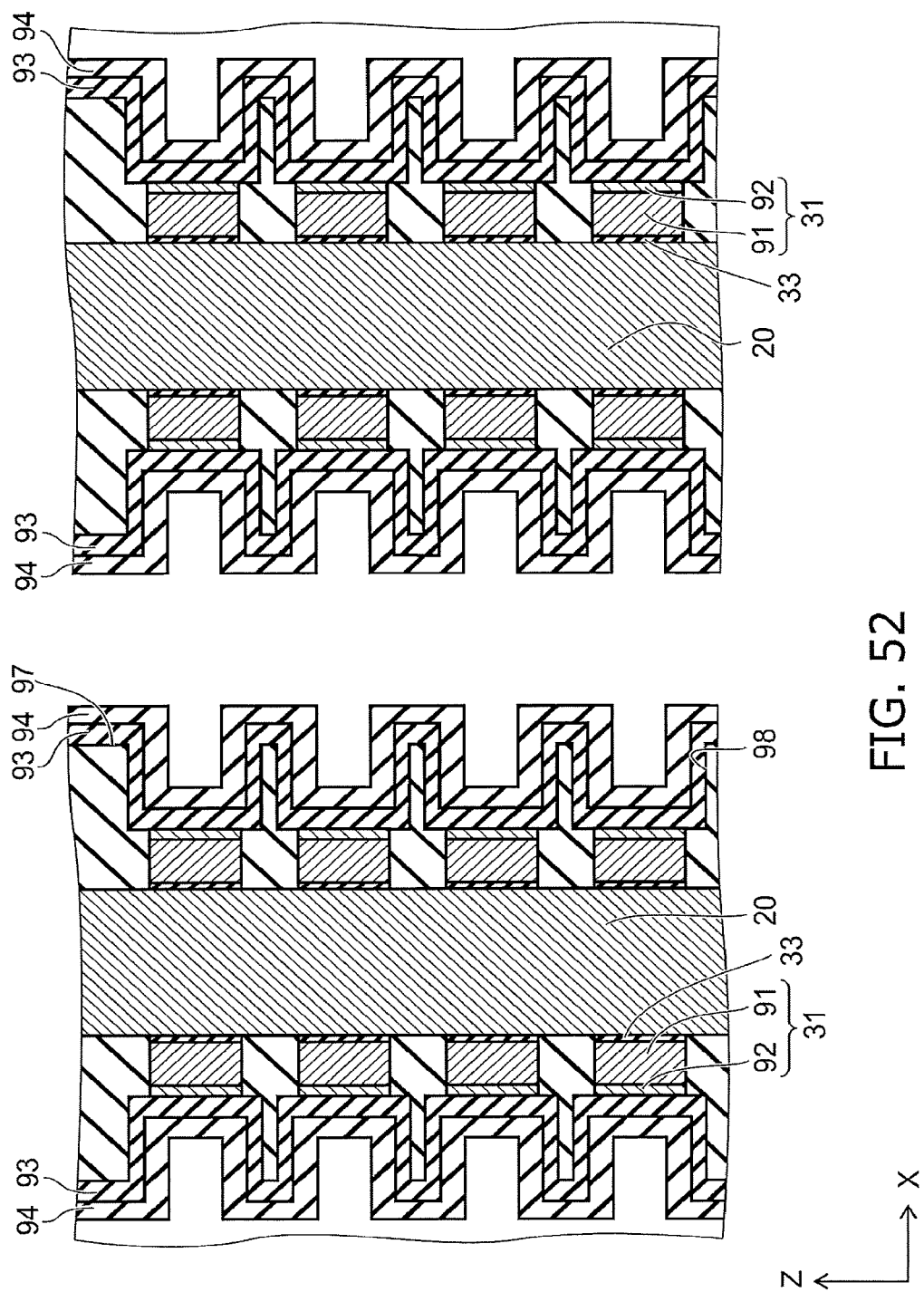

Then, as shown in FIG. 52, the silicon oxide layer 93 is formed on the inner surface of the trench 97. Then, the high dielectric constant layer 94 is formed on the silicon oxide layer 93. The silicon oxide layer 93 and the high dielectric constant layer 94 have circular tubular bellows-like configurations reflecting the recesses 98.

Figure 53:
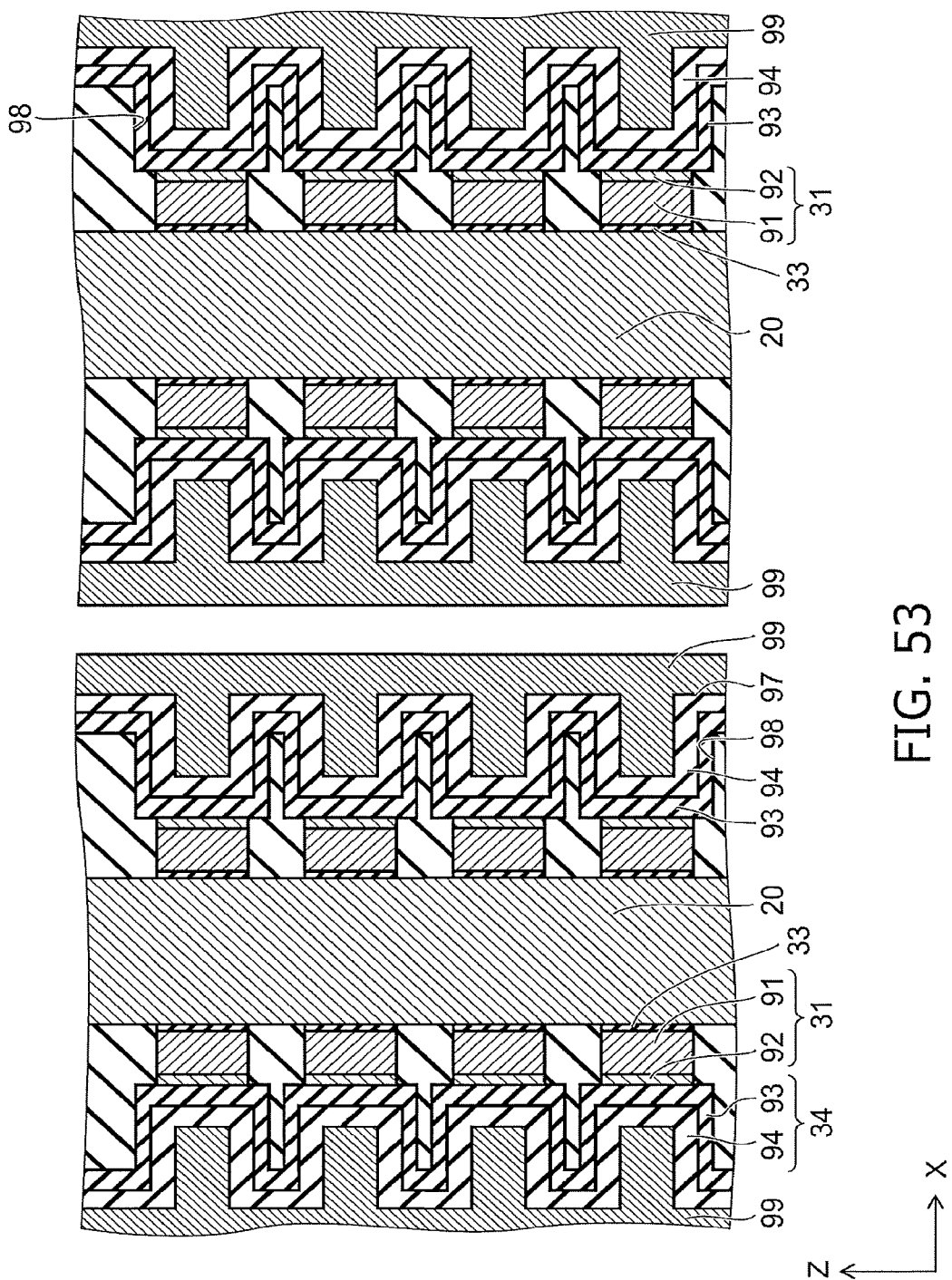

Continuing as shown in FIG. 53, a conductive film 99 is formed on the high dielectric constant layer 94 by depositing a conductive material by, for example, CVD. The conductive film 99 also is filled into the recesses 98 but is formed such that the trench 97 is not filled.

Then, as shown in FIG. 43 and FIG. 44, the conductive film 99 and the high dielectric constant layer 94 are recessed by performing isotropic etching such that the conductive film 99 and the high dielectric constant layer 94 remain only inside the recesses 93a of the silicon oxide layer 93. Thereby, the conductive films 99 that remain inside the recesses 93a become the control gate electrode films 21. Also, the blocking insulating film 34 is formed of the silicon oxide layer 93 and the remaining portion of the high dielectric constant layer 94. Thus, the semiconductor memory device 5 according to the embodiment is manufactured.

Effects of the embodiment will now be described.

According to the embodiment, memory cells having good controllability can be realized because the control gate electrode films 21 are provided around the floating gate electrode films 31 and the silicon pillar 20.

The programming characteristics are good because the floating gate electrode films 31 are formed of conductors. Also, because the floating gate electrode films 31 are separated from each other, the movement of the charge is suppressed; and the data retention characteristics are high. The erasing characteristics are good because the erasing operations can be implemented by FN erasing or assisted erasing from the floating gate electrode films 31.

In the embodiment, it is unnecessary to remove the tunneling insulating film 33 formed on the bottom surface of the memory hole 95 by etching because the silicon pillar 20 is connected to the cell source line 15 (referring to FIG. 2) because the tunneling insulating film 33 is formed in the process shown in FIG. 47 prior to forming the silicon pillar 20 in the process shown in FIG. 48. Therefore, the tunneling insulating films that are formed on the side surface of the memory hole 95 are not damaged by the etching.

Otherwise, the configuration, the manufacturing method, the operations, and the effects of the embodiment are similar to those of the first embodiment described above. Although an I-shaped pillar type device is illustrated in the embodiment, a U-shaped pillar type device may be used similarly to the first modification of the second embodiment described above.

Modification of Fifth Embodiment

A modification of the fifth embodiment will now be described.

Figure 54:
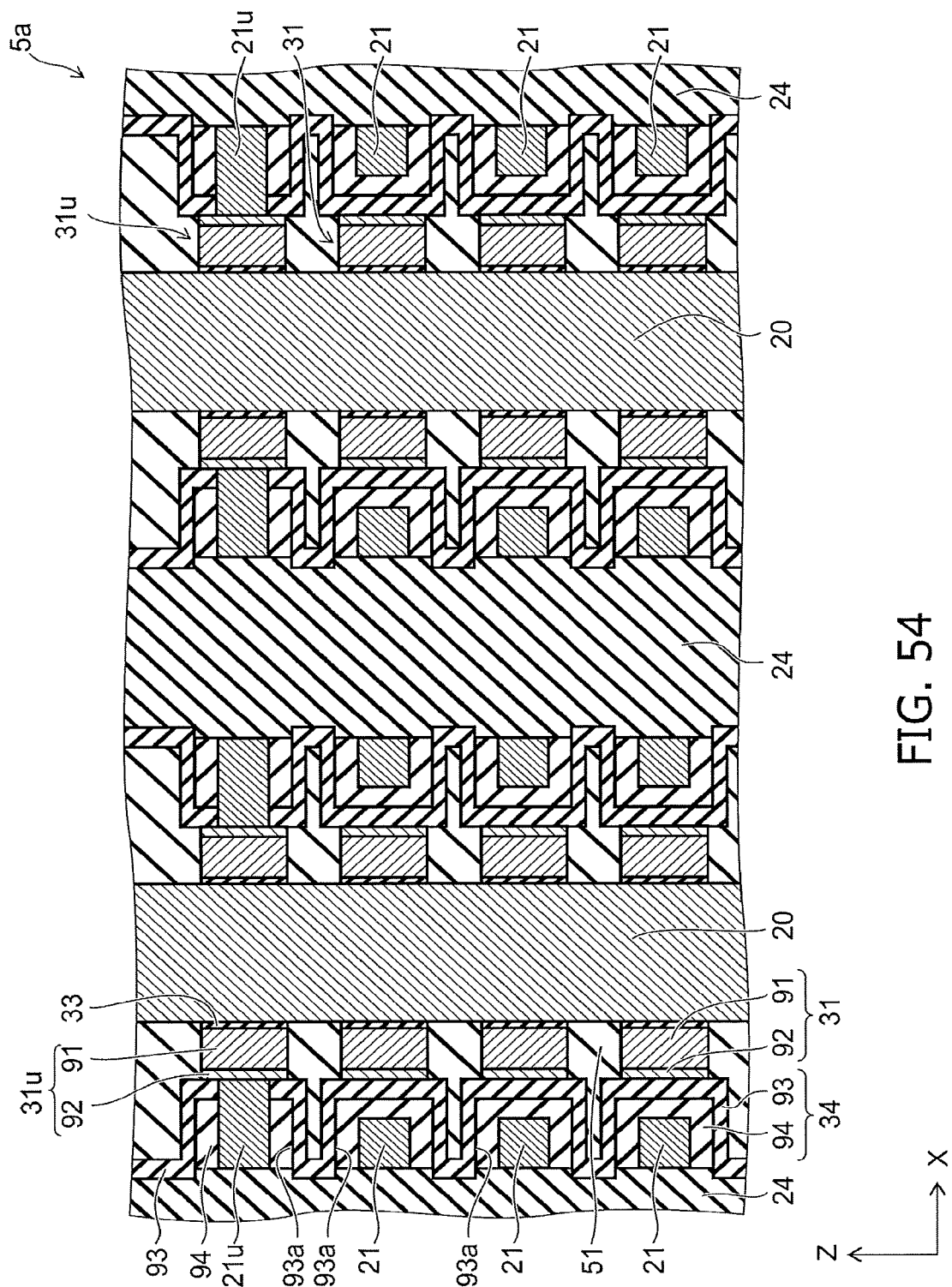
FIG. 54 is a cross-sectional view showing a semiconductor memory device according to a modification of the fifth embodiment.

FIG. 54 is a cross-sectional view showing a semiconductor memory device according to the modification.

As shown in FIG. 54, the modification is an example in which the fourth embodiment and the fifth embodiment described above are combined. Namely, the semiconductor memory device 5a according to the modification differs from the semiconductor memory device 5 (referring to FIG. 43) according to the fifth embodiment described above in that the blocking insulating film 34 is not disposed between the control gate electrode film 21u of the uppermost level and the floating gate electrode film 31u of the uppermost level; and the control gate electrode film 21u of the uppermost level is connected to the floating gate electrode film 31u of the uppermost level. However, the level at which the control gate electrode film 21 is connected to the floating gate electrode film 31 is not limited to the uppermost level and may be multiple levels including the uppermost level.

A method for manufacturing the semiconductor memory device according to the modification will now be described.

Figure 55:
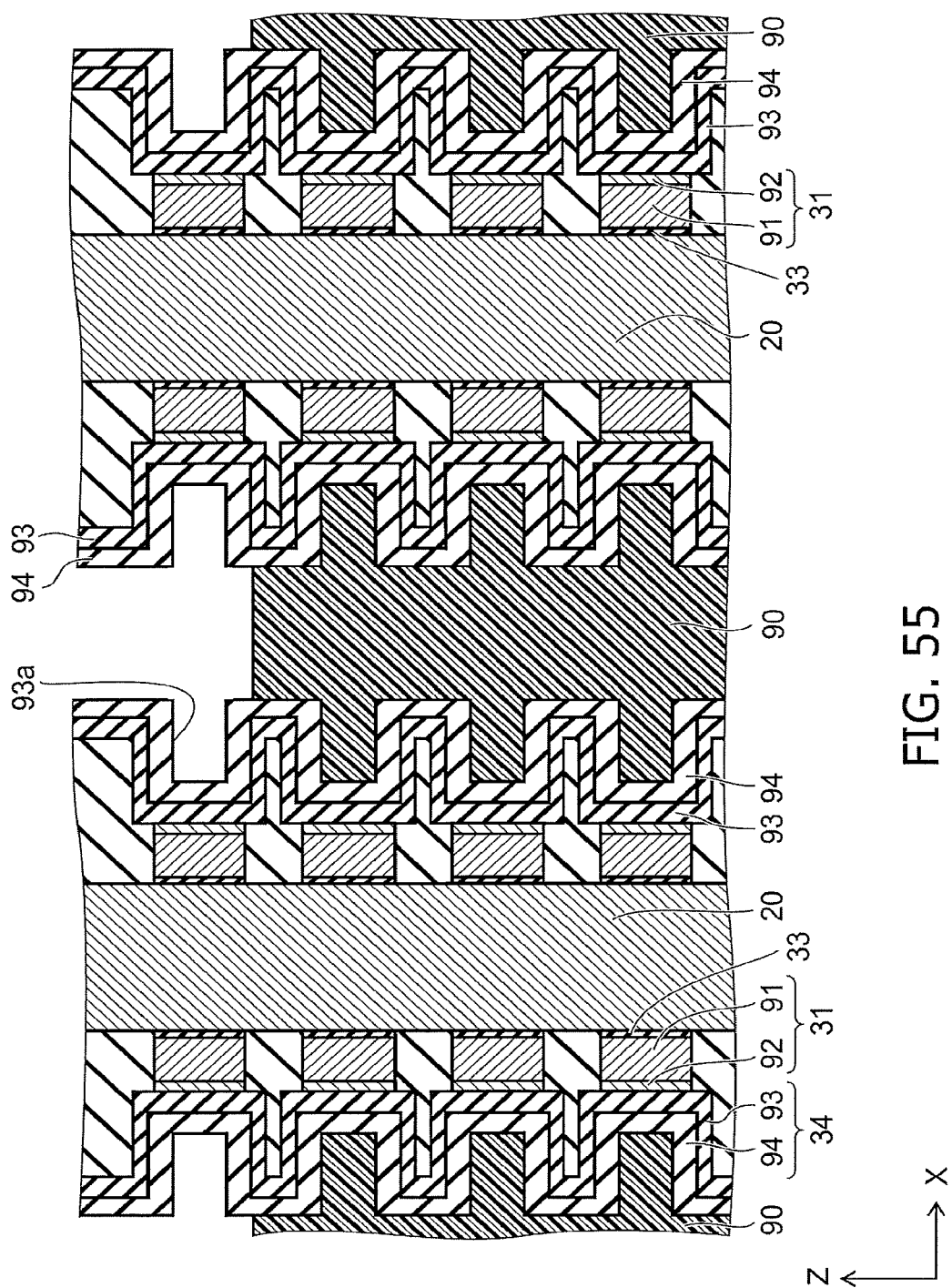
FIG. 55 to FIG. 57 are cross-sectional views showing the method for manufacturing the semiconductor memory device according to the modification of the fifth embodiment.
Figure 56:
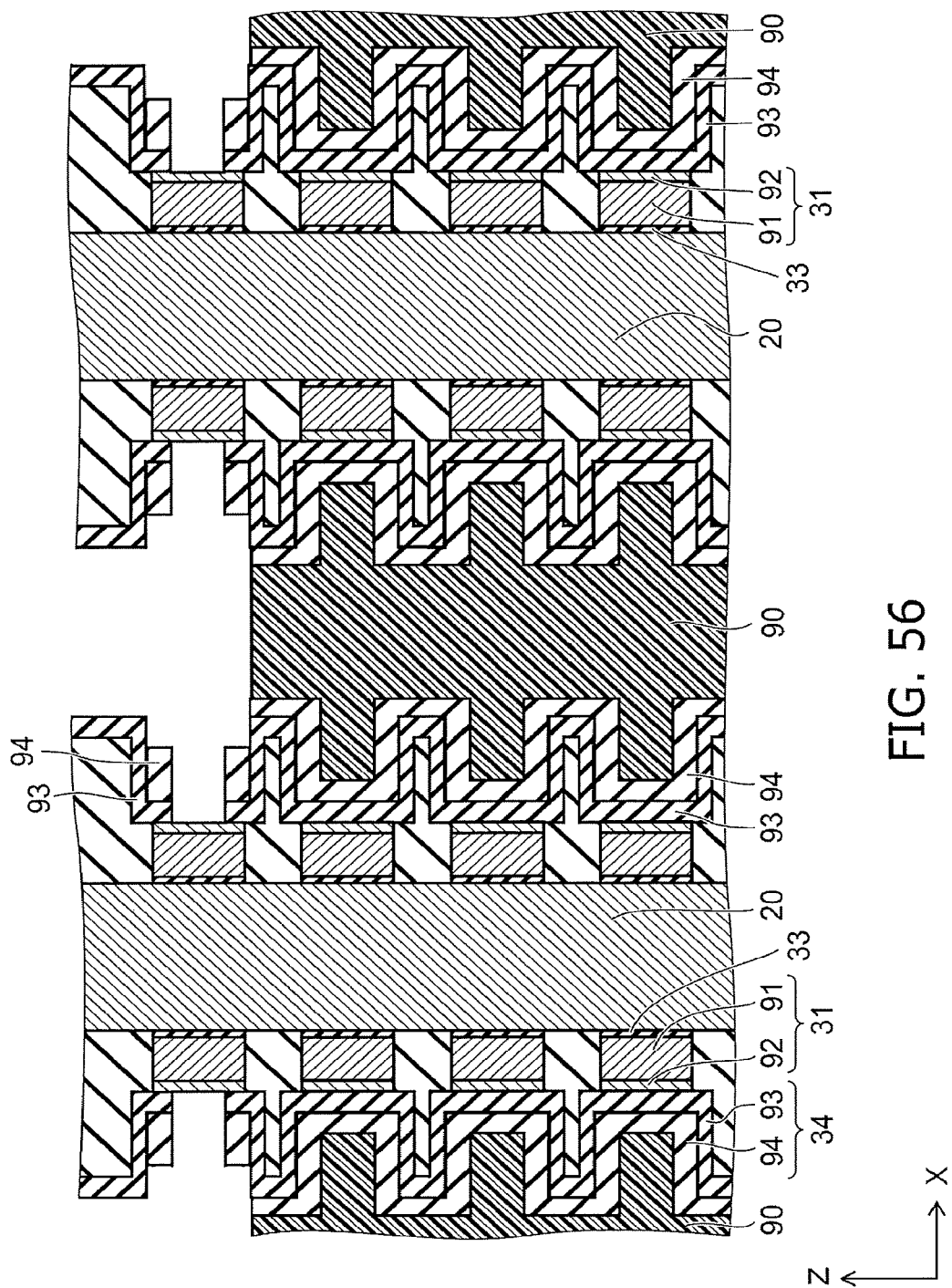
Figure 57:
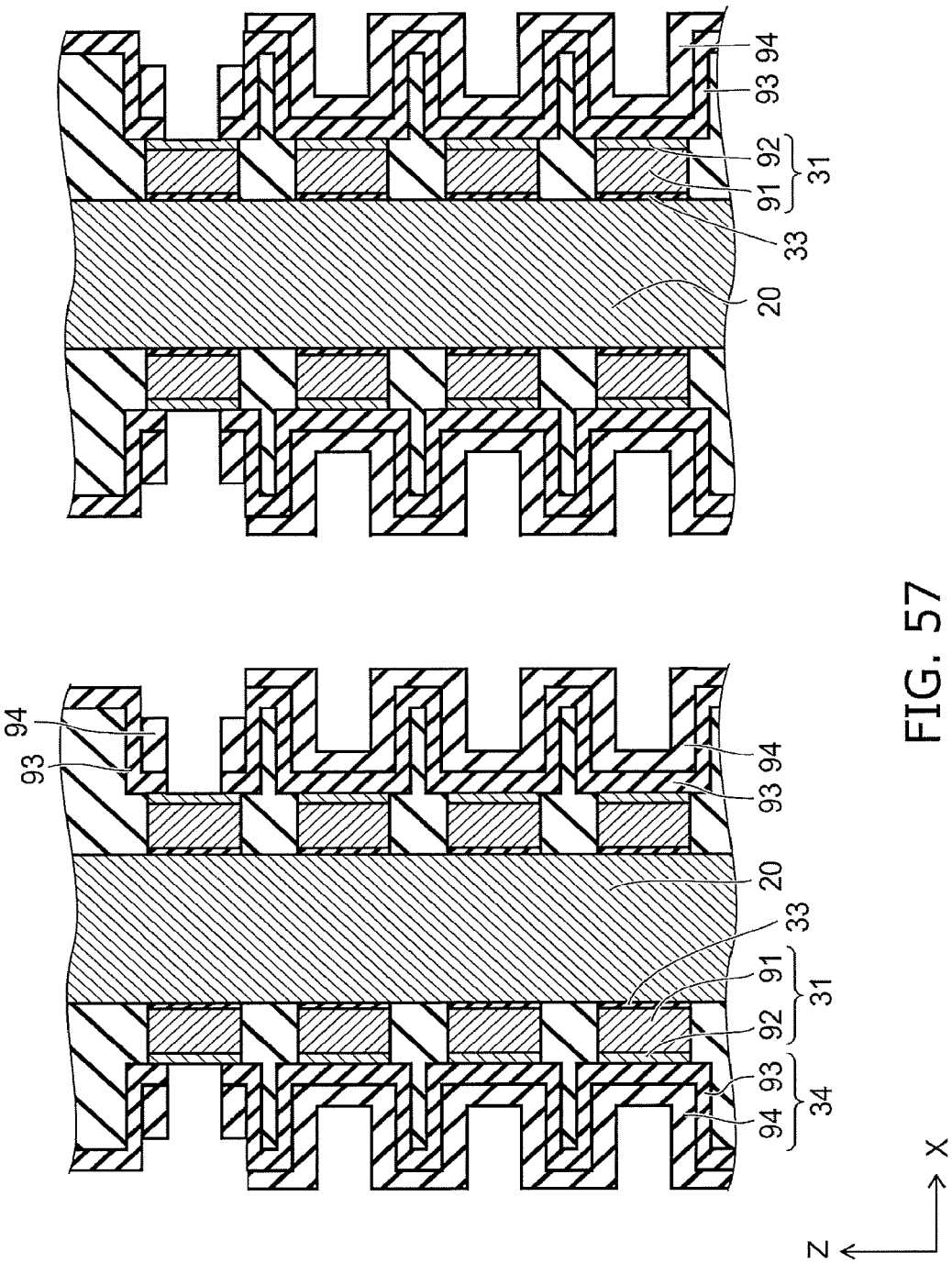

FIG. 55 to FIG. 57 are cross-sectional views showing the method for manufacturing the semiconductor memory device according to the modification.

First, the processes shown in FIG. 45 to FIG. 52 are implemented.

Then, as shown in FIG. 55, the resist material 90 is filled into the trench 97 and recessed from the upper surface side by exposing. Thereby, the recess 93a of the uppermost level is exposed from the resist material 90. Although the recesses 93a of multiple levels including the uppermost level may be exposed at this time, in the description hereinbelow, an example is described in which only the recess 93a of the uppermost level is exposed.

Continuing as shown in FIG. 56, the portions of the high dielectric constant layer 94 and the silicon oxide layer 93 exposed from the resist material 90 are removed by performing isotropic etching such as, for example, wet etching, etc. Thereby, the metal silicide layer 92 is exposed at the back surface of the recess 93a of the uppermost level.

Then, as shown in FIG. 57, the resist material 90 is removed.

Continuing, the process shown in FIG. 53 is implemented. Thus, the semiconductor memory device 5a according to the modification can be manufactured.

According to the modification, similarly to the fourth embodiment described above, the control gate electrode film 21u and the floating gate electrode film 31u of the uppermost level can be electrically integrated to be used as the selection gate electrode film. As a result, a selection gate transistor can be formed in which the threshold does not fluctuate. Otherwise, the configuration, the manufacturing method, the operations, and the effects of the modification are similar to those of the fifth embodiment described above.

Sixth Embodiment

A sixth embodiment will now be described.

Figure 58:
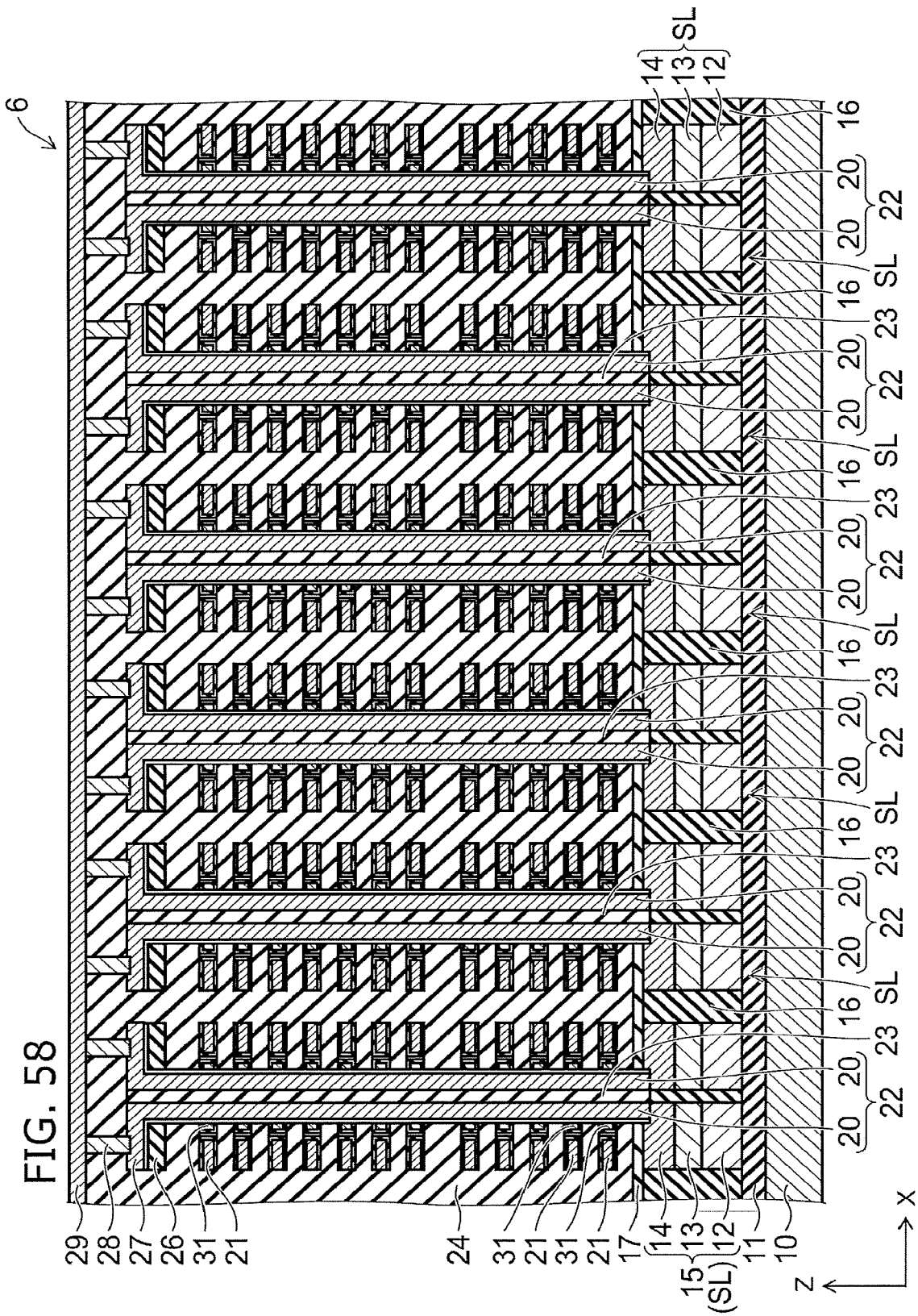
FIG. 58 to FIG. 59 are cross-sectional views showing a semiconductor memory device according to a sixth embodiment.
Figure 59:
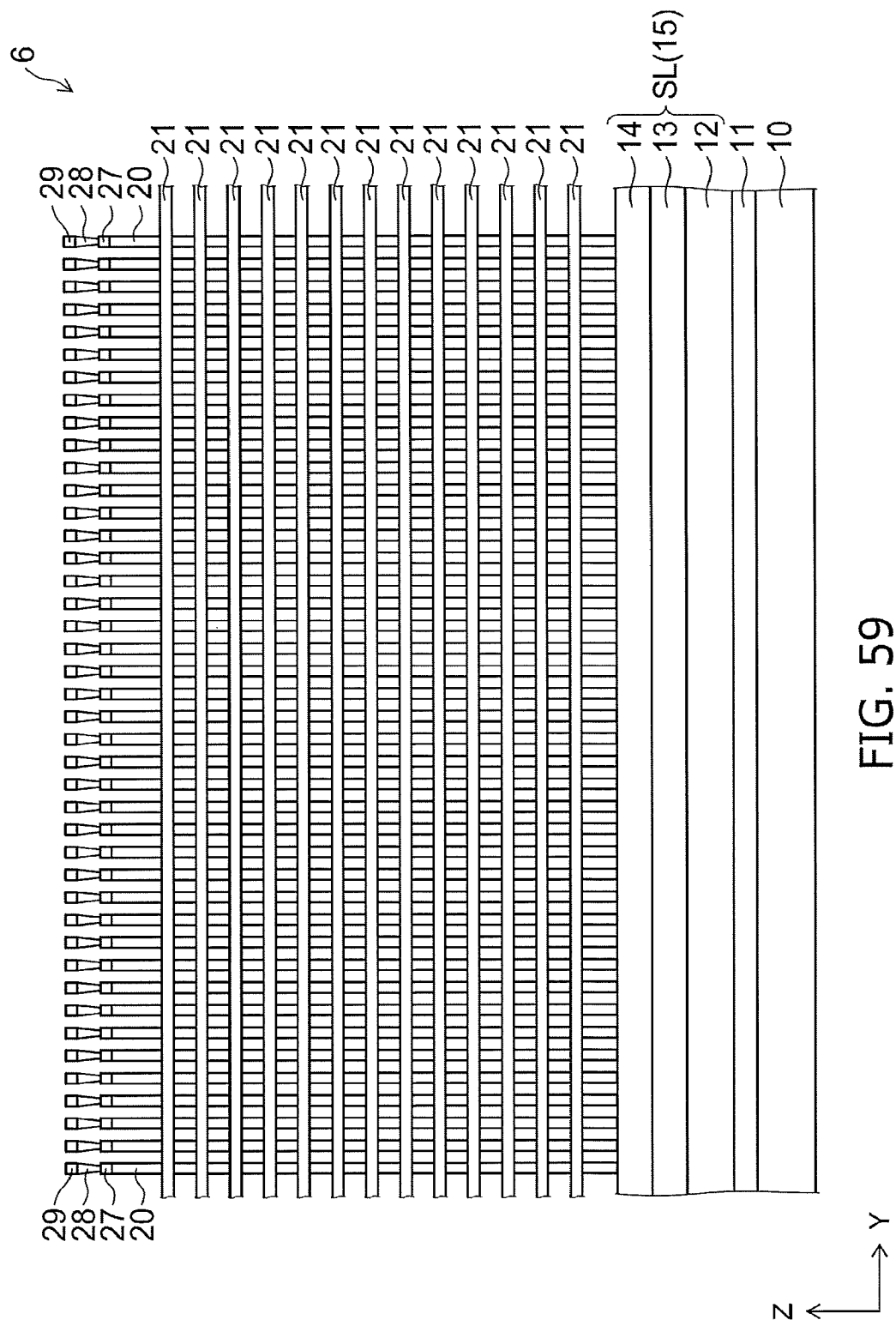

FIG. 58 and FIG. 59 are cross-sectional views showing a semiconductor memory device according to the embodiment.

Figure 60:
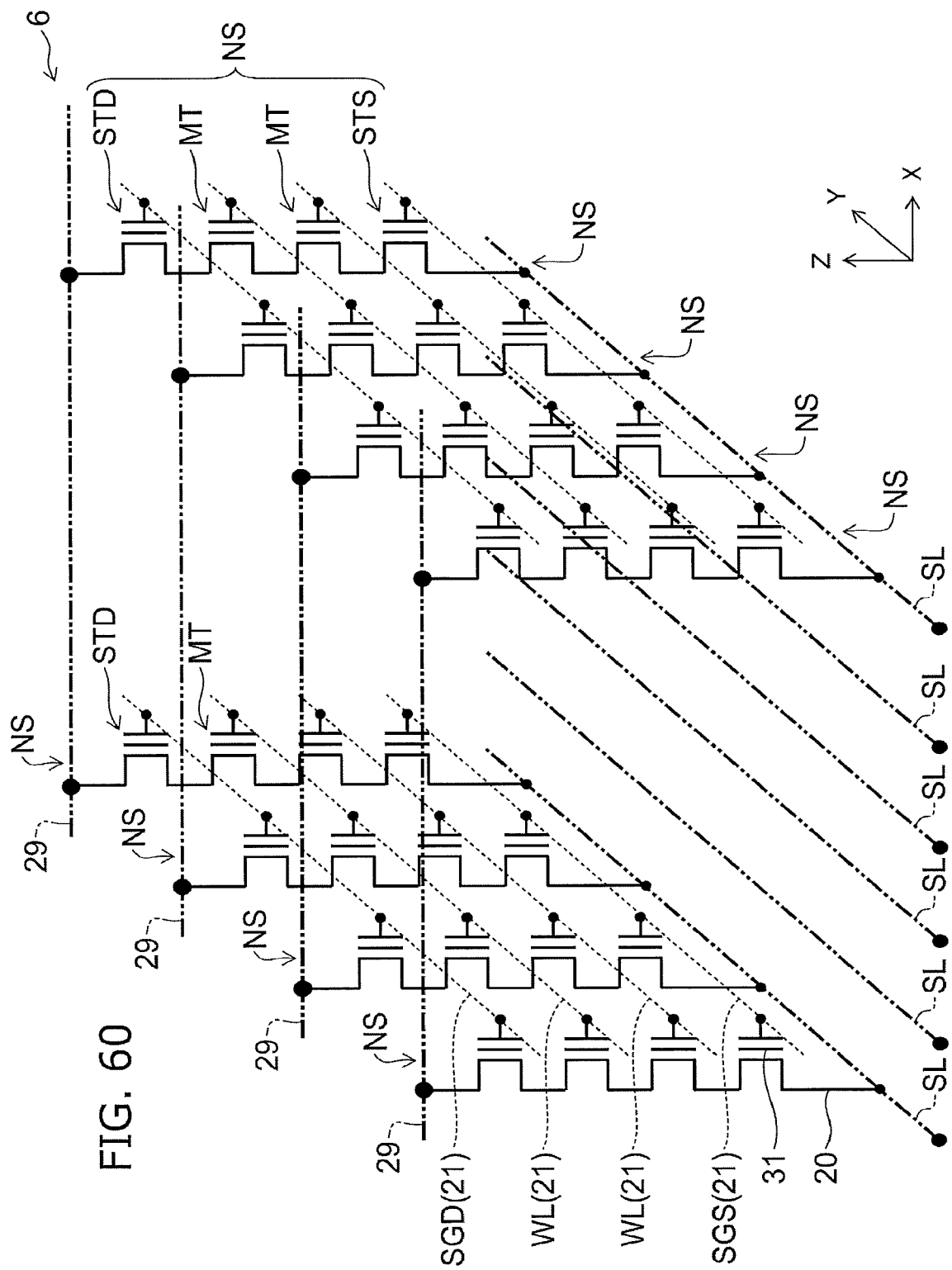
FIG. 60 is a schematic circuit diagram showing the semiconductor memory device according to the sixth embodiment.

FIG. 60 is a schematic circuit diagram showing the semiconductor memory device according to the embodiment.

Figure 61:
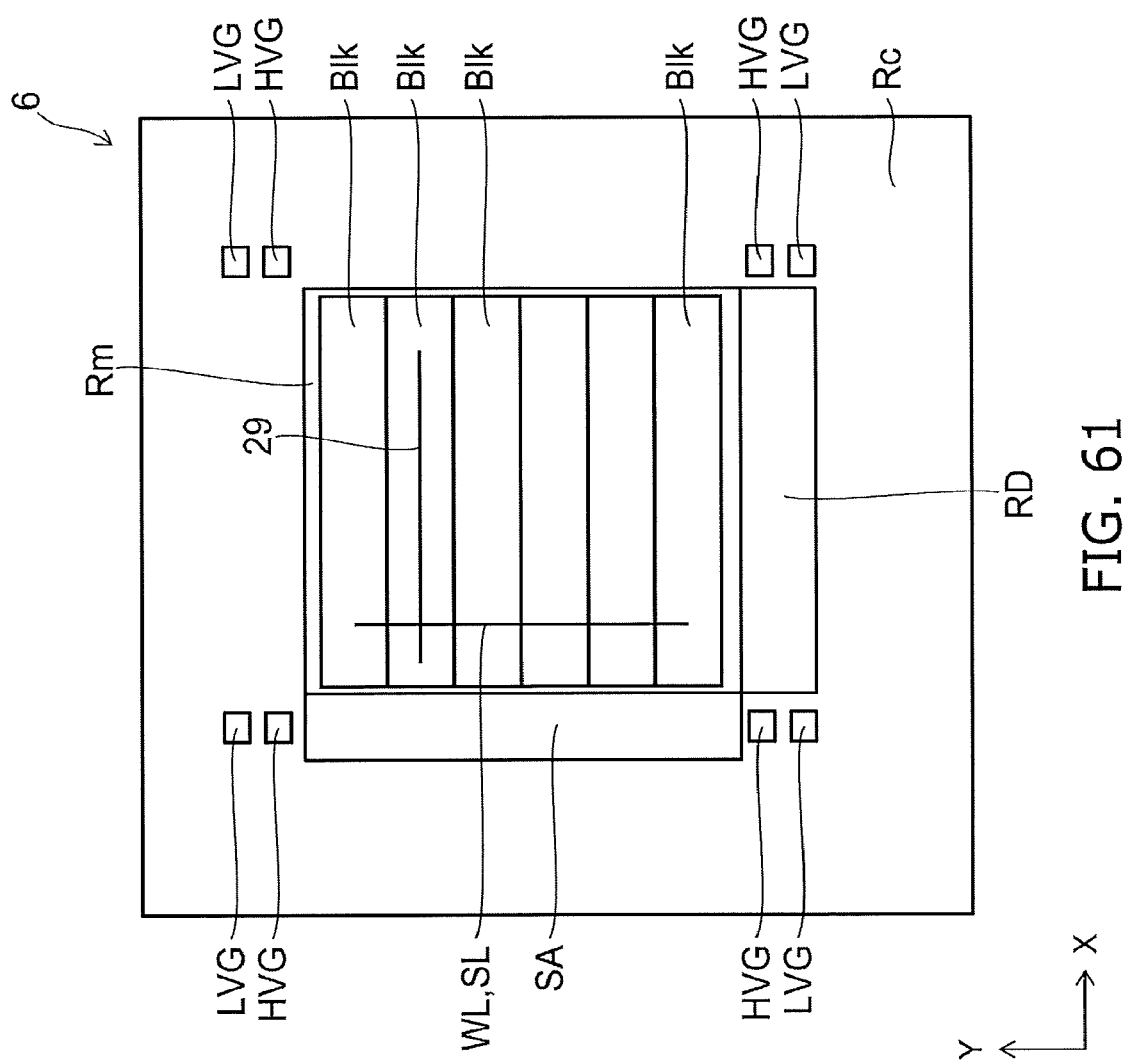
FIG. 61 is a schematic plan view showing the semiconductor memory device according to the sixth embodiment.

FIG. 61 is a schematic plan view showing the semiconductor memory device according to the embodiment.

Figure 62:
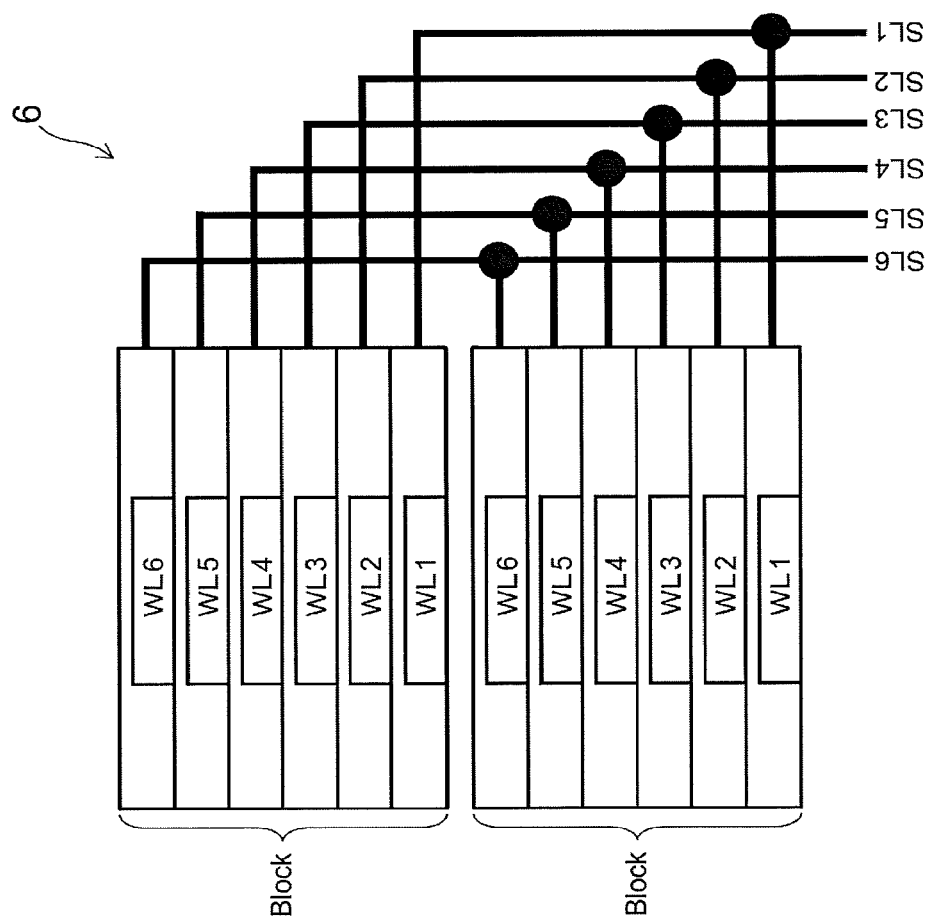
FIG. 62 shows connection relationship of the cell source lines in the semiconductor memory device according to the sixth embodiment.

FIG. 62 shows connection relationship of cell soured lines in the semiconductor memory device according to the embodiment.

In FIG. 59, for convenience of viewing the drawing, conductive members are mainly shown and insulating members are omitted. In FIG. 60, the control gate electrode films 21 are shown by broken lines and the source lines SL and the bit lines 29 are shown by two-dot chain lines. NAND strings connected to the source line SL disposed at both ends shown in the drawing are only shown and others are omitted. Furthermore, four levels of the control gate electrode films 21 are only shown.

As shown in FIG. 58 and FIG. 59, a semiconductor memory device 6 according to the embodiment is different from the semiconductor memory device 1 (see FIG. 1 to FIG. 4) according to the first embodiment described above in a point that the cell source line 15 is divided into multiple portions. Hereinafter, each portion of the divided cell source lines 15 is referred to as "source line SL". The source line SL extends in the Y-direction being the same as the direction of the control gate electrode films 21, and is provided every column of the silicon pillars 20 arranged in line along the Y-direction. The source line SL is provided every multiple control gate electrode film 21 arranged in line along the Z-direction. An insulating film 16 is buried between the source lines SL. The insulating film 16 is formed of, for example, the silicon oxide.

As shown in FIG. 60, in the semiconductor memory device 6, the control gate electrode film 21 of the uppermost level is taken as the selection gate line SGD, the control gate electrode film 21 of the lower most level is taken as the selection gate line SGS, and other control electrode films 21 are taken as the word lines WL. As shown in FIG. 1, the multiple word lines WL arranged along the X-direction are connected one another at an end in the Y-direction. The multiple selection gate lines SGS of the lower most level arranged along the X-direction are also connected one another at the end in the Y-direction. On the other hand, the selection gate lines SGD of the uppermost level arranged in the X-direction are not connected one another, and an independent potential can be applied to each of them.

A memory cell transistor MT including the tunnel insulating film 33, the floating gate electrode film 31 and the block insulating film 34 is formed at an intersecting portion of the silicon pillar 20 and the word line WL. An upper selection transistor STD is formed at an intersecting portion of the silicon pillar 20 and the selection gate line SGD of the uppermost level. A lower selection transistor STS is formed at an intersecting portion of the silicon pillar and the selection gate line SGS of the lower most level.

The upper selection transistor STD, the multiple memory cell transistors MT and the lower selection transistor STS formed along one silicon pillar 20 are connected in series between the bit line 29 and the source line SL to form one NAND string NS. The NAND strings NS are arranged in a matrix configuration along the X-direction and the Y-direction. The NAND strings NS arranged in line along the Y-direction are connected to the same source line SL, and are connected to different bit lines 29, respectively. The NAND strings NS arranged in line along the X-direction are connected to different source lines SL, respectively, and are connected to the same bit line BL.

As shown in FIG. 61, in a semiconductor memory device 6, a shape of a memory cell region Rm is rectangular. Multiple blocks Blk arranged along the Y-direction are provided in the memory cell region Rm. A row decoder RD and a sensing amplifier SA are provided in a region in the vicinity of the memory cell region Rm in a peripheral circuit region Rc. The row decoder RD is located in the Y-direction viewed from the memory cell region Rm, and is connected to the word line WL. The sensing amplifier SA is located in the X-direction viewed from the memory cell region Rm, and is connected to the bit line 29(BL).

A high potential output circuit HVG and a low potential output circuit LVG are provided in the peripheral circuit region Rc. The high potential output circuit HGV and the low potential output circuit LVG are provided, for example, in 4 levels, and are disposed near 4 corners of the memory cell region Rm, respectively. For example, one pair of high potential output circuit HVG and low potential output circuit LVG are disposed on the X-direction side viewed from the row decoder RD and on the Y-direction side viewed from the sensing amplifier SA. The high potential output circuit HVG and the low potential output circuit LVG are circuits outputting source line potentials Vs1 of two levels applied to the source line SL, the high potential output circuit HVG outputs a relatively high potential, and the low potential output circuit LVG outputs a relatively low potential, for example, a ground potential.

As shown in FIG. 62, in each block, the source lines SL provided respectively on regions directly below the word lines of which positions in the X-direction are different one another are not connected one another. On the other hand, the source lines SL disposed in blocks which are different one another and disposed on regions directly below the word lines corresponding to each other are connected each other. For example, the source line SL1 disposed on the region directly below the word line WL1 belonging to the first block and the source line SL2 disposed on the region directly below the word line WL2 belonging to the first block are not connected each other. On the other hand, the source line SL1 disposed on the region directly below the word line WL1 belonging to the first block and the source line SL1 disposed on the region directly below the word line WL1 belonging to the second block are connected each other.

A driving method of the semiconductor memory device according to the embodiment will now be described.

FIG. 63A is a schematic circuit diagram showing the selection NAND string and the non-selection NAND string, FIG. 63B shows a potential applied to the selection NAND string, and FIG. 63C shows a potential applied to the non-selection NAND string.

As shown in 63A, the case where data are read out from one memory cell transistor MT will be described. Hereinafter, this memory cell transistor MT is described as "selection cell MT0", and the memory cell transistor MT other than that is described as "non-selection cell MT1". The NAND string NS including the selection cell MT0 is described as "selection string NS0", and the NAND string NS other than that is described as "non-selection string NS1". FIG. 63B and FIG. 63C show potentials applied to the selection NAND string NS0 and the non-selection NAND string NS1 which is connected to the same bit line.

As shown in FIG. 63A to FIG. 63C, for example, 0.2 to 0.5 V (Volt) is applied to the selected bit line 29 as a bit line potential Vb1. The bit line potential Vb1 is not applied to the bit line 29 other than that.

As shown in FIG. 63B, a relatively low source potential output from the low potential output circuit LUG, for example, 0 V (zero volt) is applied to the source line SL connected to the selection string NS0 as the source line potential Vs1. Thereby, for example, a low potential difference of approximately 0.2 to 0.5 V is applied between the bit line 29 connected to the selection string NS0 and the source line SL. In this state, for example, 2.5 to 4 V is applied to the selection gate lines SGD and SGS as selection gate potentials Vsgd and Vsgs. Thereby, the upper selection transistor STD and the lower selection transistor STS of the selection string NS0 come into ON state, respectively.

For example, 4.5 to 7 V is applied to the non-selection word line WL forming the non-selection cell MT1 as a read out potential Vread. The read out potential Vread is a potential such that the memory cell transistor MT comes into ON state with no relation to a value held by the memory cell transistor MT. On the other hand, a potential lower than the read out potential Vread, for example, 0 to 5 V is applied to the selection word line WL forming the selection cell MT0 as a word line potential Vw1. The word line potential Vw1 is a potential such that a conduction state of the memory cell transistor MT is different depending on the value held by the memory cell transistor MT. In this state, a current passing through between the bit line 29 and the source line SL via the selection string NS0 is detected, and thereby a value programed into the selection cell MT0 can be read out.

At this time, a voltage is caused to be applied to the non-selection string NS connected to the same bit line 29 as the selection string NS0 between the bit line 29 and the source line SL as well as the selection string NS0. Then, as shown in FIG. 63C, for example, 0 V is applied to the selection gate line SGD of the non-selection string NS1 as the selection gate potential Vsgd. Thereby, the upper selection transistor STD comes into OFF state and a current can be suppressed from passing through the non-selection string NS1.

However, because the same selection gate potential Vsgs is applied to all selection gate lines SGS belonging to the same block, the lower selection transistor STS of the non-selection string NS1 comes into OFF state. For this reason, the source potential Vs1 is applied to the silicon pillar 20 of the non-selection string NS1. Because the same potential is applied to the word lines WL in the same level, the read out potential Vread or the word line potential Vw1 is applied also to the word line WL of the non-selection string NS1. For this reason, when performing the read out operation of the selection cell MT0, a voltage of approximate intensity of (Vread-Vs1) is caused to be also applied to the non-selection cell MT belonging to the non-selection string NS1 between the silicon pillar 20 and the word line WL, and it is possible that an electron is injected into the floating gate electrode film 31 by this voltage and a value is caused to be programed. That is, the read disturb may occur.

Then in the embodiment, as shown in FIG. 63C, a voltage higher than the source line SL connected to the selection string NS0 (hereinafter referred to as "selection source line") is applied to the source line SL connected to the non-selection string NS1 (hereinafter, referred to as "non-selection source line") as the source line potential Vs1. More specifically, the relatively high source potential output from the high potential output circuit HVG is applied to the non-selection source line.

If the potential of the non-selection source line is set to be higher than the potential of the selection source line, it is possible that the voltage applied between the silicon pillar 20 and the word line WL is relaxed in the non-selection cell MT1, and the read disturb is suppressed. For example, in the case where the ground potential (0 V) is applied to the selection source line, and 4.5 to 7 V is applied to the word line WL as the read out voltage Vread, a potential higher than 0 V, preferably, a potential of 1 V or higher is applied to the non-selection source line.

The potential of the non-selection source line may be equal to the selection gate potential Vsgs. In this case, the lower selection transistor STS of the non-selection string NS1 comes into OFF state. At this time, because the upper selection transistor STD is also in OFF state, the silicon pillar 20 is separated from the source line SL and the bit line 29 to come into a floating state. Coupling with the word line WL increases the potential of the silicon pillar 20 to near the read out potential Vread. This also reduces the voltage between the silicon pillar 20 and the word line WL.

In the programming operation and the erasing operation, the same potential is applied to all source lines SL.

The effects of the embodiment will now be described.

As described above, in the embodiment, by dividing the cell source line 15 into multiple source lines SL, a potential higher than the selection source line connected to the selection string can be applied to the non-selection source line connected to the non-selection string. Thereby, it is possible that the voltage between the silicon pillar 20 and the word line WL is relaxed in the non-selection string and the read disturb is suppressed.

Otherwise, the configuration, the manufacturing method, the operations, and the effects of the embodiment are similar to those of the first embodiment described above.

Seventh Embodiment

A seventh embodiment will now be described.

Figure 64:
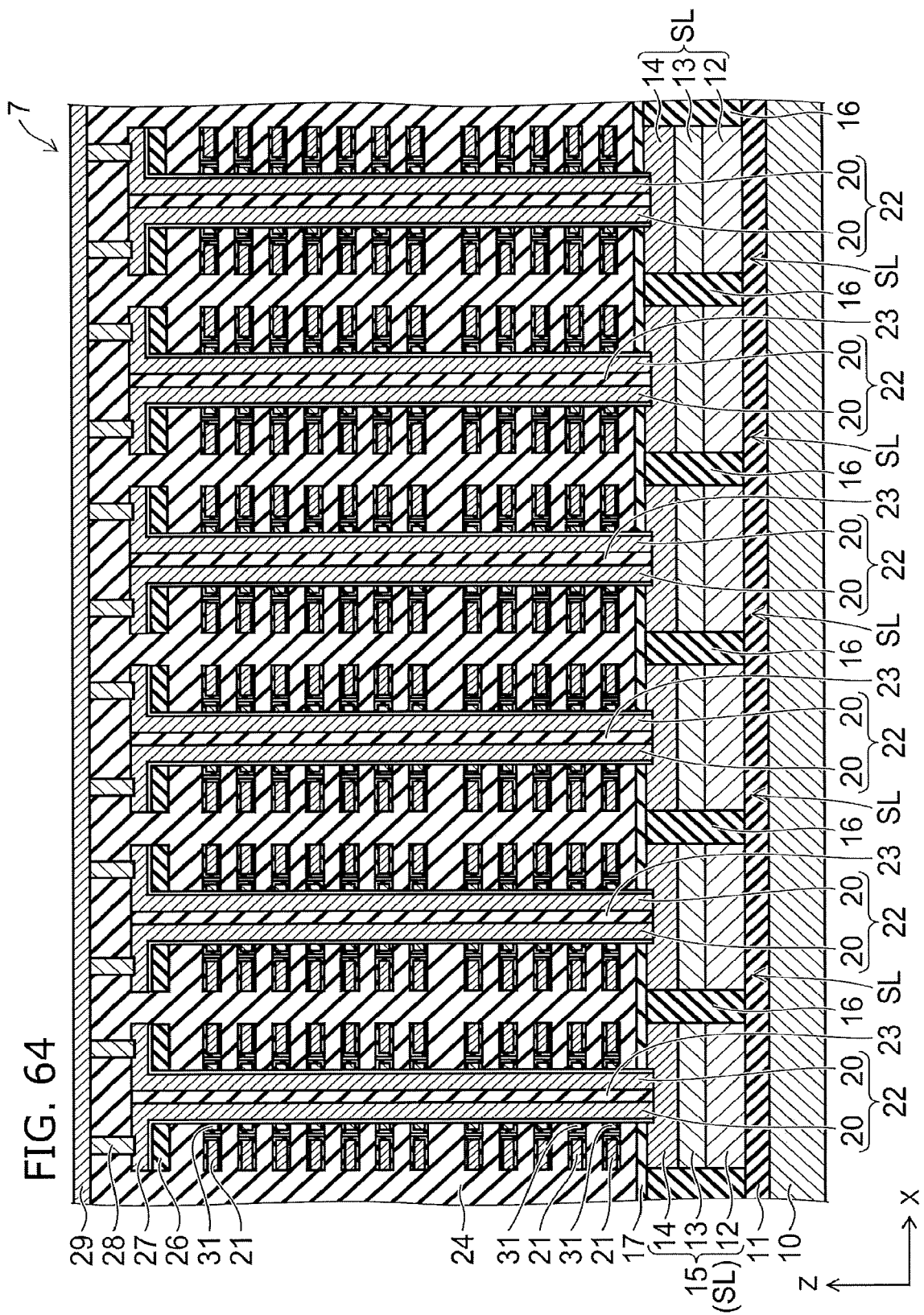
FIG. 64 is a cross-sectional view showing a semiconductor memory device according to a seventh embodiment.

FIG. 64 is a cross-sectional view showing a semiconductor memory device according to the embodiment.

Figure 65:
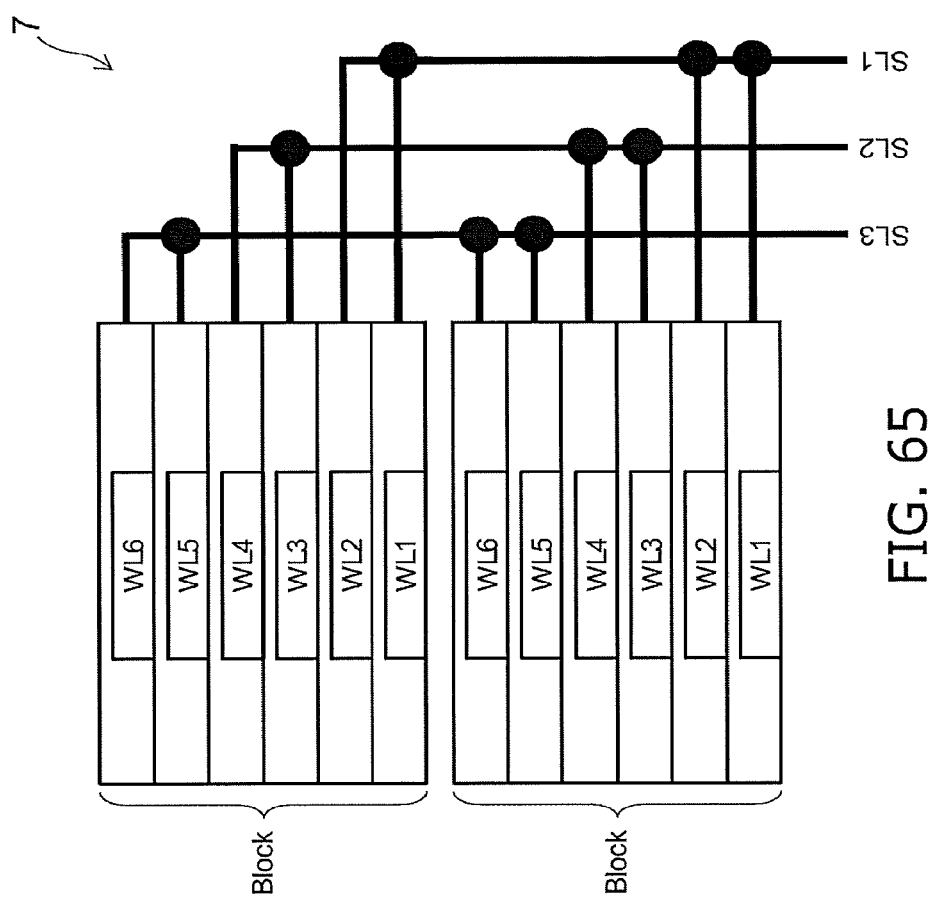
FIG. 65 shows connection relationship of the cell source lines in the semiconductor memory device according to the seventh embodiment.

FIG. 65 shows the connection relationship of cell source lines in the semiconductor memory device according to the embodiment.

As shown in FIG. 64 and FIG. 65, in the semiconductor memory device 7 according to the embodiment, one source line SL is provided every two rows NAND strings NS arranged along the Y-direction. That is, the multiple silicon pillars 20 arranged along the Y-direction are connected to the same source line SL, and the two adjacent silicon pillars 20 in the X-direction are connected to the same source line SL. For example, the two silicon pillars 20 sandwiching the interlayer insulating film 23 is connected to the same source line SL.

According to the embodiment, because each source line SL can be thick in comparison with the sixth embodiment described above, an interconnection resistance of the each source line SL can be reduced. This allows the semiconductor memory device 7 to operate with a high speed.

Otherwise, the configuration, the operations, and the effects of the embodiment are similar to those of the sixth embodiment described above.

Eighth Embodiment

An eighth embodiment will now be described.

Figure 66:
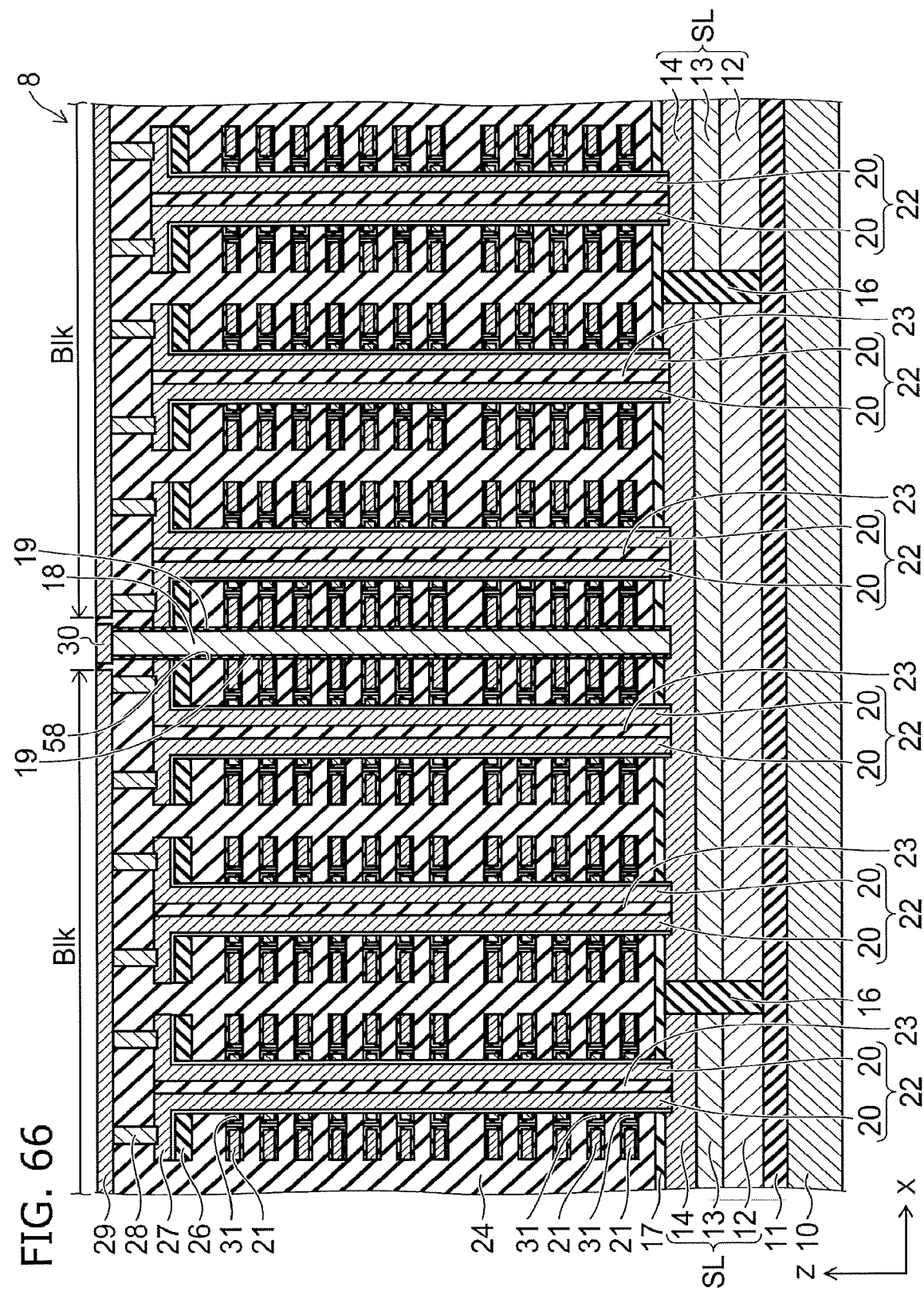
FIG. 66 is a cross-sectional view showing a semiconductor memory device according to an eighth embodiment.

FIG. 66 is a cross-sectional view showing a semiconductor memory device according to the embodiment.

Figure 67:
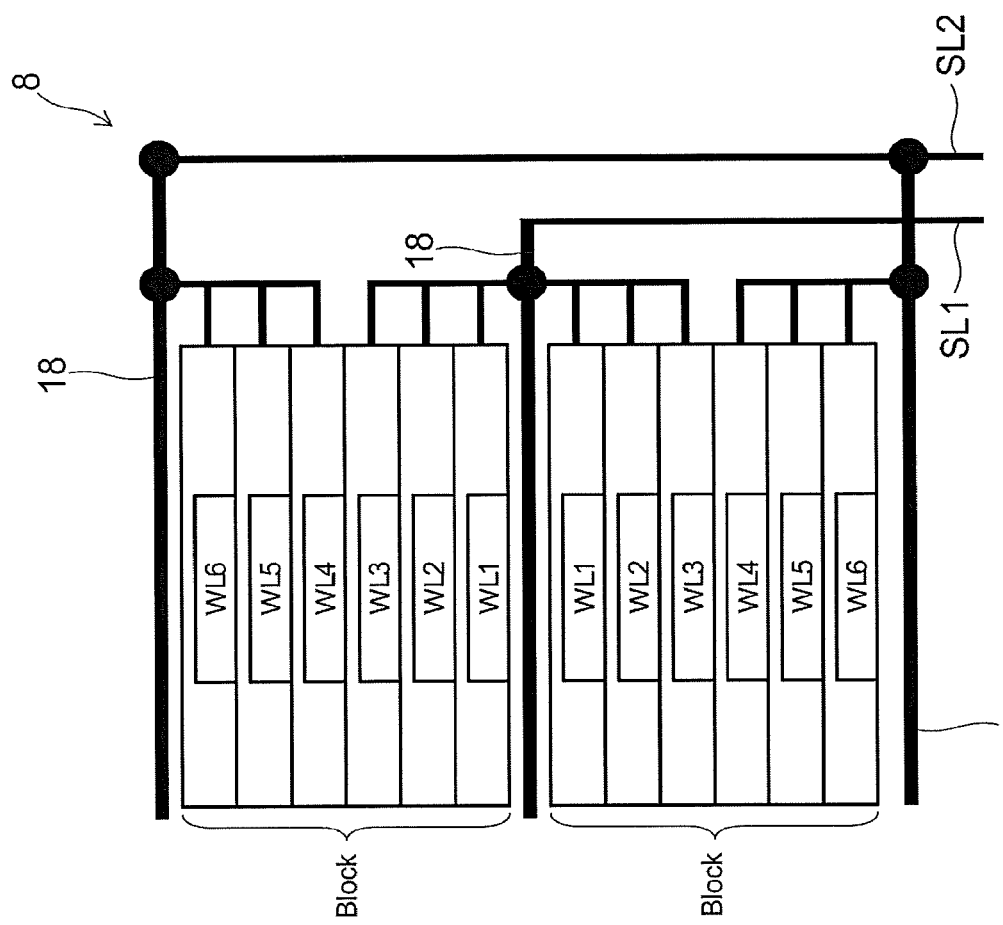
FIG. 67 shows connection relationship of the cell source lines in the semiconductor memory device according to the eighth embodiment.

FIG. 67 shows the connection relationship of cell source lines in the semiconductor memory device according to the embodiment.

As shown in FIG. 66 and FIG. 67, in the semiconductor memory device 8 according to the embodiment, there are two source lines SL belonging to each block Blk, and the source lines SL are shared in the adjacent blocks Blk. That is, the number of source lines SL is the same as the number of blocks Blk, and the source line and the block are arranged to be shifted by a half cycle.

In the trench 58 (see FIG. 11A) disposed between the blocks Blk, a conductive member 18 is provided. A group of the source lines SL which belong to the adjacent blocks Blk and are connected each other are disposed at a position sandwiching the conductive member 18. The conductive member 18 is plate-shaped and extends along the YZ plane, and its lower end is connected to the source line SL. An insulating film 19 is provided on both side surfaces of the conductive member 18, and isolates the conductive member 18 from the control gate electrode film 21. The source line SL connected to the conductive member 18 is connected to the silicon pillar 20 disposed on both sides in the X-direction viewed from the conductive member 18.

An upper layer source line 30 extending in the Y-direction is provided on the conductive member 18 and connected to an upper end of the conductive member 18. The upper layer source line 30 is possible to be connected to the high potential output circuit HVG and the low potential output circuit LUG. Thereby, the source potential is supplied to the source line SL from the high potential output circuit HVG or the low potential output circuit LUG via the upper layer source line 30 and the conductive member 18.

According to the embodiment, the resistance of the source line SL can be further reduced in comparison with the sixth and seventh embodiments. On the other hand, according to the sixth embodiment, because a relatively high source potential can be applied to all source lines other than the source line SL connected to the selection string NS0 in each block Blk, the read disturb can be effectively suppressed.

Otherwise, the configuration, the operations, and the effects of the embodiment are similar to those of the sixth embodiment described above.

Ninth Embodiment

A ninth embodiment will now be described.

Figure 68:
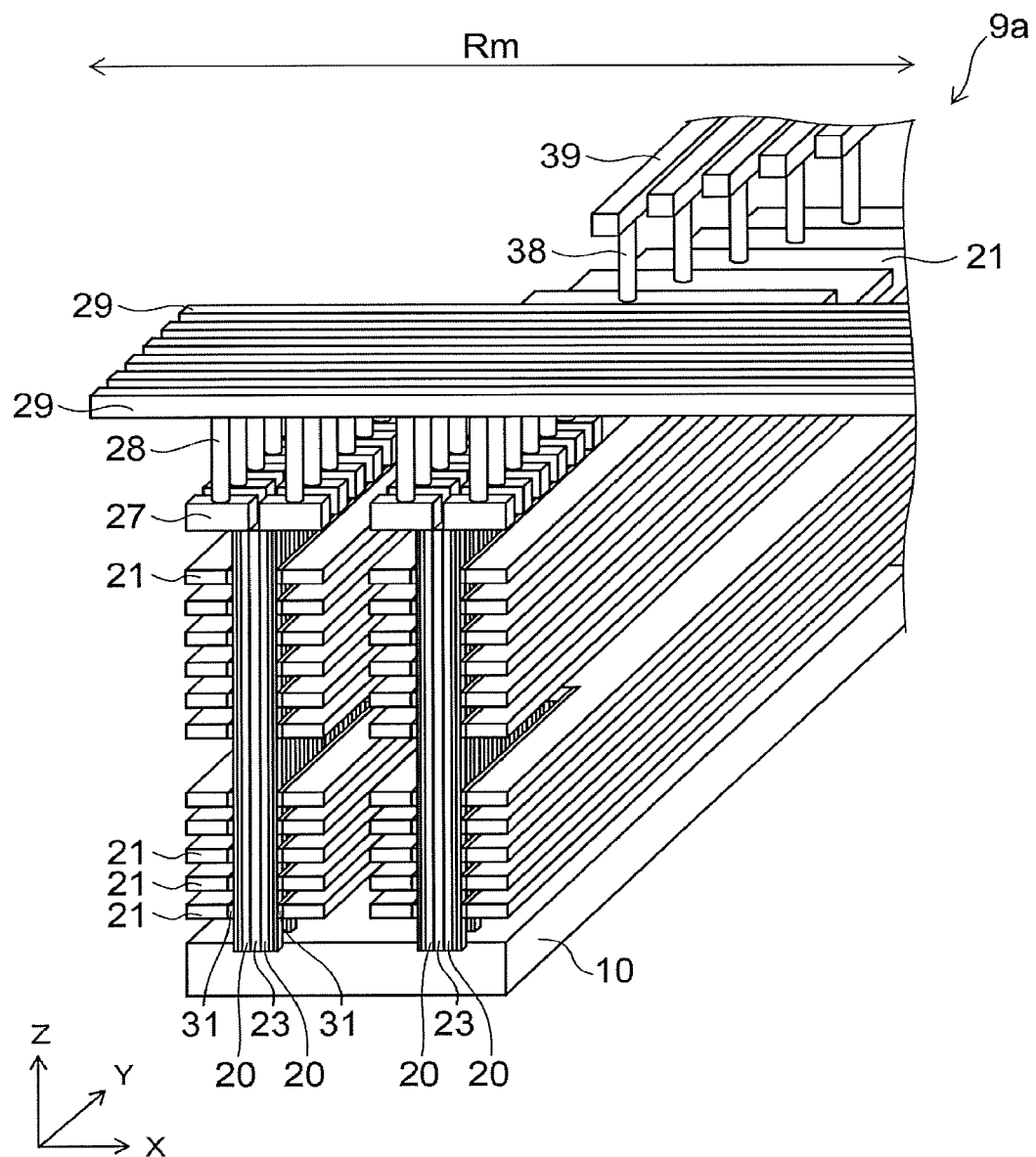
FIG. 68 is a perspective view showing a semiconductor memory device according to a ninth embodiment.

FIG. 68 is a perspective view showing a semiconductor memory device according to the embodiment.

As shown in FIG. 68, in the semiconductor memory device 9a according to the embodiment, the cell source line 15 (see FIG. 1 and FIG. 2) is not provided, and the lower end of the silicon pillar 20 is connected to the silicon substrate 10. An impurity is introduced into an upper portion of the silicon substrate 10 and the upper portion is conductive. Thereby, the upper portion of the silicon substrate 10 functions as the source line. The conductive member 18 (see FIG. 66) is provided in the trench 58 (see FIG. 11A) disposed between the blocks Blk, and the source potential can be applied to the silicon substrate 10.

According to the embodiment, the cell source line can be omitted in comparison with the first embodiment described above.

Otherwise, the configuration, the manufacturing method, the operations, and the effects of the embodiment are similar to those of the first embodiment described above.

A contact layer having an impurity concentration higher than the periphery may be formed in a region directly below the trench 53 (see FIG. 9A) in the silicon substrate 10.

Tenth Embodiment

A tenth embodiment will now be described.

Figure 69:
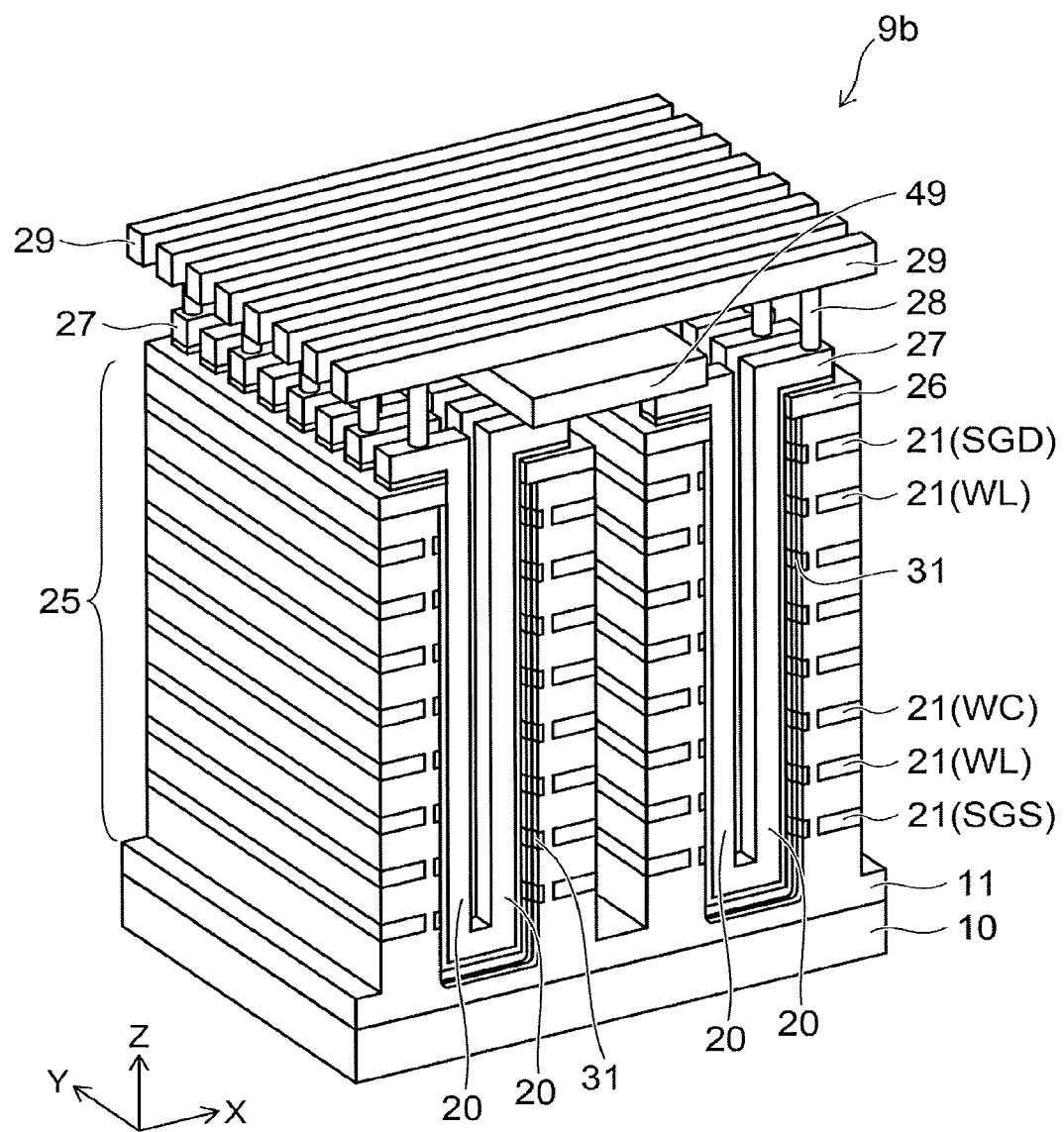
FIG. 69 is a perspective view showing a semiconductor memory device according to a tenth embodiment.

FIG. 69 is a perspective view showing a semiconductor memory device according to the embodiment.

As shown in FIG. 69, in the semiconductor memory device 9b according to the embodiment, the cell source line 15 (see FIG. 1 and FIG. 2) is not provided, and the lower ends of the two adjacent silicon pillars 20 in the X-direction are connected. A source line 49 extending in the Y-direction is provided between the interconnection 27 and the bit line 29. Out of two silicon pillars 20 having the lower ends connected, one is connected to the bit line 29 via the via 28, and another one is connected to the source line 49. Thereby, an U-shaped silicon member made of the two silicon pillars 20 is connected between the bit line 29 an d the source line 49.

According to the embodiment, after forming the stacked body 25 including the silicon pillar 20 and the control gate electrode film 21 or the like, the source line 49 can be formed. For this reason, a material of the source line 49 is slightly restricted by the subsequent process, and a degree of freedom of material selection is high. Thereby, for example, the source line 49 can be formed of a metal material having a relatively low melting point. As a result, for example, the interconnection resistance of the source line 49 is easily reduced.

Otherwise, the configuration, the manufacturing method, the operations, and the effects of the embodiment are similar to those of the first embodiment described above.

According to the embodiments described above, a semiconductor memory device having good data retention characteristics and a method for manufacturing the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
a substrate;
an insulating layer provided on the substrate;
a first conductive layer provided above the insulating layer;
a first semiconductor pillar extending in a first direction and connecting to a surface of the first conductive layer;
a second semiconductor pillar extending in the first direction and connecting to the surface of the first conductive layer, the first semiconductor pillar and the second semiconductor pillar being arranged in a second direction intersecting the first direction;
a first insulating layer provided between first semiconductor pillar and the second semiconductor pillar;
a first electrode film extending in a third direction intersecting the first direction and the second direction;
a second electrode film extending in the third direction, the first electrode film and the second electrode film being arranged in the second direction;
a first memory portion to store electrons provided between the first semiconductor pillar and the first electrode film;
a second memory portion to store electrons provided between the second semiconductor pillar and the second electrode film;
a third semiconductor pillar extending in the first direction and connecting to the surface of the first conductive layer, the third semiconductor pillar and the second semiconductor pillar being arranged in the second direction;
a fourth semiconductor pillar extending in the first direction and connecting to the surface of the first conductive layer, the fourth semiconductor pillar and the third semiconductor pillar being arranged in the second direction;
a second insulating layer provided between the third semiconductor pillar and the fourth semiconductor pillar;
a third electrode film extending in the third direction;
a fourth electrode film extending in the third direction, the third electrode film and the fourth electrode film being arranged in the second direction;
a third memory portion provided between the third semiconductor pillar and the third electrode film;
a fourth memory portion provided between the fourth semiconductor pillar and the fourth electrode film; and
a second conductive layer extending in the first direction and in the third direction, a lower end of the second conductive layer being in contact with a recessed portion formed on the surface of the first conductive layer, the second conductive layer and the fourth semiconductor pillar being arranged in the second direction,
wherein the second electrode film and the third electrode film are provided between the second semiconductor pillar and the third semiconductor pillar.

2. The device according to claim 1, wherein
a material of the first semiconductor pillar and the second semiconductor pillar is different from a material of the second conductive layer.

3. The device according to claim 1, wherein
a length of the second conductive layer in the first direction is longer than lengths of the first semiconductor pillar and the second semiconductor pillar in the first direction.

4. The device according to claim 1, further comprising:
a first interconnection extending in the second direction and being provided above the first semiconductor pillar and second semiconductor pillar.

5. The device according to claim 4, wherein
the second conductive layer is provided below the first interconnection.

6. The device according to claim 1, further comprising:
a second interconnection being provided above the second conductive layer.

7. The device according to claim 6, wherein
the second conductive layer extends straight in the first direction from the second interconnection to the first conductive layer.

8. The device according to claim 1, wherein
the first memory portion includes fifth electrode film provided between the first semiconductor pillar and the first electrode film, a third insulating layer provided between the first semiconductor pillar and the fifth electrode film, a fourth insulating layer provided between the fifth electrode film and the first electrode film, the second memory portion includes a sixth electrode film provided between the second semiconductor pillar and the second electrode film, a fifth insulating layer provided between the second semiconductor pillar and the sixth electrode film; and a sixth insulating layer provided between the sixth electrode film and the second electrode film.

9. The device according to claim 1, wherein the first electrode film and the second electrode film are not disposed between the first semiconductor pillar and the second semiconductor pillar.

10. The device according to claim 1, wherein lower ends of the first semiconductor pillar and the second semiconductor pillar are in contact with a recessed portion formed on the surface of the first conductive layer.

11. A semiconductor memory device comprising:
a semiconductor region;
a first semiconductor pillar extending in a first direction and connecting to a surface of the semiconductor region;
a second semiconductor pillar extending in the first direction and connecting to the surface of the semiconductor region, the first semiconductor pillar and the second semiconductor pillar being arranged in a second direction intersecting the first direction;
a first insulating layer provided between first semiconductor pillar and the second semiconductor pillar;
a first electrode film extending in a third direction intersecting the first direction and the second direction;
a second electrode film extending in the third direction, the first electrode film and the second electrode film being arranged in the second direction;
a first memory portion to store electrons provided between the first semiconductor pillar and the first electrode film;
a second memory portion to store electrons provided between the second semiconductor pillar and the second electrode film;
a third semiconductor pillar extending in the first direction and connecting to the surface of the semiconductor region, the third semiconductor pillar and the second semiconductor pillar being arranged in the second direction;
a fourth semiconductor pillar extending in the first direction and connecting to the surface of the semiconductor region, the fourth semiconductor pillar and the third semiconductor pillar being arranged in the second direction;
a second insulating layer provided between the third semiconductor pillar and the fourth semiconductor pillar;
a third electrode film extending in the third direction;
a fourth electrode film extending in the third direction, the third electrode film and the fourth electrode film being arranged in the second direction;
a third memory portion provided between the third semiconductor pillar and the third electrode film;
a fourth memory portion provided between the fourth semiconductor pillar and the fourth electrode film; and
a conductive layer extending in the first direction and in the third direction, a lower end of the conductive layer being in contact with a recessed portion formed on the surface of the semiconductor region, the conductive layer and the fourth semiconductor pillar being arranged in the second direction,
wherein the second electrode film and the third electrode film are provided between the second semiconductor pillar and the third semiconductor pillar.

12. The device according to claim 11, wherein
a material of the first semiconductor pillar and the second semiconductor pillar is different from a material of the conductive layer.

13. The device according to claim 11, wherein
a length of conductive layer in the first direction is longer than lengths of the first semiconductor pillar and the second semiconductor pillar in the first direction.

14. The device according to claim 11, further comprising:
a first interconnection extending in the second direction and being provided above the first semiconductor pillar and second semiconductor pillar.

15. The device according to claim 14, wherein
the conductive layer is provided below the first interconnection.

16. The device according to claim 11, further comprising:
a second interconnection being provided above the conductive layer.

17. The device according to claim 16, wherein the second interconnection extends in the third direction.

18. The device according to claim 16, wherein
the conductive layer is electrically connected to the second interconnection and the semiconductor region.

19. The device according to claim 11, wherein
the first memory portion includes a fifth electrode film provided between the first semiconductor pillar and the first electrode film, a third insulating layer provided between the first semiconductor pillar and the fifth electrode film, a fourth insulating layer provided between the fifth electrode film and the first electrode film, a sixth electrode film provided between the second semiconductor pillar and the second electrode film, a fifth insulating layer provided between the second semiconductor pillar and the sixth electrode film, and a sixth insulating layer provided between the sixth electrode film and the second electrode film.

20. The device according to claim 11, therein the first electrode film and the second electrode film are not disposed between the first semiconductor pillar and the second semiconductor pillar.

21. The device according to claim 11, wherein lower ends of the first semiconductor pillar and the second semiconductor pillar are in contact with a recessed portion formed on the surface of the semiconductor region.

* * * * *